(12) United States Patent
    Lotya et al.

(10) Patent No.: US 11,392,817 B2
(45) Date of Patent: *Jul. 19, 2022

(54) SMART CARDS WITH METAL LAYER(S) AND METHODS OF MANUFACTURE

(71) Applicant: AMATECH GROUP LIMITED, Spiddal (IE)

(72) Inventors: Mustafa Lotya, Celbridge (IE); David Finn, Tourmakeady (IE); Darren Molloy, Tourmakeady (IE)

(73) Assignee: AMATECH GROUP LIMITED, County Galway (IE)

( * ) Notice: Subject to any disclaimer, the term of this patent is extended or adjusted under 35 U.S.C. 154(b) by 0 days.

This patent is subject to a terminal disclaimer.

(21) Appl. No.: 17/006,797

(22) Filed: Aug. 29, 2020

(65) Prior Publication Data

US 2021/0056375 A1    Feb. 25, 2021

Related U.S. Application Data

(63) Continuation-in-part of application No. 16/826,322, filed on Mar. 23, 2020, now Pat. No. 11,037,044,
(Continued)

(51) Int. Cl.
| | |
|---|---|
| *G06K 19/06* | (2006.01) |
| *G06K 19/077* | (2006.01) |
| *H01Q 1/22* | (2006.01) |
| *H01Q 21/29* | (2006.01) |

(Continued)

(52) U.S. Cl.
CPC . *G06K 19/07794* (2013.01); *G06K 19/07769* (2013.01); *G06K 19/07783* (2013.01);
(Continued)

(58) Field of Classification Search
CPC ....... G06K 19/07769; G06K 19/07783; G06K 19/07794; H01F 27/2804; H01F 38/14;
(Continued)

(56) References Cited

U.S. PATENT DOCUMENTS

| | | | |
|---|---|---|---|
| 6,297,907 B1 * | 10/2001 | Wang | G02B 27/288 349/106 |
| 6,376,769 B1 * | 4/2002 | Chung | G06K 19/07747 174/524 |

(Continued)

OTHER PUBLICATIONS

Extended European search report for EP 20 17 4861, dated Jan. 9, 2020.

*Primary Examiner* — Thien M Le
(74) *Attorney, Agent, or Firm* — McAndrews, Held & Malloy, Ltd.

(57) ABSTRACT

Smartcards with metal layers manufactured according to various techniques disclosed herein. One or more metal layers of a smartcard stackup may be provided with slits overlapping at least a portion of a module antenna in an associated transponder chip module disposed in the smartcard so that the metal layer functions as a coupling frame. One or more metal layers may be pre-laminated with plastic layers to form a metal core or clad subassembly for a smartcard, and outer printed and/or overlay plastic layers may be laminated to the front and/or back of the metal core. Front and back overlays may be provided. Various constructions of and manufacturing techniques (including temperature, time, and pressure regimes for laminating) for smartcards are disclosed herein.

17 Claims, 23 Drawing Sheets

Related U.S. Application Data which is a continuation of application No. 16/199,271, filed on Nov. 26, 2018, now Pat. No. 10,599,972, which is a continuation-in-part of application No. 15/969,816, filed on May 3, 2018, now Pat. No. 10,518,518, which is a continuation-in-part of application No. 15/939,281, filed on Mar. 29, 2018, now Pat. No. 10,733,494, which is a continuation-in-part of application No. 15/358,138, filed on Nov. 22, 2016, now Pat. No. 9,960,476, which is a continuation-in-part of application No. 15/072,356, filed on Mar. 17, 2016, now Pat. No. 9,836,684, said application No. 16/199,271 is a continuation-in-part of application No. 15/939,282, filed on Mar. 29, 2018, now Pat. No. 10,552,722, which is a continuation-in-part of application No. 15/358,138, filed on Nov. 22, 2016, now Pat. No. 9,960,476, which is a continuation-in-part of application No. 15/197,795, filed on Jun. 30, 2016, now Pat. No. 9,812,782, which is a continuation-in-part of application No. 14/551,376, filed on Nov. 24, 2014, now Pat. No. 9,390,364, said application No. 15/358,138 is a continuation-in-part of application No. 15/072,356, filed on Mar. 17, 2016, now Pat. No. 9,836,684, said application No. 16/199,271 is a continuation-in-part of application No. 15/818,785, filed on Nov. 21, 2017, now abandoned, and a continuation-in-part of application No. 15/662,305, filed on Jul. 28, 2017, now Pat. No. 10,193,211, which is a continuation-in-part of application No. 15/072,356, filed on Mar. 17, 2016, now Pat. No. 9,836,684, said application No. 16/199,271 is a continuation-in-part of application No. 15/969,816, filed on May 3, 2018, now Pat. No. 10,518,518, which is a continuation-in-part of application No. 15/939,281, filed on Mar. 29, 2018, now Pat. No. 10,733,494, which is a continuation-in-part of application No. 15/358,138, filed on Nov. 22, 2016, now Pat. No. 9,960,476, which is a continuation-in-part of application No. 15/072,356, filed on Mar. 17, 2016, now Pat. No. 9,836,684, said application No. 15/358,138 is a continuation-in-part of application No. 14/862,119, filed on Sep. 22, 2015, now Pat. No. 9,697,459, said application No. 15/072,356 is a continuation-in-part of application No. 14/619,177, filed on Feb. 11, 2015, now abandoned, said application No. 15/072,356 is a continuation-in-part of application No. 14/551,376, filed on Nov. 24, 2014, now Pat. No. 9,390,364, said application No. 15/072,356 is a continuation-in-part of application No. 14/492,113, filed on Sep. 22, 2014, now Pat. No. 9,798,968, which is a continuation-in-part of application No. 14/465,815, filed on Aug. 21, 2014, now Pat. No. 9,475,086, and a continuation-in-part of application No. 14/173,815, filed on Feb. 6, 2014, now Pat. No. 9,195,932, and a continuation-in-part of application No. 13/744,686, filed on Jan. 18, 2013, now abandoned, said application No. 15/072,356 is a continuation-in-part of application No. 14/465,815, filed on Aug. 21, 2014, now Pat. No. 9,475,086, which is a continuation-in-part of application No. 14/281,876, filed on May 19, 2014, now Pat. No. 9,272,370, and a continuation-in-part of application No. 14/173,815, filed on Feb. 6, 2014, now Pat. No. 9,195,932, which is a continuation of application No. 14/020,884, filed on Sep. 8, 2013, now Pat. No. 9,033,250, said application No. 14/465,815 is a continuation-in-part of application No. 13/744,686, filed on Jan. 18, 2013, now abandoned.

(60) Provisional application No. 62/478,589, filed on Mar. 29, 2017, provisional application No. 62/371,768, filed on Aug. 7, 2016, provisional application No. 62/258,531, filed on Nov. 22, 2015, provisional application No. 62/300,906, filed on Feb. 28, 2016, provisional application No. 62/289,189, filed on Jan. 30, 2016, provisional application No. 62/281,209, filed on Jan. 21, 2016, provisional application No. 62/204,466, filed on Aug. 13, 2015, provisional application No. 62/200,178, filed on Aug. 3, 2015, provisional application No. 62/175,308, filed on Jun. 14, 2015, provisional application No. 62/163,962, filed on May 19, 2015, provisional application No. 62/150,307, filed on Apr. 21, 2015, provisional application No. 62/136,644, filed on Mar. 23, 2015, provisional application No. 62/102,103, filed on Jan. 12, 2015, provisional application No. 62/088,598, filed on Dec. 7, 2014, provisional application No. 62/080,332, filed on Nov. 16, 2014, provisional application No. 62/061,689, filed on Oct. 8, 2014, provisional application No. 62/044,394, filed on Sep. 1, 2014, provisional application No. 62/039,562, filed on Aug. 20, 2014, provisional application No. 61/978,187, filed on Apr. 10, 2014, provisional application No. 61/971,636, filed on Mar. 28, 2014, provisional application No. 61/955,325, filed on Mar. 19, 2014.

(51) Int. Cl.
*H01Q 7/00* (2006.01)
*H05K 1/16* (2006.01)
*H01F 27/28* (2006.01)
*H05K 3/10* (2006.01)
*H01F 38/14* (2006.01)

(52) U.S. Cl.
CPC ......... *H01Q 1/2216* (2013.01); *H01Q 1/2225* (2013.01); *H01Q 1/2283* (2013.01); *H01Q 7/00* (2013.01); *H01Q 21/29* (2013.01); *H05K 1/165* (2013.01); *H01F 27/2804* (2013.01); *H01F 38/14* (2013.01); *H05K 3/103* (2013.01); *H05K 2201/10098* (2013.01); *Y10T 29/49018* (2015.01); *Y10T 29/49162* (2015.01)

(58) Field of Classification Search
CPC .. H01Q 1/2216; H01Q 1/2225; H01Q 1/2283; H01Q 21/29; H01Q 7/00; H05K 1/165; H05K 2201/10098; H05K 3/103; Y10T 29/49018; Y10T 29/49162
See application file for complete search history.

(56) References Cited

U.S. PATENT DOCUMENTS

| | | | |
|---|---|---|---|
| 9,425,046 B1 * | 8/2016 | Gee | H01L 21/02532 |
| 9,437,814 B1 * | 9/2016 | Gee | H01L 45/085 |
| 9,520,561 B1 * | 12/2016 | Kim | H01L 45/148 |
| 9,595,670 B1 * | 3/2017 | Gee | H01L 45/146 |
| 9,697,459 B2 * | 7/2017 | Finn | H01Q 1/2225 |
| 9,960,476 B2 * | 5/2018 | Finn | H04B 5/0062 |
| 10,453,896 B1 * | 10/2019 | Nazarian | H01L 45/1675 |
| 10,518,518 B2 * | 12/2019 | Finn | G06K 19/07722 |
| 2014/0361086 A1 | 12/2014 | Finn et al. | |
| 2017/0017871 A1 | 1/2017 | Finn et al. | |

* cited by examiner

"Plastic-Metal-Plastic" Hybrid Cards two metal layers slug for recess transponder chip module

SMART CARDS WITH METAL LAYER(S) AND METHODS OF MANUFACTURE

CROSS-REFERENCE TO RELATED APPLICATIONS

This application claims priority (filing date benefit) from the following:

This application is a continuation-in-part of Ser. No. 16/826,322 filed 23 Mar. 2020
- Ser. No. 16/826,322 is a continuation of Ser. No. 16/199,271 filed 26 Nov 2018
- Ser. No. 16/199,271 is a continuation-in-part of Ser. No. 15/969,816 filed 3 May 2018
- Ser. No. 1,596,816 is a continuation-in-part of Ser. No. 15/939,281 filed 29 Mar. 2018
- Ser. No. 15/939,281 is a continuation-in-part of Ser. No. 15/358,138 filed 22 Nov. 2016
- Ser. No. 15/358,138 is a continuation-in-part of Ser. No. 15/072,356 filed 17 Mar. 2016
- Ser. No. 16/199,271 is a continuation-in-part of Ser. No. 15/939,282 filed 29 Mar. 2018
- Ser. No. 15/939,282 is a non-provisional of U.S. 62/478,589 filed 29 Mar. 2017
- Ser. No. 15/939,282 is a continuation-in-part of Ser. No. 15/358,138 filed 22 Nov. 2016
- Ser. No. 15/358,138 is a nonprovisional of U.S. 62/371,768 filed 7 Aug. 2016
- Ser. No. 15/358,138 is a continuation-in part of Ser. No. 15/197,795 filed 30 Jun. 2016
- Ser. No. 15/197,795 is a continuation-in part of Ser. No. 14/551,376 filed 24 Nov. 2014
- Ser. No. 15/358,138 is a continuation-in-part of Ser. No. 15/072,356 filed 17 Mar. 2016
- Ser. No. 15/358,138 is a nonprovisional of 62/258,531 filed 22 Nov 2015
- Ser. No. 16/199,271 is a continuation-in part of Ser. No. 15/818,785 filed 21 Nov. 2017
- Ser. No. 16/199,271 is a continuation-in-part of Ser. No. 15/662,305 filed 28 Jul. 2017
- Ser. No. 15/662,305 is a continuation-in-part of Ser. No. 15/072,356 filed 17 Mar. 2016
- Ser. No. 16/199,271 is a continuation-in-part of Ser. No. 15/969,816 filed 03 May 2018
- Ser. No. 15/969,816 is a continuation-in-part of Ser. No. 15/939,281 filed 29 Mar. 2018
- Ser. No. 15/939,281 is continuation-in-part of Ser. No. 15/358,138 filed 22 Nov. 2016
- Ser. No. 15/358,138 is a continuation-in-part of Ser. No. 15/072,356 filed 17 Mar. 2016
- Ser. No. 15/072,356 is a nonprovisional of U.S. 62/300,906 filed 28 Feb. 2016
- Ser. No. 15/072,356 is a nonprovisional of U.S. 62/289,189 filed 30 Jan. 2016
- Ser. No. 15/072,356 is a nonprovisional of U.S. 62/281,209 filed 21 Jan. 2016
- Ser. No. 15/072,356 is a continuation-in-part of Ser. No. 14/862,119 filed 22 Sep. 2015
- Ser. No. 14/862,119 is a nonprovisional of U.S. 62/204,466 filed 13 Aug. 2015
- Ser. No. 14/862,119 is a nonprovisional of U.S. 62/201,578 filed 6 Aug. 2015
- Ser. No. 14/862,119 is a nonprovisional of U.S. 62/175,308 filed 14 Jun. 2015
- Ser. No. 14/862,119 is a nonprovisional of U.S. 62/163,962 filed 19 May 2015
- Ser. No. 14/862,119 is a nonprovisional of U.S. 62/150,307 filed 21 Apr. 2015
- Ser. No. 14/862,119 is a nonprovisional of U.S. 62/136,644 filed 23 Mar. 2015
- Ser. No. 15/072,356 is a continuation-in-part of Ser. No. 14/619,177 filed 11 Feb. 2015
- Ser. No. 14/619,177 is a nonprovisional of U.S. 62/102,103 filed 12 Jan. 2015
- Ser. No. 14/619,177 is a nonprovisional of U.S. 62/088,598 filed 7 Dec. 2014
- Ser. No. 15/072,356 is a continuation-in-part of Ser. No. 14/551,376 filed 24 Nov. 2014
- Ser. No. 14/551,376 is a nonprovisional of U.S. 62/080,332 filed 16 Nov. 2014
- Ser. No. 14/551,376 is a nonprovisional of U.S. 62/061,689 filed 8 Oct. 2014
- Ser. No. 14/551,376 is a nonprovisional of U.S. 62/044,394 filed 1 Sep. 2014
- Ser. No. 15/072,356 is a continuation-in-part of Ser. No. 14/492,113 filed 22 Sep. 2014
- Ser. No. 14/492,113 is a continuation-in-part of Ser. No. 14/465,815 filed 21 Aug. 2014
- Ser. No. 14/492,113 is a continuation-in-part of Ser. No. 14/173,815 filed 6 Feb. 2014
- Ser. No. 14/492,113 is a continuation-in-part of Ser. No. 13/744,686 filed 18 Jan. 2013
- Ser. No. 15/072,356 is a continuation-in-part of Ser. No. 14/465,815 filed 21 Aug. 2014
- Ser. No. 14/465,815 is a nonprovisional of U.S. 62/039,562 filed 20 Aug 2014
- Ser. No. 14/465,815 is a nonprovisional of U.S. 62/035,430 filed 10 Aug. 2014
- Ser. No. 14/465,815 is a nonprovisional of U.S. 61/978,187 filed 10 Apr. 2014
- Ser. No. 14/465,815 is a nonprovisional of U.S. 61/971,636 filed 28 Mar. 2014
- Ser. No. 14/465,815 is a nonprovisional of U.S. 61/955,325 filed 19 Mar. 2014
- Ser. No. 14/465,815 is a continuation-in-part of Ser. No. 14/281,876 filed 19 May 2014
- Ser. No. 14/465,815 is a continuation-in-part of Ser. No. 14/173,815 filed 6 Feb. 2014
- Ser. No. 14/173,815 a continuation of Ser. No. 14/020,884 filed 8 Sep. 2013
- Ser. No. 14/465,815 is a continuation-in-part of Ser. No. 13/744,686 filed 18 Jan. 2013

TECHNICAL FIELD

The disclosure relates broadly to RFID devices including "Smartcards" or "Payment Objects" (or "payment devices") such as plastic bank cards, plastic metal hybrid cards, metal embedded cards, metal veneer cards, full metal cards, RFID enabled SIM cards (or payment cards, electronic tickets, electronic identification cards, chip cards and the like), wearable devices (activity trackers, watches, smart jewelry, wristbands, bangles, cuffs, bracelets, talisman charms, lockets, rings and the like) and accessories (payment sliders, key-fobs, money clips, wallets and the like) having RFID (radio frequency identification) chips or chip modules (CM) capable of operating in a "contactless" mode (ISO 14443 or NFC/ISO 15693), including dual interface (DI) smartcards and payment objects (or payment devices) which can also operate in "contact" mode (ISO 7816-2). Some of the disclosure(s) herein may relate to smartcards having only a contact interface.

The disclosure may relate to coupling frames that are tuned to resonant at a certain ISM frequency.

The disclosure relates to Antenna Modules (AM), Transponder Chip Modules (TCMs), Coupling Frames (CFs), Stacks of Coupling Frames (SCFs), Coupling Frame Antennas (CFAs), including Transponders in general and Transponder Chip Modules with integrated Coupling Frame (CF), suitable for implanting, embedding, insertion or placement in smartcards, metal housings, metal casing, metal plates, jewelry pieces, tokens, tags or for mechanical and electrical connection to a loop(s) of wire or spiral of wire such as a charm bracelet for use in all payment and identification applications.

The techniques disclosed herein may also be applicable to RFID devices including "non-secure smartcards and tags" such as contactless cards in the form of keycards, medic-alert tags, access control cards, security badges, key-fobs, wearables, mobile phones, tokens, small form factor tags, data carriers and the like operating in close proximity with a contactless reader.

This disclosure may also relate to the design and use of laser or chemically etched planar antennas in transponders, tags, transponder chip modules (TCMs) or antenna chip modules (AM). This disclosure may also relate to Inductive Coupling (IC) between a Transponder Chip Module (TCM) or an RFID chip connected to an antenna (e.g. in general a Tag, Transponder, Transponder Chip Module) and a Coupling Frame (CF), a Stack of Coupling Frames (SCFs), or Overlapping Coupling Frames (OCFs) when in the presence of an electromagnetic field generated by a contactless reader or terminal, with the antenna structure of the transponder device overlapping a slit or slits (or discontinuities) provided in the Coupling Frame (CF), a Stack of Coupling Frames (SCFs) or Overlapping Coupling Frames (OCFs). The Coupling Frame(s) may be made of a solid metal structure, a metal foil, or a conductive layer which is not electromagnetic transparent. The slit or a combination of slits which overlap the antenna structure of the transponder device concentrates surface eddy (Foucault) current density, to provide power delivery to the RFID chip.

This disclosure may also relate to the use of an inductive or capacitive device (inductor or capacitor) connected to a coupling frame in order to effect a controlled change in the resonance characteristics of a coupling frame.

The disclosure may also be applicable to coupling frames in card bodies, wearables, jewelry and accessories.

The disclosure may further relate to pre-laminated metal (aka "Metal Prelam"), pre-laminated plastic-metal or plastic-metal-plastic inlays having an array of card body positions.

The disclosure may also relate to contactless metal smartcards comprising metal laminated layers with a print enhancement coating disposed on the outer surfaces for direct digital printing on metal.

BACKGROUND

A smartcard is an example of an RFID device that has a transponder chip module (TCM) or an antenna module (AM) disposed in a card body (CB) or an inlay substrate.

The antenna module (AM) or antenna chip module, which may be referred to as a transponder chip module (TCM) may generally comprise:
- a module tape (MT) or chip carrier tape (CCT), more generally, simply a support "substrate";
- an RFID chip (CM, IC) which may be a bare, unpackaged silicon die or a chip module (a die with leadframe, interposer, carrier or the like), typically disposed on a "face-down side" or "bond side" or "chip side" (or surface) of the module tape (MT);
- the RFID chip may have an antenna integrated therein, but generally a module antenna (MA) is typically required to effect contactless communication between the RFID chip and another RFID device such as an external contactless reader;
- a module antenna (MA) or antenna structure (AS), typically disposed on the same face-down side of the module tape (MT) as the RFID chip (IC), and connected therewith, for implementing a contactless interface, such as ISO 14443 and NFC/ISO 15693 with a contactless reader or other RFID device.

When operating in a contactless mode, a passive antenna module (AM) or transponder chip module (TCM) may be powered by RF from an external RFID reader, and may also communicate by RF with the external RFID reader.

A dual-interface antenna module (AM) or transponder chip module (TCM) may also have a contact pad array (CPA), typically comprising 6 or 8 contact pads (CP, or "ISO pads") disposed on a "face-up side" or "contact side" (or surface) of the module tape (MT), for interfacing with a contact reader in a contact mode (ISO 7816). A connection bridge (CBR) may be disposed on the face-up side of the tape for effecting a connection between two components such as the module antenna and the RFID chip on the other face-down side of the module tape.

A conventional antenna module (AM) or transponder chip module (TCM) may be generally rectangular, having four sides, and measuring approximately 8.2 mm×10.8 mm for a 6-contact module and 11.8 mm×13.0 mm for an 8-contact module. As disclosed herein, a generally rectangular transponder chip module (TCM) may have a larger or smaller form factor than a conventional transponder chip module (TCM). Alternatively, the transponder chip module (TCM) may be round, elliptical, or other non-rectangular shape.

A module antenna (MA) may be disposed on the module tape (MT) for implementing a contactless interface, such as ISO 14443 and NFC/ISO 15693. Contact pads (CP) may be disposed on the module tape (MT) for implementing a contact interface, such as ISO 7816.

A planar antenna (PA) structure, or simply "planar antenna (PA)", whether chemically-etched (CES) or laser-etched (LES), is a type of antenna structure (AS) and may comprise a long conductive trace or track having two ends, in the form of a planar, rectangular spiral, disposed in an outer area of a module tape (MT), surrounding the RFID chip on the face-down side of the module tape. This will result in a number of traces or tracks (actually, one long spiraling trace or track), separated by spaces (actually, one long spiraling space). The track (or trace) width may be approximately 100 μm. The planar antenna may be fabricated on other than the module tape, such as on a separate substrate, and joined to the module tape.

U.S. Pat. No. 8,672,232 discloses a card which includes a first assembly comprised of multiple plastic layers attached via an adhesive to a metal layer. The multiple plastic layers forming the first assembly are laminated under a first selected temperature and pressure conditions to preshrink the multiple plastic layers, stress relieve the first assembly and render the first assembly dimensionally stable. The laminated first assembly is then attached to a metal layer via an adhesive layer to form a second assembly which is then laminated at a temperature below the first selected temperature to form a card which is not subjected to warpage and delamination. Claim 1 therein describes:

A method of making a card comprising the steps of:
forming a first assembly of a first predetermined thickness, said first assembly including at least two layers of plastic material;
firstly laminating the at least two layers of different plastic material at a first predetermined temperature and pressure for forming said first assembly;
wherein said first lamination step comprises preshrinking the at least two layers of plastic material and reducing subsequent dimensional changes of the layers forming the first assembly;
secondly forming a second assembly including said first assembly and a metal layer with an adhesive layer between the first assembly and the metal layer; and laminating the second assembly at a temperature which is lower than the first predetermined temperature.

Claim 11 therein describes:

A card comprising:
a first assembly comprised of multiple plastic layers which wherein the multiple plastic layers have been laminated at a first temperature and pressure to preshrink the layers and reduce their subsequent dimensional changes;
said first assembly having an inner surface and an outer surface; the outer surface defining one of the top and bottom side of the card;
a layer of metal material and an adhesive layer; the layer of metal material having an inner surface and an outer surface;
the inner surface of the layer of metal material being attached to the inner surface of the first assembly via said adhesive layer, the combination of said first assembly, adhesive layer and the metal layer forming a second assembly which is laminated at a temperature which is less than the first temperature, and wherein the outer surface of the layer of metal material defines the other one of the top and bottom side of the card.

Smartcard Construction

A typical smartcard includes multiple layers of white plastic made from polyvinyl chloride (PVC) with a clear PVC layer on top. Standard PVC films (homo-polymer) have a VICAT softening point at 76° C. The top transparent layer is referred to as an overlay and can be made of a different material film to PVC, such as a polycarbonate-based material (laser engravable). The overlay film usually has a backside coating of polyamide hotmelt, but the overlay can also be uncoated. The overlay protects the surface artwork and increases the card's shelf life. An overlay is required for cards with security features and/or magnetic stripes, and must be used with full-face foil cards. The card construction may comprise synthetic plastic materials such as ABS, PC, PVC, PETG, polyester, etc.

Observations Concerning U.S. Pat. No. 8,672,232

In the teachings of U.S. Pat. No. 8,672,232, there is no mention made that the first plastic assembly could be a single layer. Wherein the single plastic layer is laminated at a temperature and pressure to preshrink the layer and reduce its subsequent dimensional change. This preshrinking procedure of the single plastic layer could be performed prior to printing of the artwork.

In the teachings of U.S. Pat. No. 8,672,232, there is no mention made of having multiple metal layers, for example two metal layers, in which the first plastic assembly is laminated to a first metal layer, and separately, a second plastic assembly is laminated to a second metal layer. In a final step, the first plastic metal layer is adhesively attached to the second plastic metal layer.

In the teachings of U.S. Pat. No. 8,672,232, there is no mention made that a single plastic layer or two plastic layers with opposing grain direction could be laminated to a metal layer to facilitate the preshrinking process, before laminating or adhesively attaching the artwork layer and overlay layer to the metal plastic assembly.

In the teachings of U.S. Pat. No. 8,672,232, there is no mention made that the degree of shrinkage of the polymer layer(s) is directly related to the size of the sheets being laminated. In other words, the smaller the sheet size the lesser the effect of shrinkage. Equally, the size and thickness of the metal layer being laminated to the plastic layer has an influence on the transfer of heat and the ultimate shrinkage of the plastic layer, conversely, the smaller the metal layer the greater the control over the shrinkage of the plastic layer.

In the teachings of U.S. Pat. No. 8,672,232, there is no mention made that the first assembly layer shrinks greater in the grain direction than the other direction.

In the teachings of U.S. Pat. No. 8,672,232, there is no mention made that the plastic assembly layer(s) could be dimensionally different to the size of the metal sheet.

In the teachings of U.S. Pat. No. 8,672,232, there is no mention made that the metal sheet with the upper and lower plastic assemblies used to form cards could be punched out from the laminated stack-up. Instead, "the first assembly is then attached via an appropriate adhesive to a sheet of metal material to form a second assembly. The second assembly is then laminated at a second temperature which is lower than the first temperature to form a laminated "metal-plastic" sheet which can then be cut to form individual cards. The individual cards may be subsequently personalized.

In the teachings of U.S. Pat. No. 8,672,232, there is no mention made that the final lamination process to assembly the card body could be performed on a single card stack-up construction, instead of a "metal-plastic" sheet.

In the teachings of U.S. Pat. No. 8,672,232, there is no mention made that the final lamination process to assembly the card body could be performed on a single card stack-up construction, using a slightly oversized card format, instead of a "metal-plastic" sheet. In a subsequent process the edges of the laminated oversized card stack-up could be milled, trimmed or otherwise adjusted to bring the dimensions of the laminated oversized card stack-up to the desired value.

In short, U.S. Pat. No. 8,672,232 describes two plastic layers laminated at a first temperature, then laminated with an adhesive layer to a metal layer at a second temperature (lower than the first).

Some options (alternatives, different constructions) proposed in the embodiments of this invention may include the following:
1. One plastic layer, other layers could be made of a metal foil (holofoil), paper, fleece, etc.
2. Only one laminating step
3. There are two laminating steps, but the second step (overlays) may have the same or a higher temperature than the first laminating step
4. Laminate at least one plastic layer to at least one metal layer to create a clad ("prelam", or "core", or subassembly "SAS") then laminate outer layers to at least one of the front and back of the clad. The outer layers may comprise a printed layer and an overlay. Outer layers disposed on the front of the clad may be referred to as "front (face) subassembly", outer layers disposed on the rear of the clad may be referred to as "back (face)subassembly". The outer layers (front and/or rear face subassemblies) are typically card-size (having outer dimensions the same as the overall card). Some inner metal layers of the card may have outer dimensions smaller than those of the overall card.

In a one laminating step, the front clear overlay layer, the front printed plastic layer, an adhesive layer, the core metal layer, an adhesive layer, the rear printed plastic layer and the rear clear overlay layer (with magnetic stripe) are laminated together in one step at a defined temperature and pressure. The core metal may consist of two metal layers adhesively attached together prior to the one step lamination process with the plastic layers.

Other considerations are larger graphics to compensate for shrinkage, revised lamination processes to control cold and hot lamination cycles with modified duration times and pressure, and the type of lamination plates.

Some alternate constructions may be described hereinbelow, with reference to alternate embodiments, examples or constructions (methods for manufacturing) of smartcards, according to the invention.

General Comment

In their various embodiments disclosed herein, a smartcard may comprise various layers of synthetic plastic material and metal foil. Typically, these layers have the same overall size (54 mm×86 mm) as the card, with some variations as disclosed herein (some layers may be smaller than the overall card, some layers may initially be larger than the overall card, etc.). Each layer may have a front surface and a back surface. In the drawings, the front surface is typically illustrated as the top (as viewed) surface, and the back surface is typically illustrated as the bottom (as viewed surface). The individual layers may each have a thickness. Some layers may have an opening for accepting a transponder chip module (TCM).

SUMMARY

It is a general object of the invention to provide improved techniques for manufacturing smartcards. These techniques may be applicable to various sorts of smartcards, including plastic-metal or plastic-metal-plastic smartcards.

Generally, the invention builds upon "slit technology" wherein a metal layer (ML) in a smartcard has a slit (S) or non-conductive stripe (NCS) extending to or overlapping at least a portion of a module antenna (MA, PA) of a transponder chip module (TCM). The slit (S) enables the metal layer (ML) to function as a coupling frame (CF), enhancing (rather than attenuating) contactless communication between the card and an external reader. This is described, for example, in U.S. Pat. Nos. 9,475,086, 9,798,968, U.S. Ser. No. 15/939,282, U.S. Pat. Nos. 9,489,613, and 9,390,364.

Some metal layers may have a slit (S) or non-conductive stripe (NCS) extending from its periphery (outer edge) to an inner position thereof, with the slit (or NCS) arranged to overlap at least a portion of a module antenna of the transponder chip module, so as to function as a coupling frame (CF). Typically, the slit (S) will extend to an opening (MO) for the transponder chip module (TCM).

In some instances, an edge profile of a metal layer may be such that an outer edge of the metal layer overlaps a module antenna, and the metal layer may function as a coupling frame, without requiring a slit (or module opening).

According to the invention, generally, smartcards with metal layers may be manufactured according to various techniques disclosed herein. One or more metal layers (ML) of a smartcard stackup may be provided with slits (S) overlapping at least a portion of a module antenna (MA) in an associated transponder chip module (TCM) disposed in the smartcard so that the metal layer functions as a coupling frame (CF). One or more metal layers (ML, CF1, CF2, 605, 609) may be pre-laminated with plastic layers (AL, 608) to form a metal core or clad subassembly (SAS, 615) for a smartcard, and outer printed and/or overlay plastic layers may be laminated to the front and/or back of the metal core. Front and back overlays (OL, 602, 614) may be provided. Various constructions of and manufacturing techniques (including temperature, time, and pressure regimes for laminating) for smartcards are disclosed herein.

According to some embodiments (examples) of the invention, a method of manufacturing a smartcard having a card body may be characterized by: providing a portion of the card body as a subassembly having two metal layers and a dielectric layer disposed between and joined by laminating to the two metal layers. The method may further comprise providing front and back overlays for the subassembly; and laminating the overlays to the subassembly to form a card body for the smartcard.

In the method,
in a first laminating step, the subassembly of two metal layers and a dielectric layer may be laminated at a first temperature; and
in a second laminating step, the front and back overlays may be laminated to the subassembly at the same or at a higher temperature than the first laminating step.

Alternatively, in the method, the subassembly and front and back overlays may all be laminated in a single process step.

Front and back printed core layers (PCL) may be provided between the front and back overlays, respectively, and the subassembly; and laminating the front and back printed core layers may be laminated together with the front and back overlays.

At least one of the metal layers may have a slit (S) or non-conductive stripe (NCS) extending from an outer edge of the metal layer to an inner position thereof, and the slit (S) may be disposed to overlap at least a portion of a module antenna (MA) of a transponder chip module (TCM) disposed in the smartcard.

According to some embodiments (examples) of the invention, a smartcard may comprise: a subassembly (SAS) comprising at least one metal layer (ML) having a slit (S) or non-conductive stripe (NCS) extending from an outer edge of the metal layer to an inner position thereof, and the slit (S) may be disposed to overlap at least a portion of a module antenna (MA) of a transponder chip module (TCM) disposed in the smartcard; and may be characterized by: at least one plastic layer (OL) including an adhesive layer (AL) laminated to at least one side of the metal layer to form a card body for a smart card capable of contactless communication.

The subassembly (SAS) may comprise: two metal layers (ML, CF1, CF2); and a dielectric layer (AL) disposed (sandwiched) between and joined to the two metal layers. Inner plastic layers (IPL) may be disposed on outer surfaces of the metal layers.

There may be only one metal layer, and it may be disposed at the front surface of the card.

In some of the embodiments disclosed herein, a capacitor (CAP) may be connected across the slit (S).

According to some embodiments (examples) of the invention, a smartcard may comprise: a metal layer (ML2) formed as a single turn closed loop antenna having an edge feature so that a module antenna of a transponder chip module (TCM) disposed in the smartcard overlaps one or more inner or outer edge positions on the continuous closed circuit loop antenna.

According to an embodiment (example) of the invention, a method of manufacturing metal hybrid smartcards from pre-laminated metal core inlays may comprise: providing a front subassembly by joining (or collating) a front clear overlay layer and a front printed layer having a conventional sheet format of 2×8 card body sites; providing a rear subassembly by joining (or collating) a rear clear overlay layer and a rear printed layer with the same sheet format; providing a metal layer having openings at each site in an identical format (2×8) for accepting a portion of a chip module; providing synthetic plastic layers with adhesive backing or adhesive layers and synthetic plastic layers on both sides of the metal layer, and in a first process step laminating the synthetic plastic layers and adhesive layers (front and back) to the metal core to form a pre-laminated metal inlay, with the synthetic plastic layers on both sides of the metal core shrinking under the influence of pressure and temperature; And in a second process step laminating the front and rear subassemblies against the pre-laminated metal inlay to form the complete card stack-up construction, with minimum shrinkage of the front and rear printed layers. A slit (S) or a non-conductive stripe (NCS) may be provided extending from the opening in the metal layer at each inlay site to a position beyond the periphery edge of each card body in the 2×8 array, so that the metal layer in the final card body functions as a coupling frame for a contactless interface. A plastic slug may be disposed in the recess opening at each site in the metal inlay prior to pre-lamination. In a third process step, a card body from each site is mechanically removed (milling, wire eroding, punching, etc.) from the final laminated sheet with metal core. A recess area may be milled through the front subassembly and into the plastic slug for accepting the chip module. A magnetic strip may be included in the rear plastic subassembly. The smart card may be a "Plastic-Metal-Plastic" Hybrid Card.

According to an embodiment (example) of the invention, a method of manufacturing metal hybrid smartcards also known as metal embedded smartcards from a metal core inlay having a single or multiple metal layers may comprise: providing a front subassembly by joining (or collating) a front clear overlay layer and a front printed layer having a conventional sheet format of 2×8 card body sites; providing a rear subassembly by joining (or collating) a rear clear overlay layer and a rear printed layer with the same sheet format; providing a metal core inlay having as option openings at each site in an identical format (2×8) for accepting a portion of a dual interface chip module; providing an adhesive layer on both sides of the metal core inlay, and in a one laminating step: the synthetic plastic layers and adhesive layers (front and back) to the metal core inlay are laminated together to form the complete card stack-up construction, with minimum shrinkage of the front and rear printed layers. A slit (S) or a non-conductive stripe (NCS) may be provided extending from the intended position of the dual interface chip module at each inlay site, or from an opening in the metal layer at each inlay site, to a position beyond the periphery edge of each card body in the 2×8 array, so that the metal core in the final card body functions as a coupling frame for a contactless interface. In a final process step, a card body from each site is mechanically removed (milling, wire eroding, punching, etc.) from the plastic laminated layers with metal core. A recess area may be milled through the front subassembly for accepting the dual interface chip module. A magnetic strip may be included in the rear plastic subassembly. The metal core inlay may comprise of two metal layers with slits separated by an adhesive coated dielectric layer. The adhesive coated layer may be sprayed or silk screen printed to minimize its thickness. The smartcard may be a "Plastic-Metal-Plastic" Hybrid Card or Metal Embedded Card.

According to an embodiment (example) of the invention, method of making plastic-metal-plastic smartcards having a metal core or metal face laminated to one or more layers of plastic may comprise: performing a cycle of heating one or more of the plastic layers to a value T1a above their Tg or Vicat temperatures, and then cooling the plastic layers; and repeating the cycle at alternate temperatures T1b, T1c, etc. The cycle of heating and cooling may be performed under pressure with the plastic layers in sheet form, roll-to-roll, or on coils of plastic material bearing optional spacer layers to prevent sticking of layers to each other. Following thermal cycling, the plastic layers may be trimmed to a required shape or size. Following thermal cycling, the plastic layers may be printed. The plastic layers may comprise Polyvinyl Chloride (PVC), Polycarbonate (PC), Polyethylene terephthalate (PET) or Polyethylene Terephthalate Glycol-modified (PET-G). Different layers may comprise different plastic materials.

According to an embodiment (example) of the invention, a method of manufacturing metal veneer smartcards from pre-laminated metal inlays may comprise: providing a metal sheet with a thickness of 550 µm in an inlay format, 2×8, 4×8, 2×7, 4×7, etc., having an array of card body positions with each site prepared with: a window (13.1 mm×11.9 mm, depth ~250 µm and a lip of 1.3 mm) to accept the implant of a chip module and an opening (9.5 mm×8.5 mm) in the metal to accommodate the mold mass of the chip module, a laser defined slit (with a width of ~100 µm or less at the front face) extending from each opening to an area beyond the periphery edge of each card site, a recess area (mechanically milled, eroded or chemically etched) with a depth of ~200 µm at each site on the underside of the metal sheet around the area of the opening and slit leaving a stepped frame around the perimeter edge of the opening to enhance the mechanical strength, and stuffing the recess area with an adhesive backed plastic insert or non-conductive insert to re-stabilize the area around the slit; providing a rear adhesive layer (~75 µm) and a synthetic plastic layer (~50 µm) to the underside of the mechanically prepared metal sheet and in a first production step laminating the sandwich to create a pre-laminated metal inlay for metal veneer smartcards. A Mylar plastic sheet may be attached to the front face of the metal sheet to protect against scratches during handling and processing. A plastic slug may be disposed in the opening to accept a chip module at each site in the metal inlay sheet prior to pre-lamination. In a second production step, a rear clear overlay layer (~50 µm) and a rear printed layer (~125 µm) are laminated to the pre-laminated metal inlay. Card bodies are extracted from the final laminated sheet and personalized.

According to another embodiment of the invention, a method of manufacturing metal veneer smartcards from pre-laminated metal inlays with integrated metal slugs may comprise: providing a front face metal sheet with a thickness of ~200 µm in a suitable inlay format having an array of card body positions with each site prepared with: a window to accept the implant of a chip module, a laser defined slit extending from each window to an area beyond the periphery edge of each card site; providing a first adhesive layer (75 µm) to support the attachment of a metal slug (250 µm) having a defined weight at each site in the inlay format to act as a coupling frame with a slit and module opening; providing a plastic layer (optionally colored) with openings to accept each metal slug to act as a supporting frame: providing a second adhesive layer (75 µm) and a synthetic plastic layer (50 µm) to complete the inlay stack-up construction, in preparation for pre-lamination. In a final lamination step, an overlay layer and the printed graphics layer are laminated to the pre-laminated metal inlay with integrated metal slugs. The metal slug acting as a coupling frame may have a capacitor connected across its slit to regulate the frequency response and bandwidth of the system.

In another embodiment of the invention, the slit in the front metal layer may be eliminated and a coupling frame antenna (a replacement for a booster antenna), optionally with shielding material, is introduced into the inlay stack-up construction to support the contactless interface. Optionally a capacitor can be connected across the slit (which may also be referred to as a void or separation gap) of the coupling frame antenna to optimize RF performance. Optionally, the front metal layer may be electrically connected or form an integral part of the coupling frame antenna to create a folded coupling frame or 3 dimensional coupling frame. The pre-laminated metal inlay may comprise a metal layer with windows to accept a chip module, a recess area or areas in the metal layer to accept the strategic location of ferrite shielding material attached thereto with a suitable adhesive. The inlay is completed by addition of adhesive layers and plastic substrate layers to create the inlay stack-up for pre-lamination.

The coupling frame antenna in the above configurations may be referred to as a "single loop horseshoe antenna" with a slit/void and opening to accommodate the transponder chip module. The slit/void may be eliminated by changing the form of the single turn closed loop antenna having the module antenna of the transponder chip module overlapping one or more positions on the continuous closed circuit loop. In essence, the shape of the antenna may not be rectangular.

Capacitive struts running parallel to the single track or interdigitated array may be integrated therewith.

Alternatively, the coupling frame antenna (CFA) may be substituted (replaced) by a metal slug coupling frame with a recess area or areas to accept the strategic positioning of ferrite material or Sendust powder. In this configuration, the contactless interface operates from the non-metal side of the metal veneer smartcard.

In their various embodiments, the invention(s) described herein may relate to industrial and commercial industries, such RFID applications, payment smartcards, secure identity cards, access control cards, payment objects, wearable devices, smart jewelry and the like.

Other objects, features and advantages of the invention(s) disclosed herein, and their various embodiments, may become apparent in light of the descriptions of some exemplary embodiments that follows.

BRIEF DESCRIPTION OF THE DRAWINGS

Reference will be made in detail to embodiments of the disclosure, non-limiting examples of which may be illustrated in the accompanying drawing figures (FIGs). Some figures may be in the form of diagrams. Some elements in the figures may be exaggerated, others may be omitted, for illustrative clarity.

Any text (legends, notes, reference numerals and the like) appearing on the drawings are incorporated by reference herein.

Some elements may be referred to with letters ("AM", "CES", "CF", "CM", "IPL", "LES", "MA", "MT", "ML", "MO", "NCS", "OL", "PCL", "S", "SAS", "TCM", etc.) rather than or in addition to numerals. Some similar (including substantially identical) elements in various embodiments may be similarly numbered, with a given numeral such as "2020", followed by different letters such as "A", "B", "C", etc. (resulting in "2020A", "2020B", "2020C"), and variations thereof, and may be collectively (all of them at once) or individually (one at a time) referred to simply by the numeral ("2020").

The figures presented herein may show different embodiments of RFID devices, such as metal hybrid or metal veneer smartcards or payment objects such as wearable devices. Some of the drawings may omit components such as the transponder chip module or module antenna, for illustrative clarity. Some of the figures may show only components of an RFID device, such as coupling frames or plastic-metal-plastic inlays.

Figure 1A:
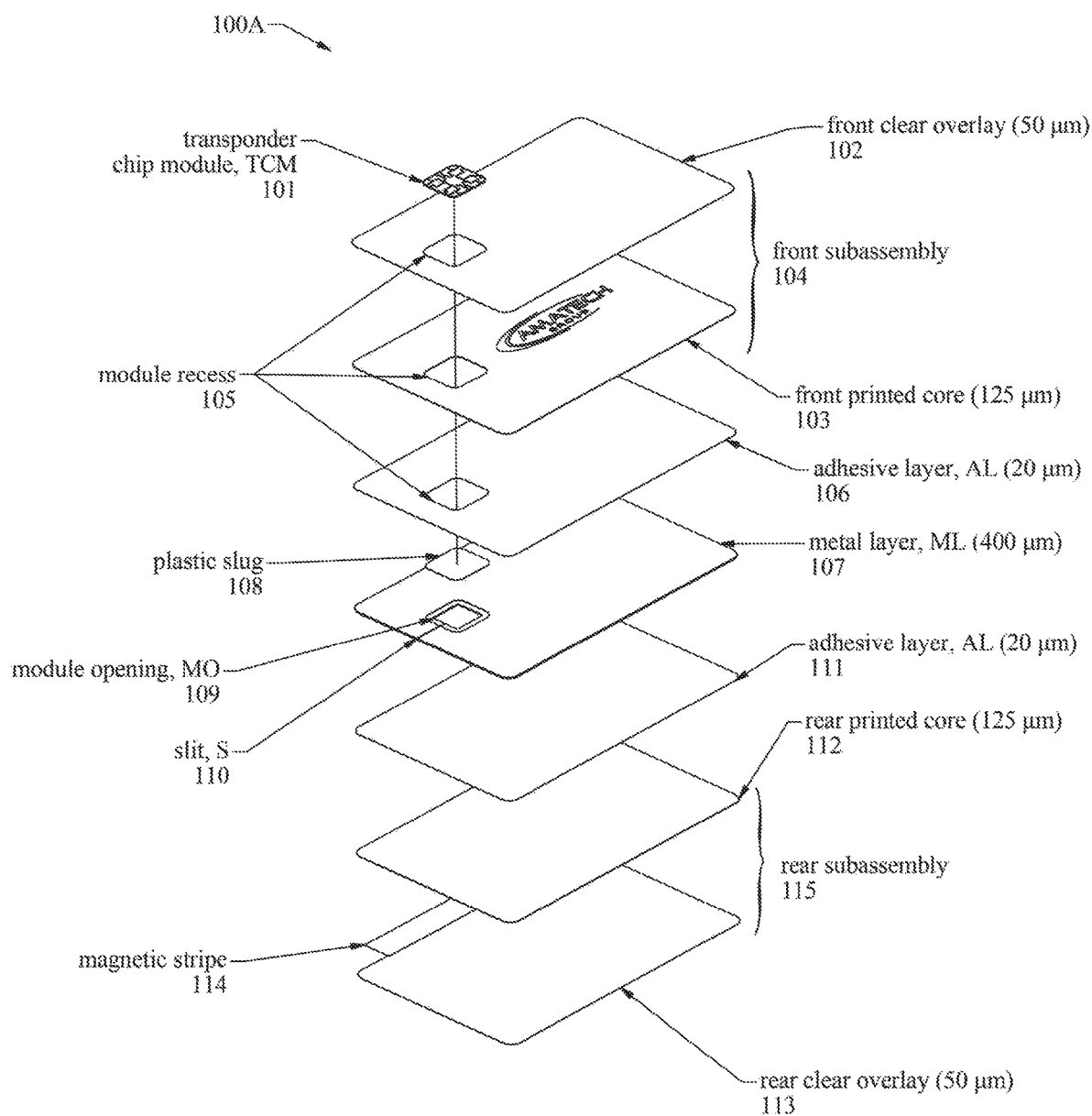

FIG. 1A is a diagram (exploded perspective view) of a DIF "Plastic-Metal-Plastic" Hybrid Card, before lamination. A chip module is shown for insertion into the card.

Figure 1B:
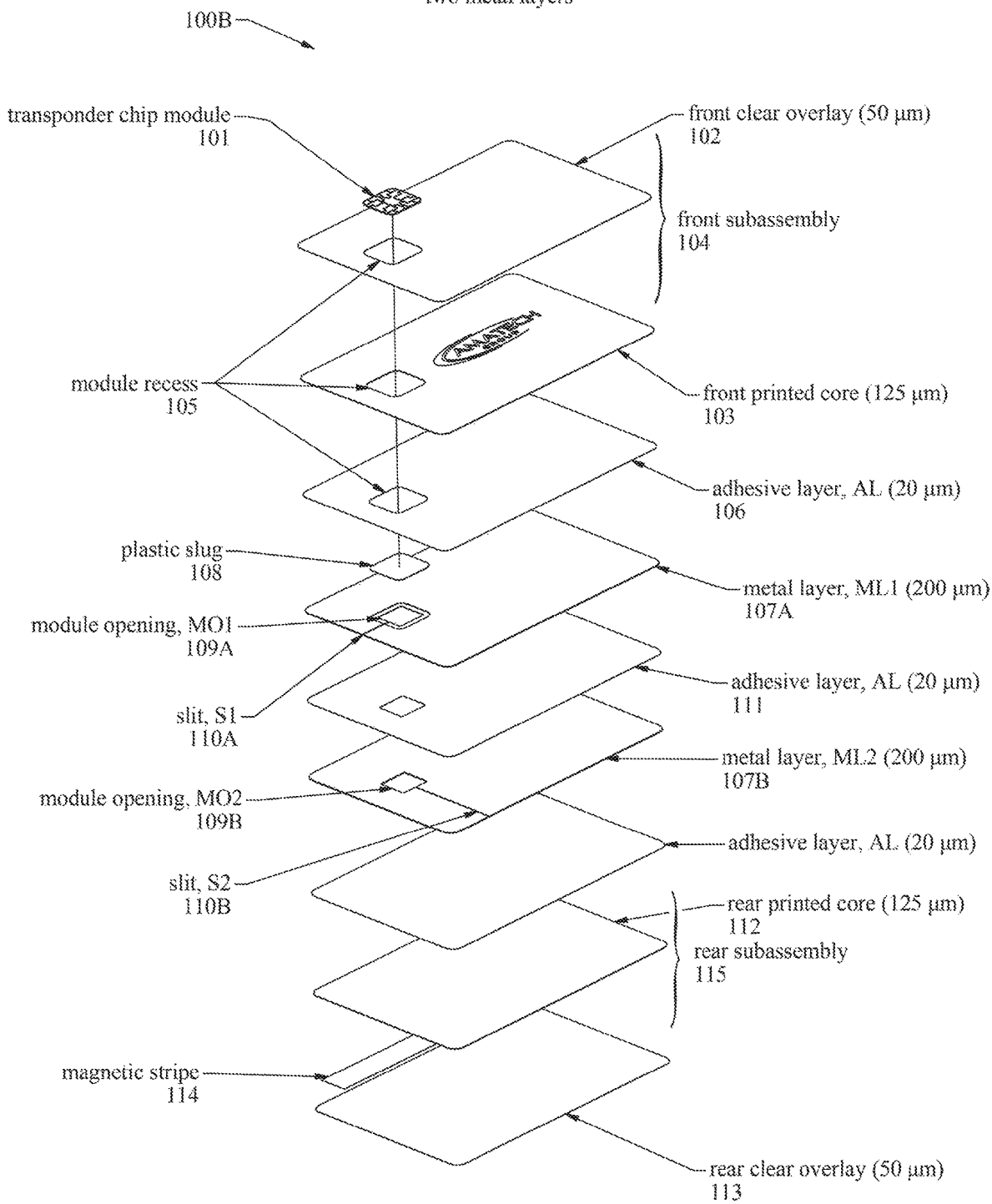

FIG. 1B is a diagram (exploded perspective view) of an alternate construction for a DIF "Plastic-Metal-Plastic" Hybrid Card, before lamination. The metal core may have two metal layers, each with a slit emanating in opposing directions from the intended position of the chip module.

Figure 1C:
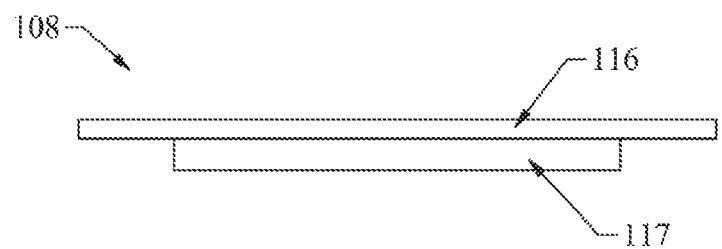

FIG. 1C is a diagram (perspective view) of a slug for fitting in the stepped recess of the "Plastic-Metal-Plastic" Hybrid Cards.

Figure 1D:
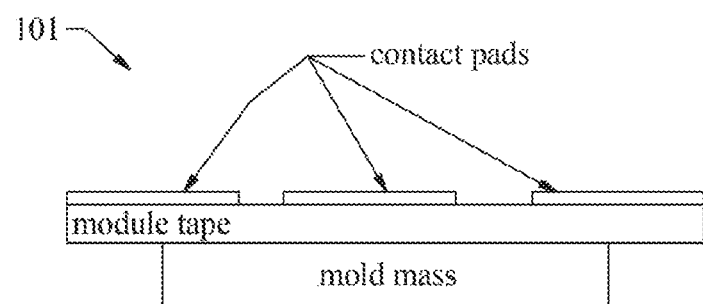

FIG. 1D is a more detailed view of a chip module.

Figure 2A:
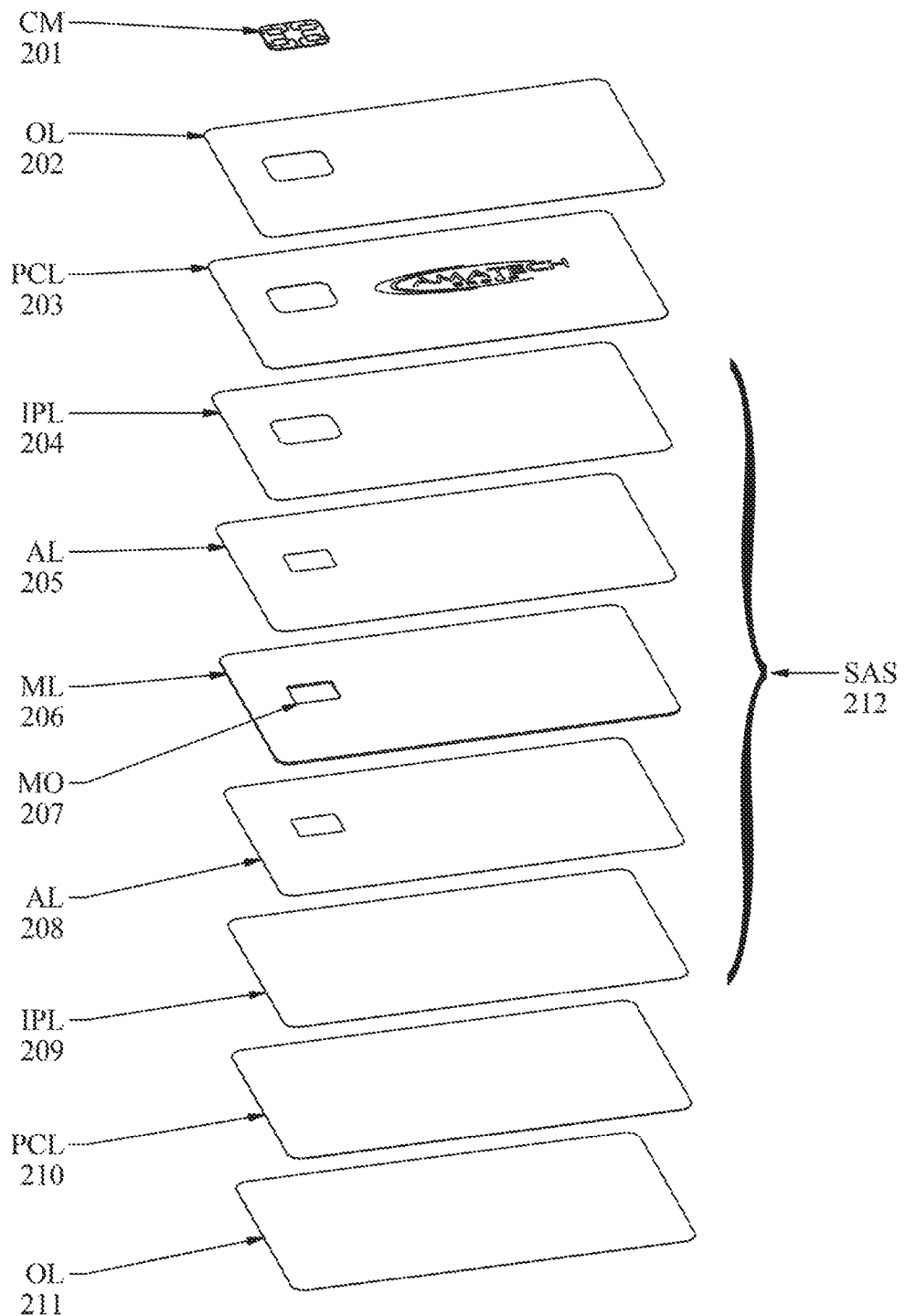

FIG. 2A is a diagrammatic view of the layers of a plastic-metal-plastic hybrid smartcard featuring one metal layer as part of a lamination subassembly (SAS).

Figure 2B:
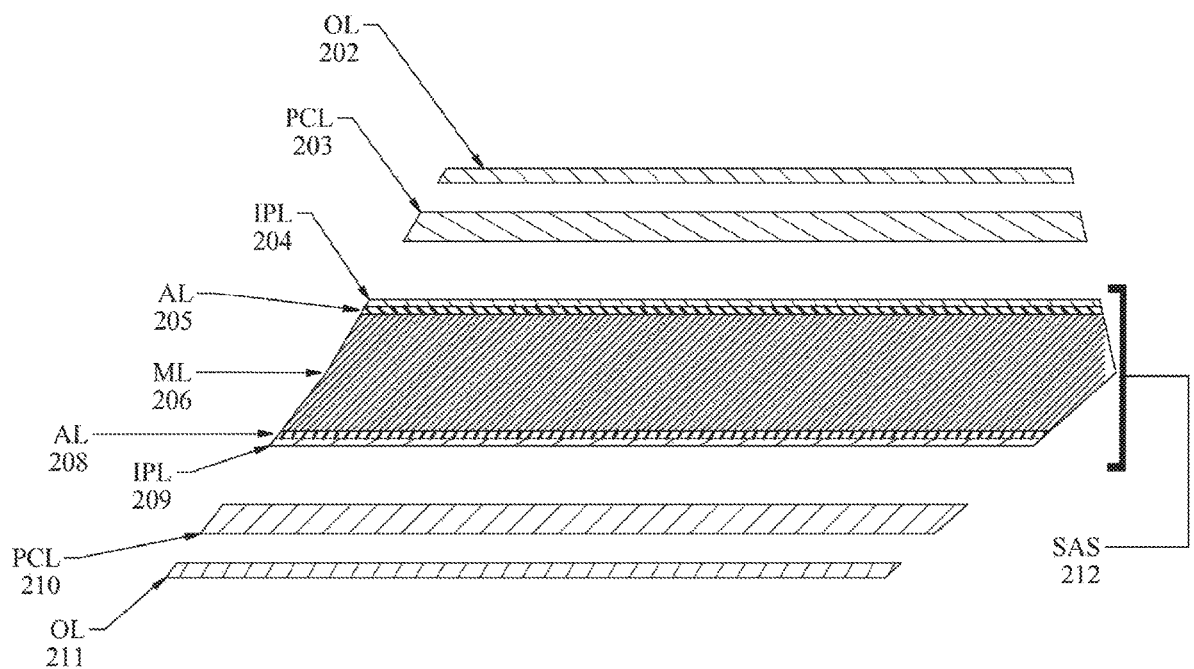

FIG. 2B is a partially exploded edge-on diagrammatic view of the layers of a plastic-metal-plastic hybrid smartcard featuring one metal layer as part of a lamination subassembly (SAS).

Figure 3A:
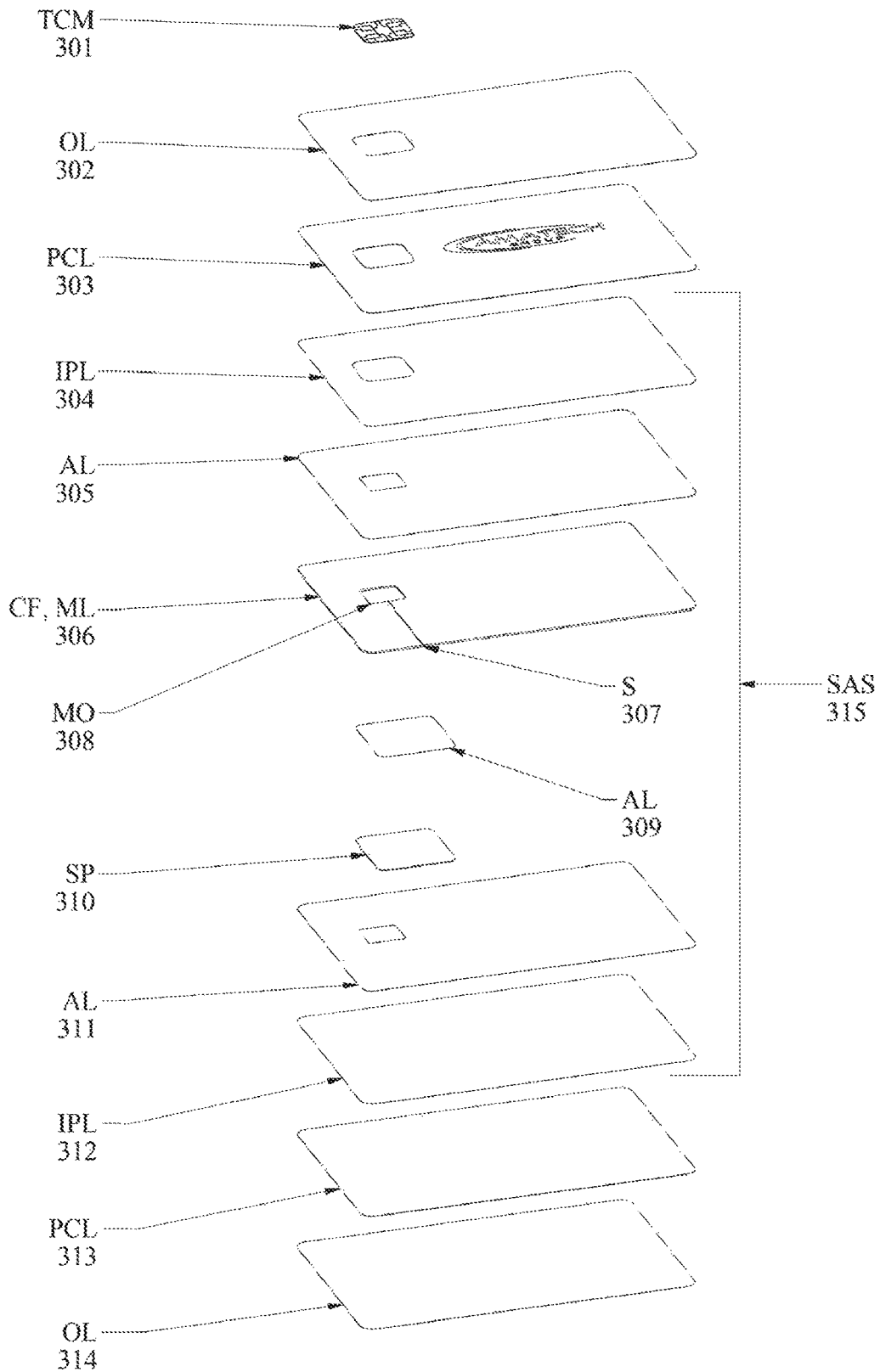

FIG. 3A is a diagrammatic view of the layers of a plastic-metal-plastic hybrid smartcard featuring a coupling frame (CF) with slit (S) and support panel (S) and as part of a lamination subassembly (SAS).

Figure 3B:
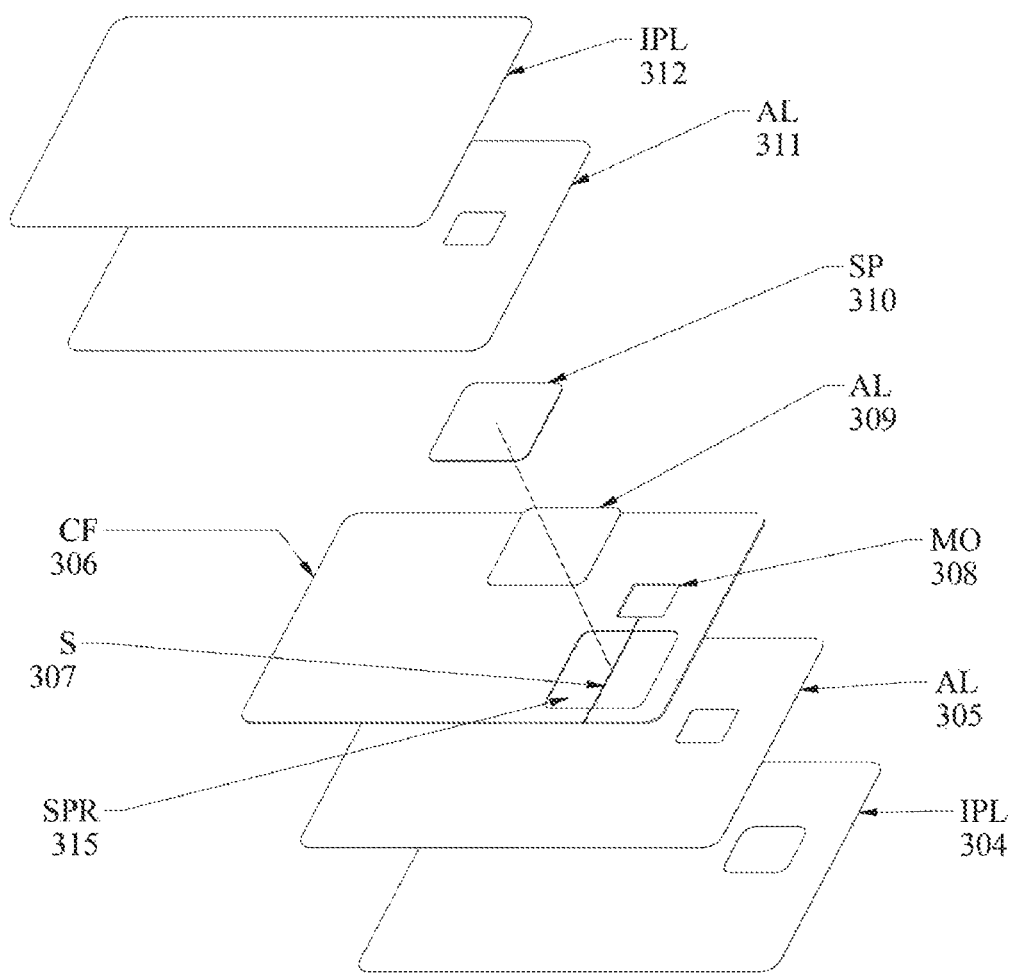

FIG. 3B is a partially exploded rear diagrammatic view of the layers of a plastic-metal-plastic hybrid smartcard featuring a coupling frame (CF) with slit (S) and support panel (S) and as part of a lamination subassembly (SAS).

Figure 4A:
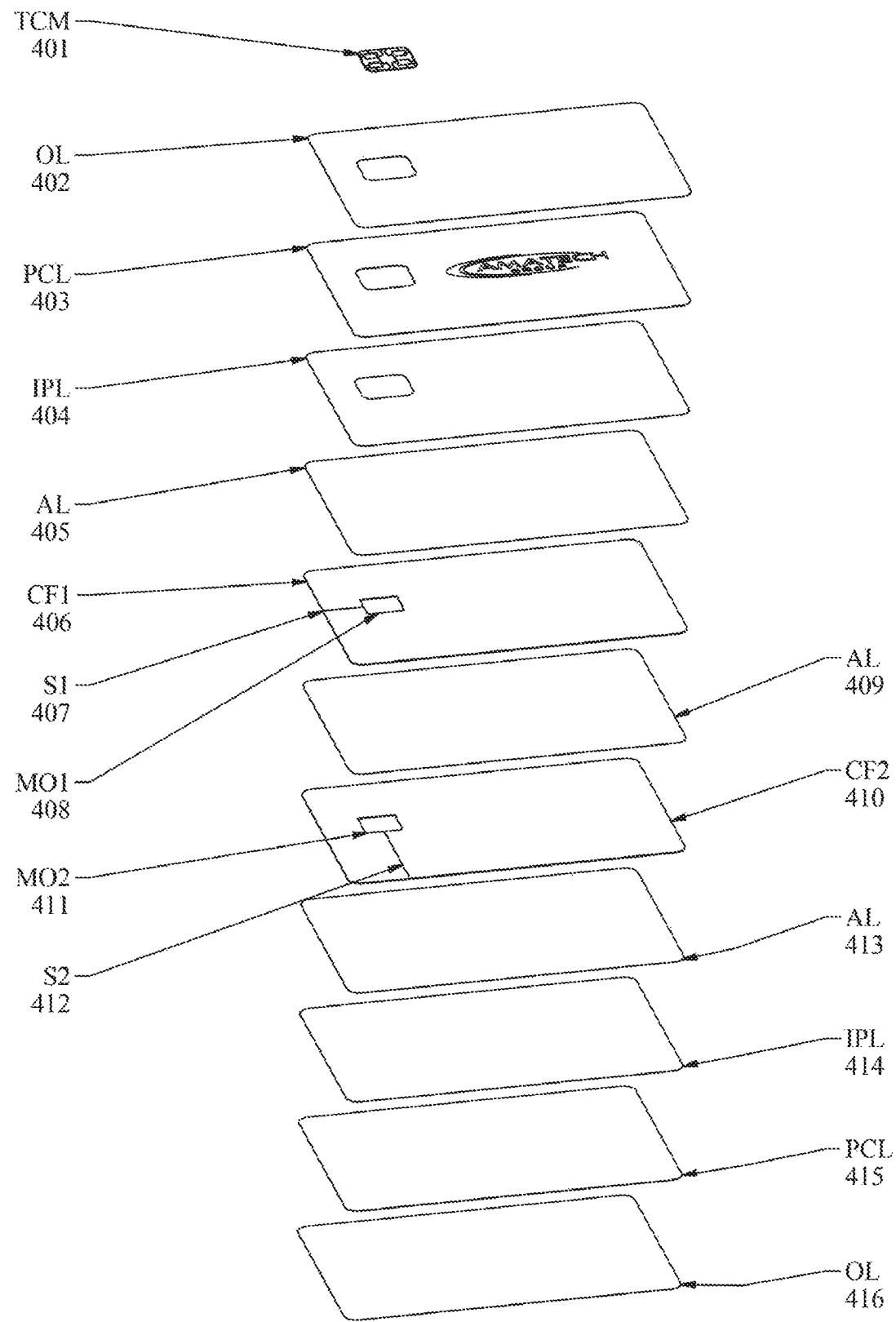

FIG. 4A is a diagrammatic view of the layers of a plastic-metal-plastic hybrid smartcard featuring a metal core having two coupling frames (CFs) with slit (S) and module openings (MOs) as part of a lamination subassembly (SAS).

Figure 4B:
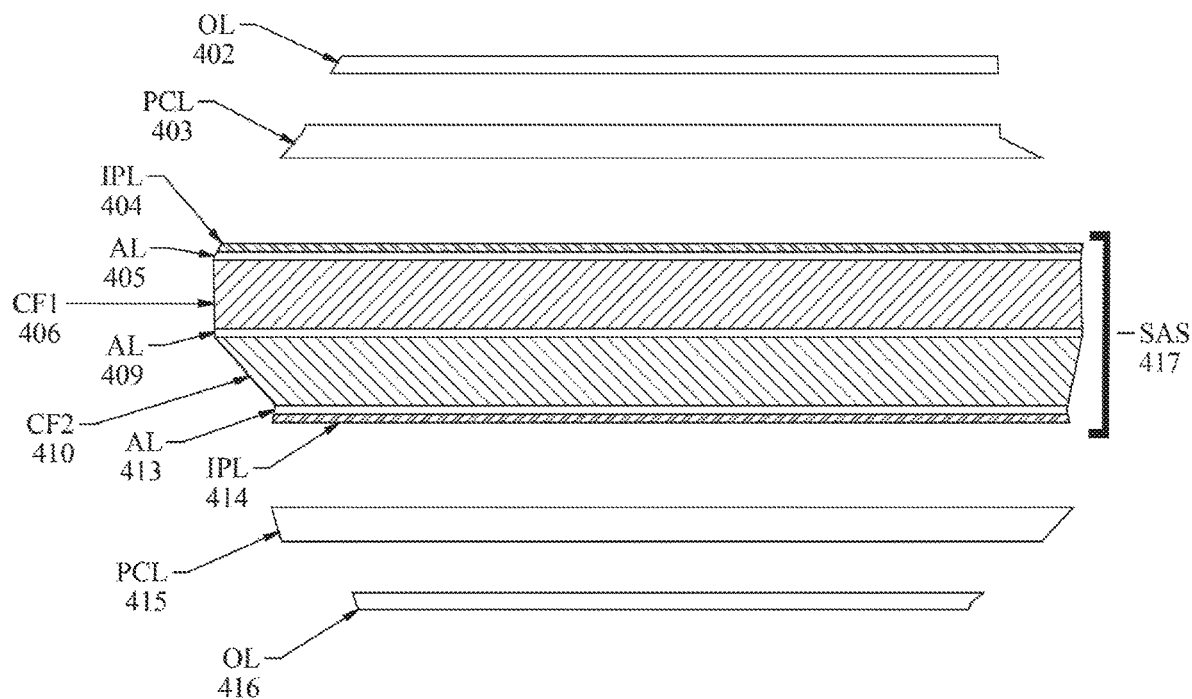

FIG. 4B is a partially exploded diagrammatic view of the layers of a plastic-metal-plastic hybrid smartcard featuring a metal core having two coupling frames (CFs) with slit (S) and module openings (MOs) as part of a lamination subassembly (SAS).

Figure 5A:
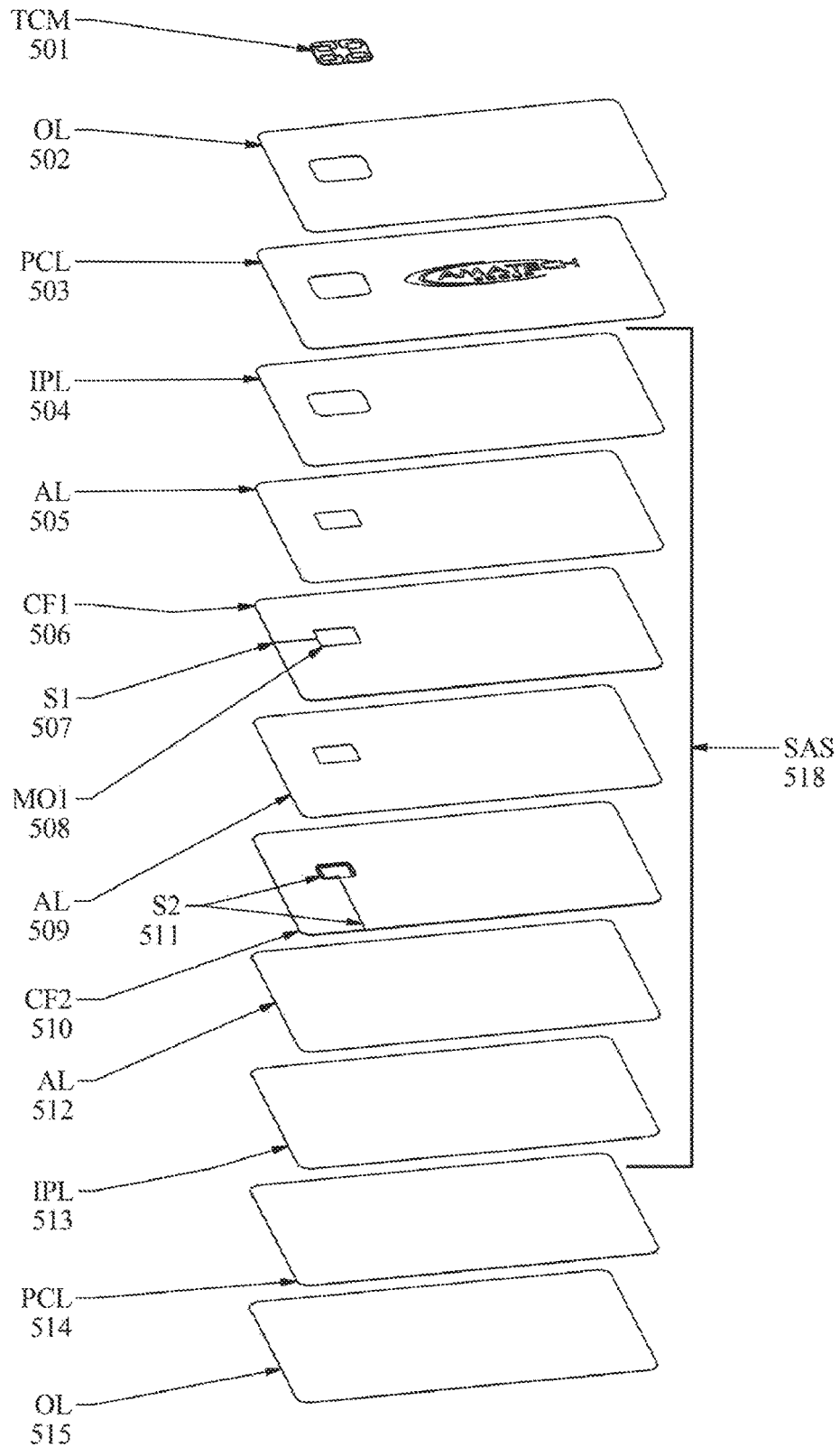

FIG. 5A is a diagrammatic view of the layers of a plastic-metal-plastic hybrid smartcard featuring a metal core having two coupling frames (CFs), one coupling frame (CF1) with slit (S) and module opening (MO) and the second coupling frame (CF2) with an extended slit (S2) as part of a lamination subassembly (SAS).

Figure 5B:
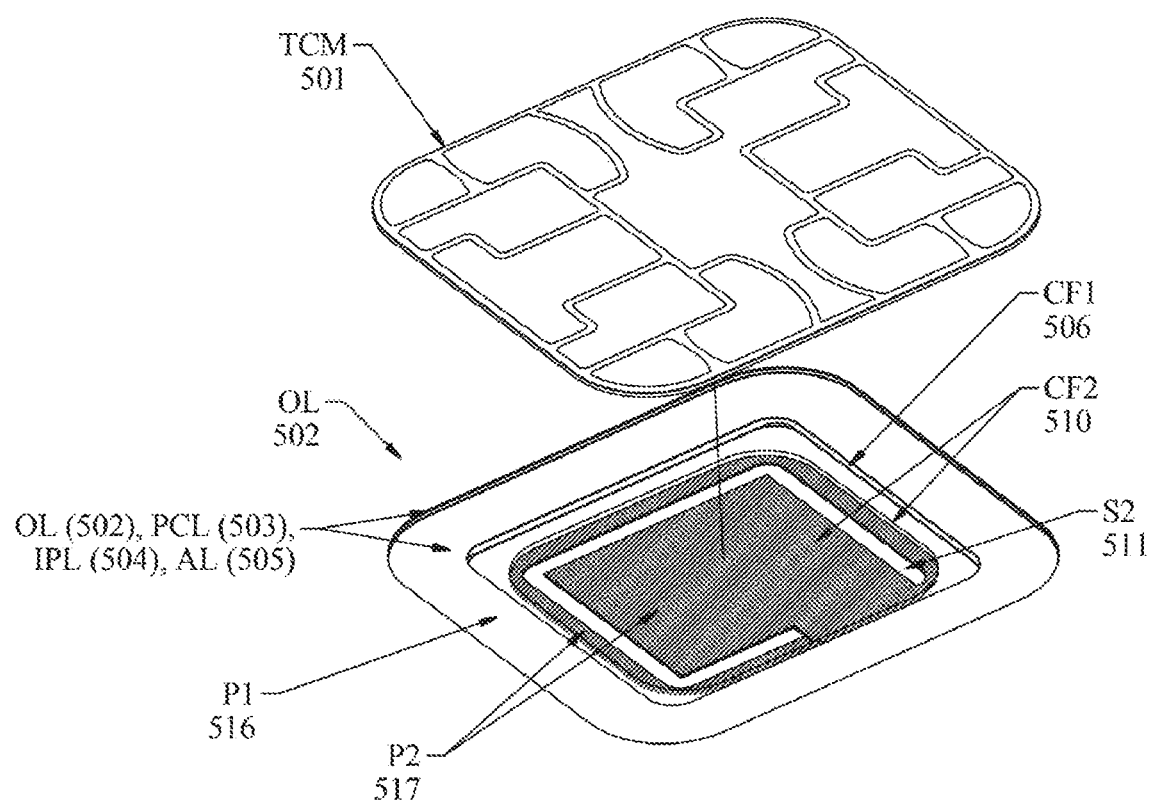

FIG. 5B is a partially exploded close-up diagrammatic view of a plastic-metal-plastic hybrid smartcard featuring a metal core having two coupling frames (CFs), one coupling frame (CF1) with slit (S) and module opening (MO) and the second coupling frame (CF2) with an extended slit (S2) as part of a lamination subassembly (SAS).

Figure 6A:
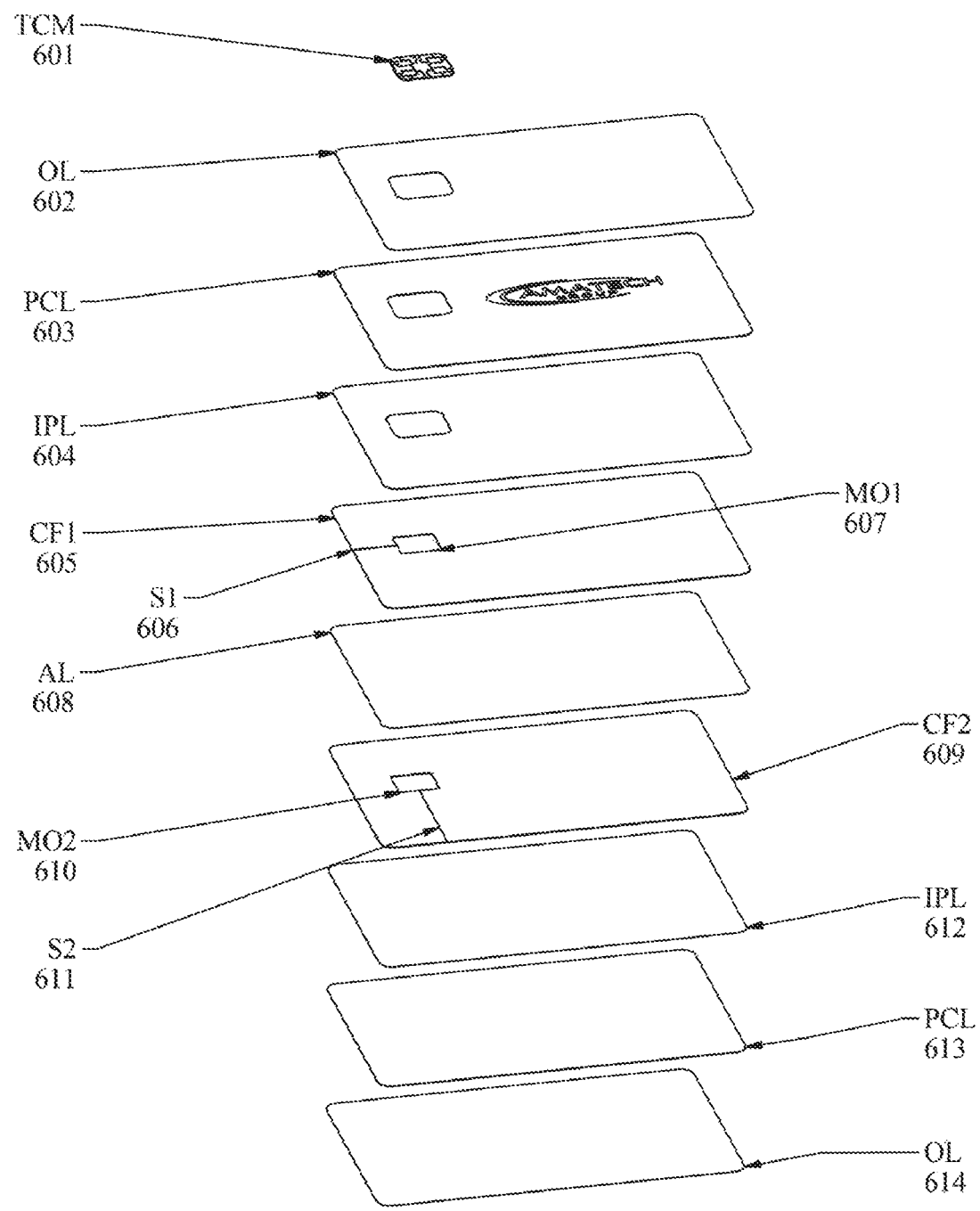

FIG. 6A is a diagrammatic view of the layers of a plastic-metal-plastic hybrid smartcard featuring a metal core having two coupling frames (CFs) with slit (S) and module openings (MOs) as part of a lamination subassembly (SAS).

Figure 6B:
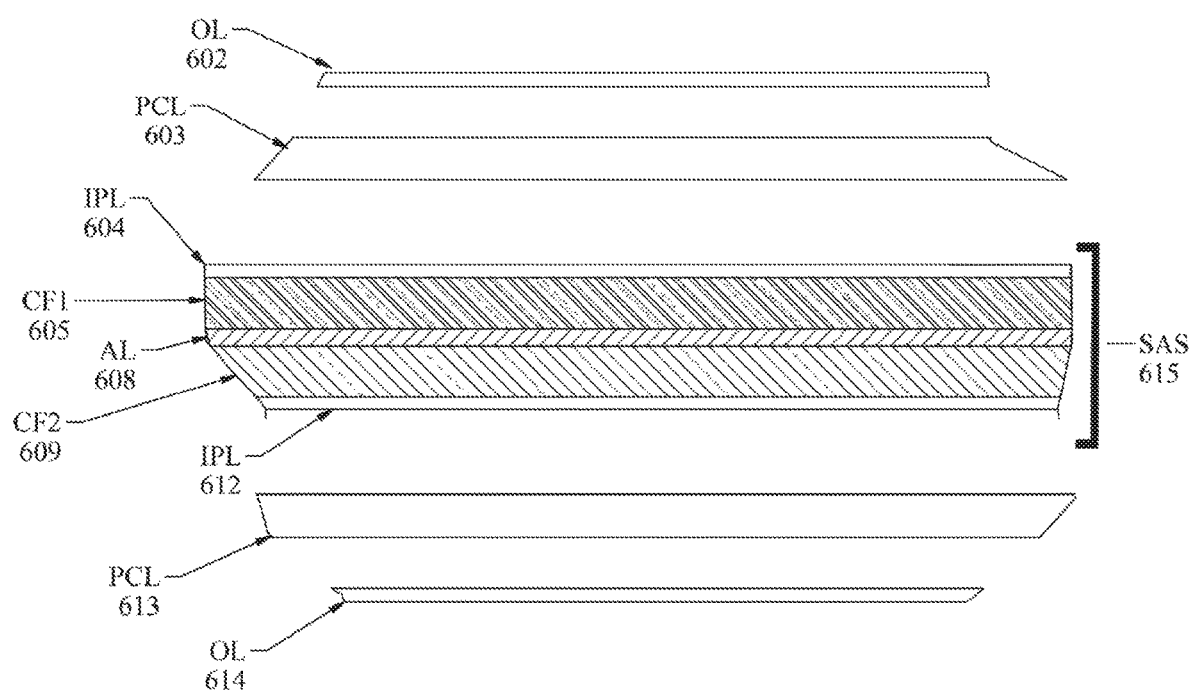

FIG. 6B is a partially exploded diagrammatic view of the layers of a plastic-metal-plastic hybrid smartcard featuring a metal core having two coupling frames (CFs) with slit (S) and module openings (MOs) as part of a lamination subassembly (SAS).

Figure 7:
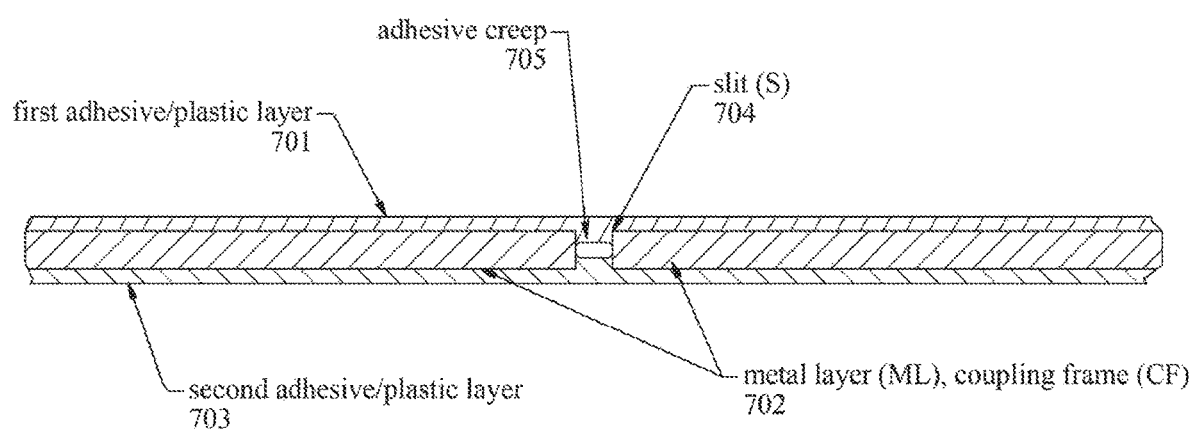

FIG. 7 is a cross sectional view of a metal layer (ML) with slit (S) which has been laminated to adjacent layers of a smartcard stack using adhesive layers, showing a magnified view of the region near the slit (S).

Figure 8A:
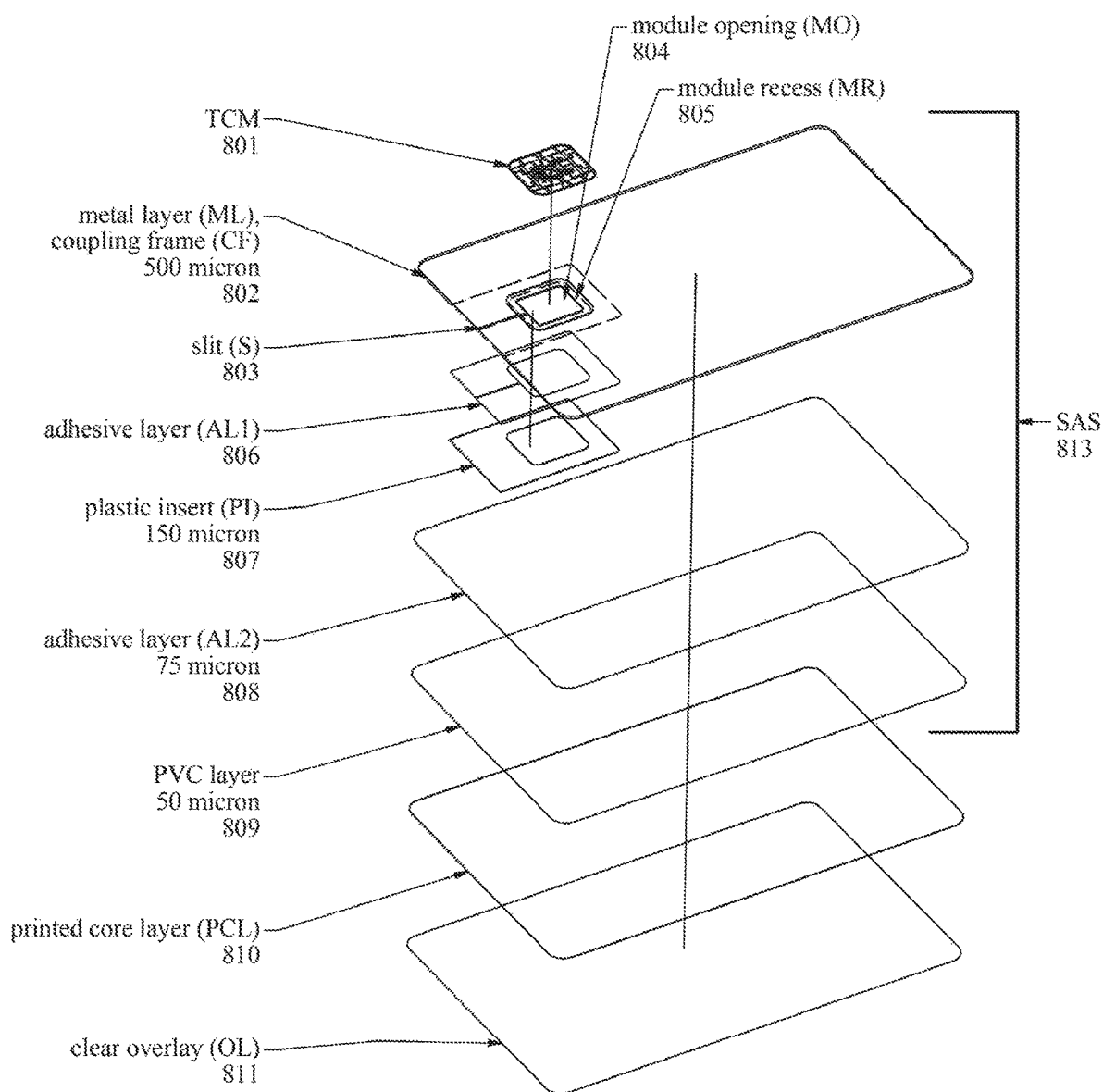

FIG. 8A is an exploded view of a metal veneer smartcard with slit (S) on the front metal layer (ML).

Figure 8B:
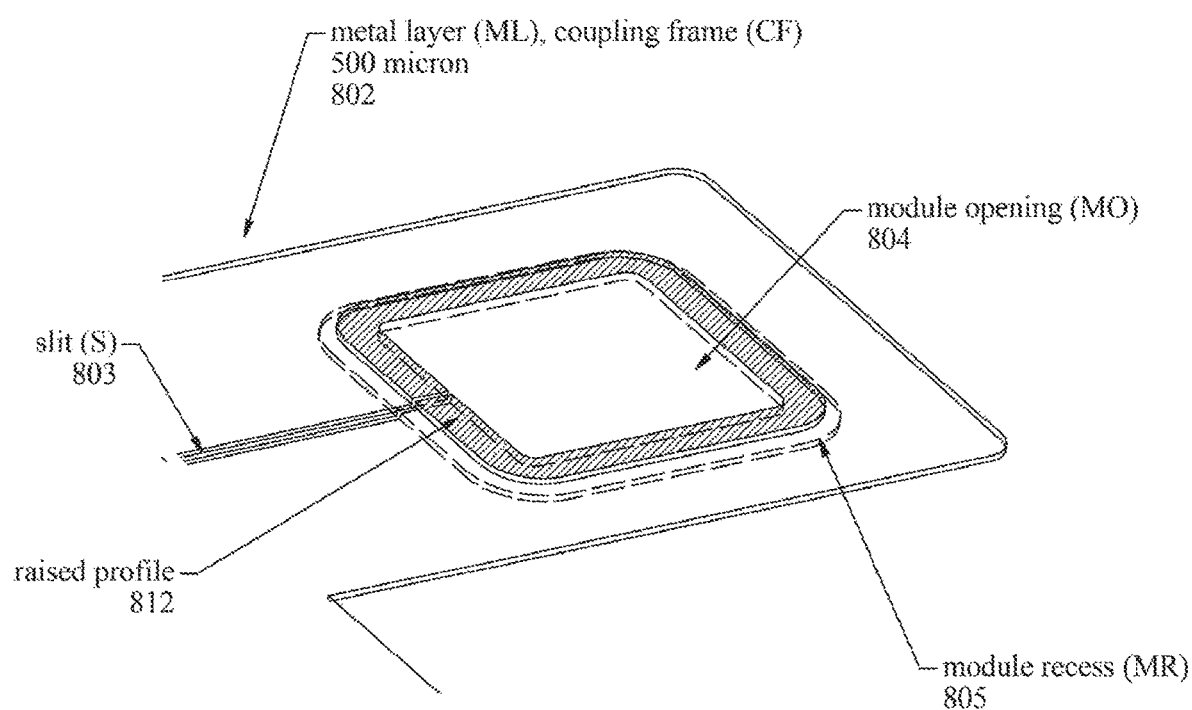

FIG. 8B is a close up of the rear side of a metal layer (ML) used in a smartcard showing a raised profile about the module opening designed to prevent metal warpage in the area of a recess to accommodate a transponder chip module (TCM).

Figure 9:
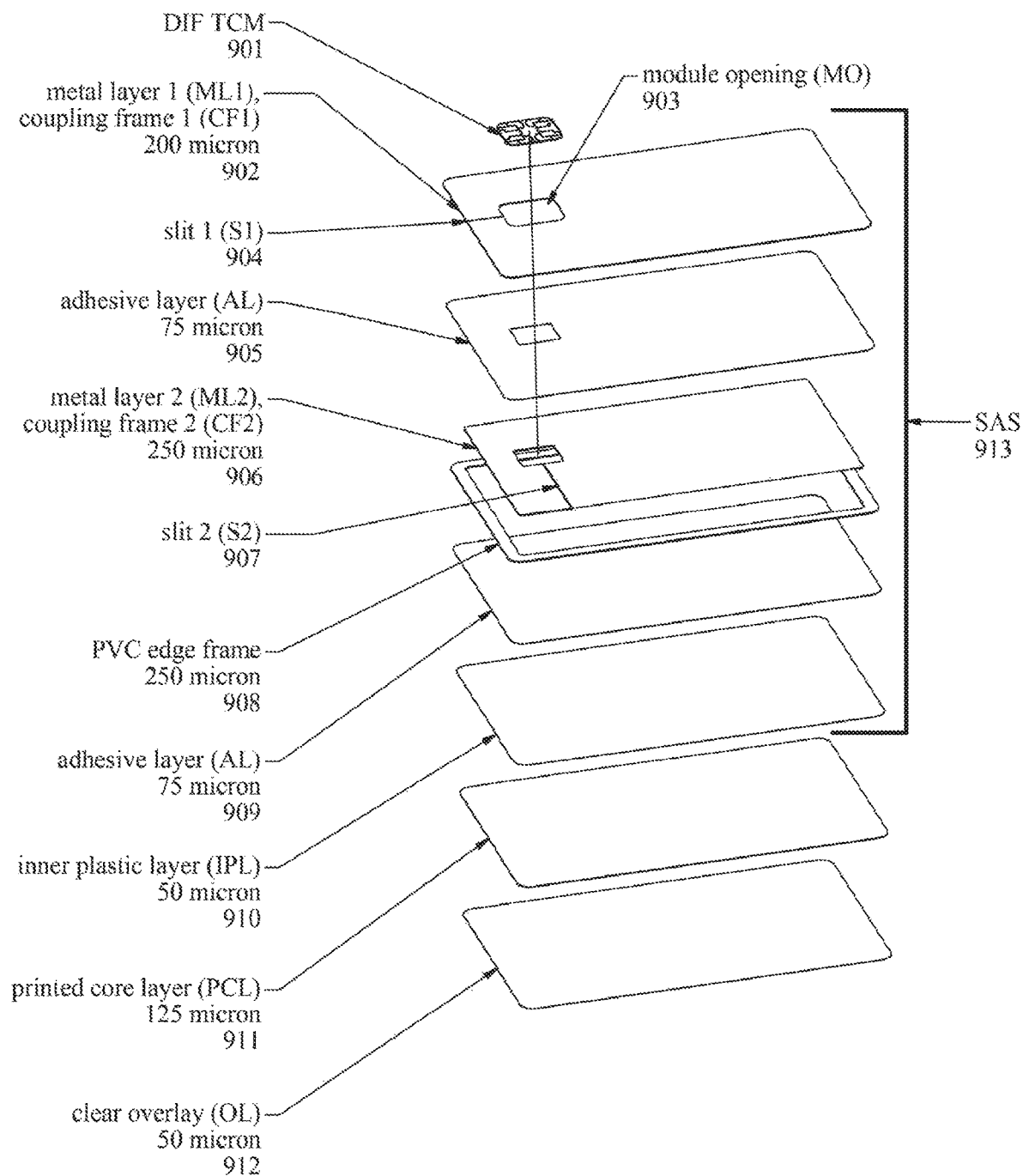

FIG. 9 is an exploded view of a metal veneer smartcard with two metal layers (ML) to form the core, each functioning as a coupling frame (ML).

Figure 10:
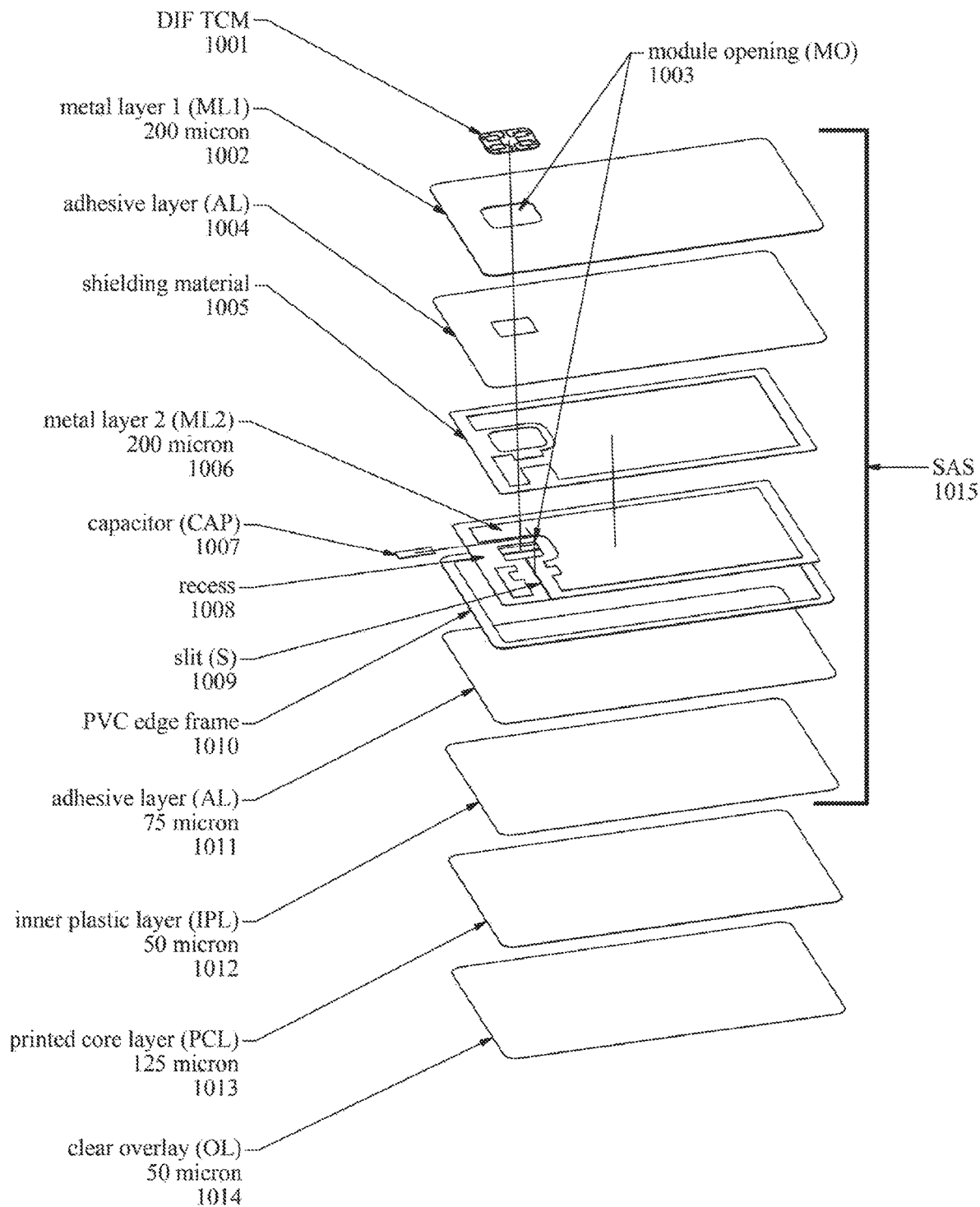

FIG. 10 is an exploded view of a metal veneer smartcard with two metal layers (ML) wherein an inner metal layer (ML) features a slit (S) and functions as a coupling frame (CF), being electromagnetically shielded from the first metal layer (ML) with suitably shaped shielding material.

Figure 11:
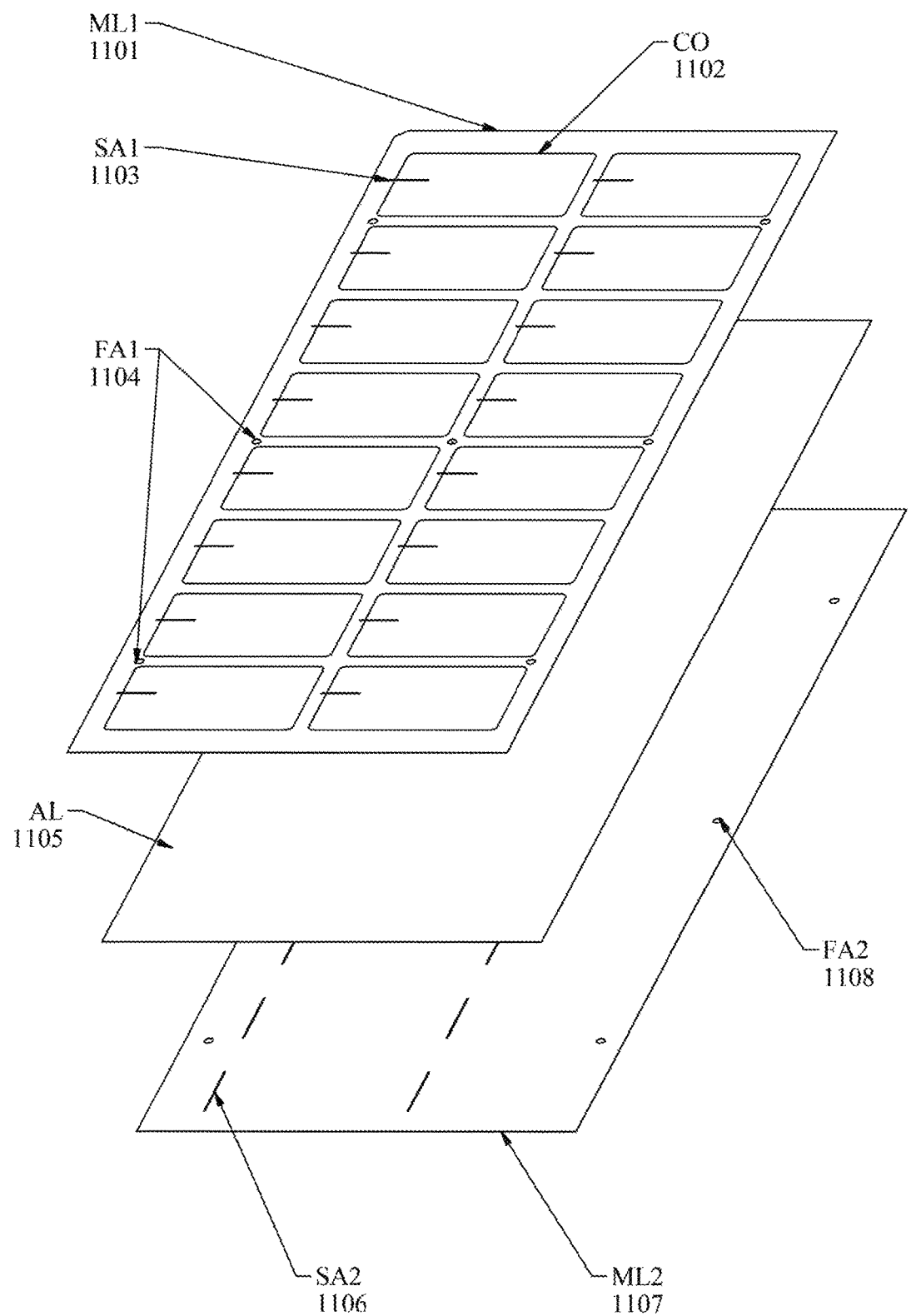

FIG. 11 is an exploded diagrammatic view of a metal prelam (2×8 format), with two metal layers but no opening for the transponder chip module (TCM) at each card site.

Figure 12:
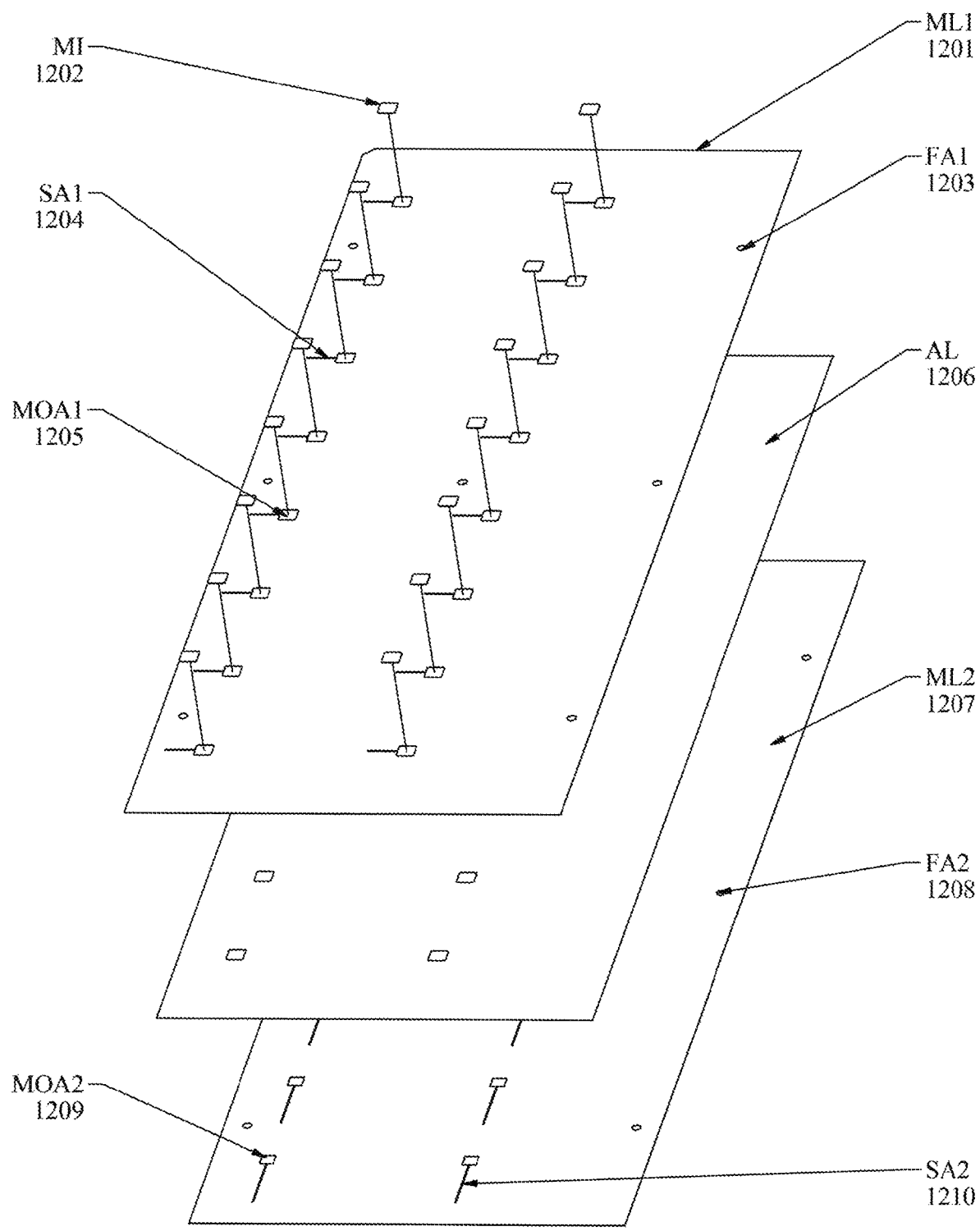

FIG. 12 is an exploded diagrammatic view of a metal prelam (2×8 format), with two metal layers and openings for the transponder chip module (TCM) at each card site with corresponding slugs filling the openings.

Figure 13:
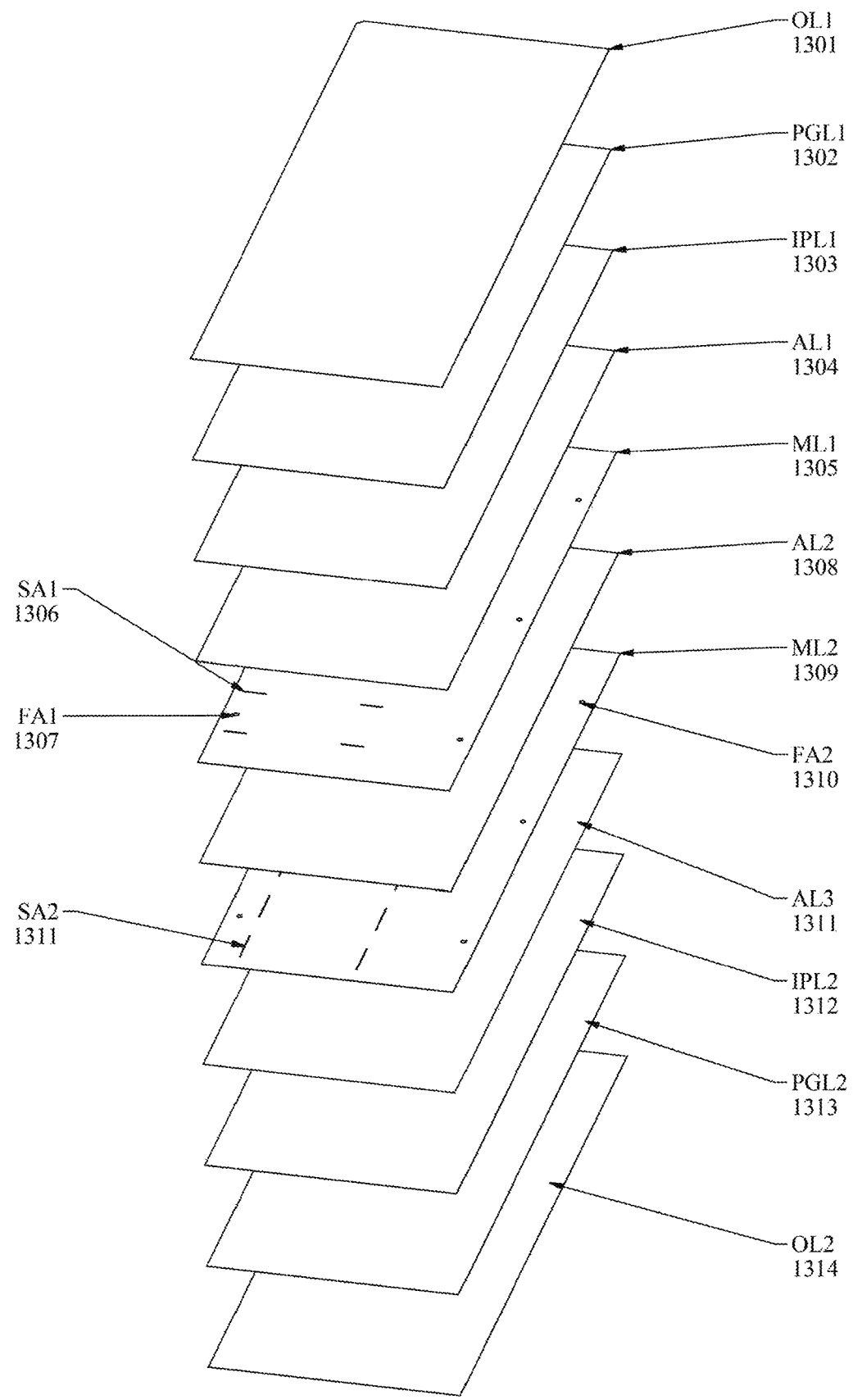

FIG. 13 is an exploded diagrammatic view of a laminated construction of plastic-metal-plastic smartcards (2×8 format), with two metal layers and printed graphics layers (PGL) laminated to the metal core layers.

Figure 14:
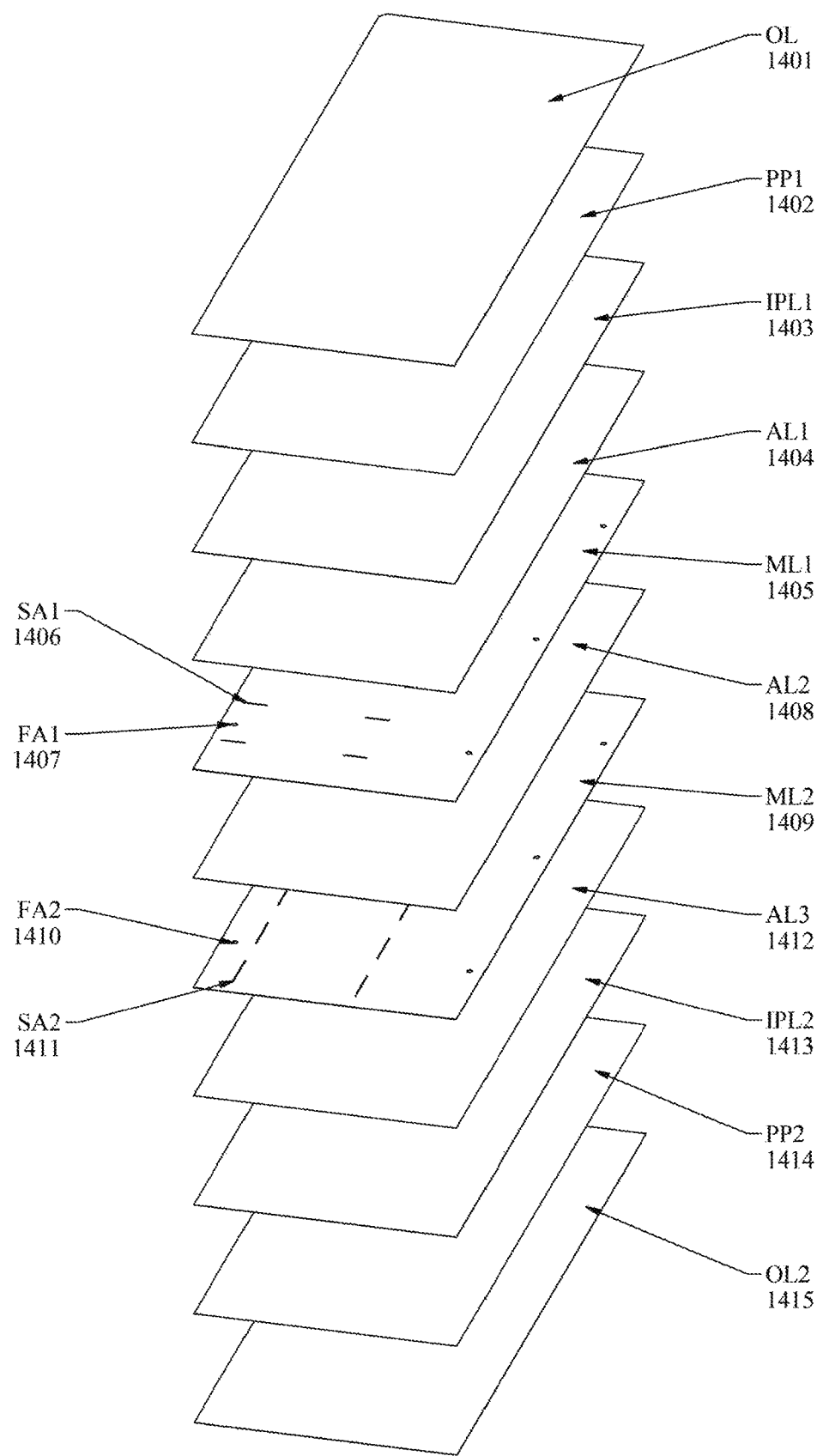

FIG. 14 is an exploded diagrammatic view of a laminated construction of plastic-metal-plastic smartcards (2×8 format), comprising two metal layers and suitable plastic layers primed to accept direct printing of graphics onto the metal prelam.

Figure 15:
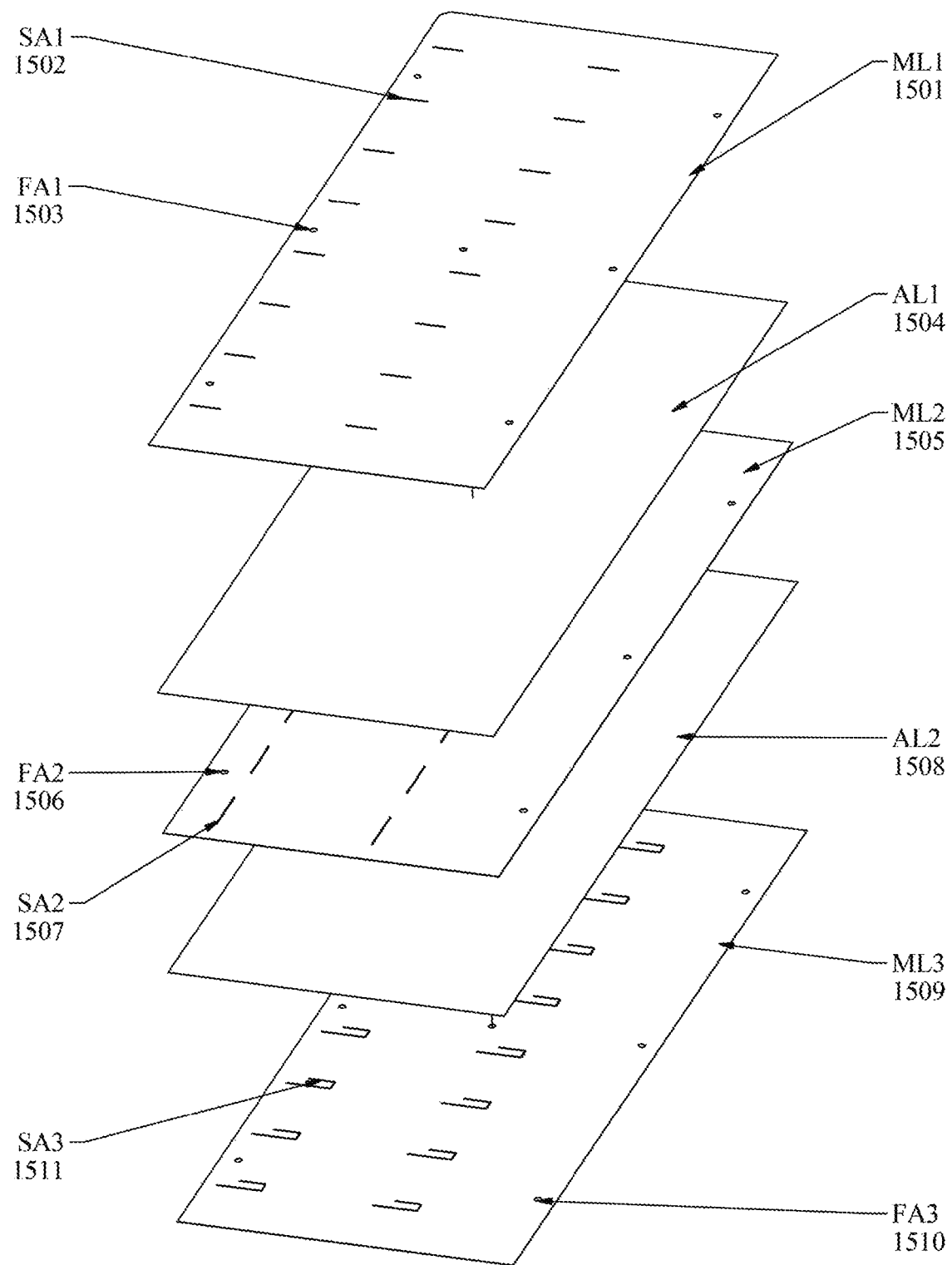

FIG. 15 is a an exploded diagrammatic view of a metal prelam (2×8 format) with three metal layers each bearing slit arrays (SA) offset from each other, without opening for the transponder chip module (TCM), that may be used to produce a predominantly metal smartcard.

DETAILED DESCRIPTION

Various embodiments (or examples) may be described to illustrate teachings of the invention(s), and should be construed as illustrative rather than limiting. It should be understood that it is not intended to limit the invention(s) to these particular embodiments. It should be understood that some individual features of various embodiments may be combined in different ways than shown, with one another. Reference herein to "one embodiment", "an embodiment", or similar formulations, may mean that a particular feature, structure, operation, or characteristic described in connection with the embodiment is included in at least one embodiment of the present invention. Some embodiments may not be explicitly designated as such ("an embodiment"). The embodiments and aspects thereof may be described and illustrated in conjunction with systems, devices and methods which are meant to be exemplary and illustrative, not limiting in scope. Specific configurations and details may be set forth in order to provide an understanding of the invention(s). However, it should be apparent to one skilled in the art that the invention(s) may be practiced without some of the specific details being presented herein. Furthermore, some well-known steps or components may be described only generally, or even omitted, for the sake of illustrative clarity. Elements referred to in the singular (e.g., "a widget") may be interpreted to include the possibility of plural instances of the element (e.g., "at least one widget"), unless explicitly otherwise stated (e.g., "one and only one widget").

In some figures, abbreviations (e.g., CF, S, etc.) which have been established for devices and components thereof may be used without accompanying reference numbers to identify various elements in the figures, for illustrative clarity.

In the following descriptions, some specific details may be set forth in order to provide an understanding of the invention(s) disclosed herein. It should be apparent to those skilled in the art that these invention(s) may be practiced without these specific details. In some descriptions, parameters such as dimensions, activation distance, frequency of operation, mode of operation and the like may be discussed, and these should be regarded as exemplary. Any dimensions and materials or processes set forth herein should be considered to be approximate and exemplary, unless otherwise indicated. Headings (typically underlined) may be provided as an aid to the reader, and should not be construed as limiting.

Some processes may be presented and described in a series (sequence) of steps. It should be understood that the sequence of steps is exemplary, and that the steps may be performed in a different order than presented, some steps which are described may be omitted, and some additional steps may be omitted from the sequence and may be described elsewhere.

Reference may be made to disclosures of some prior patents, publications and applications. Some text and drawings from those sources may be presented herein, but may be modified, edited or commented to blend more smoothly with the disclosure of the present application. Citation or identification of any reference should not be construed as an admission that such reference is available as prior art to the disclosure.

In the descriptions that follow, metal hybrid and metal veneer smartcards (or "metal smart cards") operating in both contactless and contact modes may be described. It should be understood that the teachings set forth herein may be applicable to metal smartcards having only a contact interface. Also, the teachings set forth herein may be applicable to RFID devices (which may operate only in a contactless mode) other than metal smart cards, such as jewelry, etc.

A Production Method for Manufacturing DIF "Plastic-Metal-Plastic" Hybrid Cards

A typical smartcard may measure approximately 54 mm×86 mm. An overall sheet from which the plastic layers for the cards are manufactured may comprise a plurality, such as a 4×8 of card-size areas for manufacturing a plurality (such as 32 total) of plastic layers for the cards.

Pre-lamination may be used to offset the problem of shrinkage during final lamination, but this may depend on the size of the printed sheets used, i.e. the greater the sheet size (such 4×8-299 mm×489.7 mm) the greater the amount of shrinkage (e.g., in the y- and x-axes). Also, the material plays a pivotal role—for example, PVC shrinks more than PET or PETG.

Conventionally for a contact-only metal card, two layers of plastic material, such as (i) an anti-scratch overlay and (ii) a printed graphic layer may be laminated together, i.e. "pre-laminated", before final lamination to either side (or to both sides) of a metal core. ("Contact-only" refers to a smartcard having only a contact interface, and lacking a contactless interface. "Dual interface" cards have both a contact interface and a contactless interface.)

Card-Size Lamination

As disclosed herein, at least two plastic layers, such as an overlay and a graphic layer, may be joined together by other than laminating, and may be referred to as a "sub-assembly" or a "plastic layer assembly"). A metal foil may be incorporated into the sub-assembly. These layers (and foil) may be different plastic materials (optionally, plus a metal foil), and may be joined together while in sheet form (multiple card areas). The printed plastic layer (or sheet) may be joined to an anti-scratch overlay film with an adhesive backing, or the layers may be collated or tacked together with one another (preferably outside of an area that will be printed) using an ultrasonic probe or heat element. By avoiding pre-lamination, there may be no pre-shrinking of the plastic layers involved. Ultimately, the sub-assemblies of joined plastic layers may be singulated (separated, reduced) into several card-size subassemblies (or plastic layer assemblies), and may be joined with a metal layer in card size format, and the resulting assembly (of subassemblies and metal layer) may be pre-pressed laminated together, before final lamination in a conventional press.

The metal core may comprise two metal layers separated by an adhesive coated dielectric layer which are pre-laminated together—before lamination with the plastic layers—to produce a "Metal-Prelam". Each metal layer in the "Prelam" may have a slit (so that the metal layer functions as a coupling frame) to enable contactless communication, and may have an opening to accept the mold mass contour of a chip module.

To avoid the problem of shrinkage, final lamination with the metal layer (which may be a coupling frame) will be a "card size" lamination step and not a sheet lamination process. Therefore, there will be no significant reduction on the overall dimensions of the plastic layers. The techniques disclosed herein may be applicable to either (i) single interface (i.e., contact interface) cards, or to (ii) dual interface (i.e., contact and contactless interfaces) cards. The metal layer (ML) may have an opening to accommodate the mold mass of a chip module. In the case of dual interface cards, the metal layer may also be provided with a slit (S) extending from the opening to an outer edge of the metal layer so that the metal layer may function as a coupling frame (CF).

The metal layer or coupling frame may have a stepped opening (or recess) to accept a chip module. A larger portion of the opening may accommodate a module tape of a chip module, and the smaller opening may accommodate the mold mass of a chip module.

The opening in the metal layer may be filled with a plastic slug, plug, or the like, for two reasons. Firstly, during final lamination the plastic layers (printed stock and overlays, etc.) without the slug could (undesirably) flow into the area of the opening. Secondly, during milling of the recess area for the chip module, the milling tool should only touch plastic and not metal. Since the plastic plug will ultimately be removed or partially removed (by milling), and may not appear in the final product, it may be considered to be a "sacrificial" element.

To assemble the sub-assemblies and metal layer, a dry film adhesive may be placed on both sides of the metal layer or coupling frame. The card-size front and rear face subassemblies (or plastic layer assemblies) may then be pre-pressed against the adhesive layers and the metal core or coupling frame to form a card blank.

The resulting card blanks may be placed in a holding template (fixture) having a format such as 3×8, before final lamination in a conventional press. The cycle time for hot and cold lamination may be about 45 minutes.

The laminated card blanks may then be provided with a recess through the top subassembly of two or more plastic layers, and extending into the opening of the metal layer to accept a chip module. As mentioned above, the milling procedure should only be performed in the area of the plastic slug.

After implantation of the chip module, the card blank can be personalized.

The above treatment of card-size lamination in producing dual interface metal cards and the teachings thereof may also be applicable to sheet format lamination. The following diagrams of the various card stack-up constructions may also relate to sheet lamination in a typical 2×8 format with the metal core inlay (having a 2×8 array of card body sites) consisting of a single metal layer or two metal layers pre-laminated to form a "Metal-Prelam".

FIG. 1A is a diagrammatic view of a DIF "Plastic-Metal-Plastic" Hybrid Card (RFID device) 100A, before lamination, generally comprising (from top-to-bottom, as viewed):

an 8 pin chip module 101 which may be a transponder chip module (TCM). The chip module may be single interface (contact only), or dual-interface (contact and contactless). In the latter case (dual interface), the chip module may be a transponder chip module having a module antenna. (A module antenna is not required in a contact only module.) In the main, a chip module which is a transponder chip module will be described, as exemplary.

a front clear overlay (plastic) layer 102 which may have a thickness of approximately 50 μm. A recess or opening (shown in dashed lines "module recess") for accepting the module may be milled in this layer, after final lamination.

a front (plastic) printed core layer 103 (displaying the logo "AMATECH") which may have a thickness of approximately 125 μm. A recess or opening (shown in dashed lines) for accepting the module may be milled in this layer, after final lamination.

the front clear overlay film with adhesive backing and front printed core may be adhesively attached together in sheet format and may constitute a front (plastic) subassembly (or plastic layer assembly, "PLA") 104.

a layer of adhesive 106 which may have a thickness of approximately 20 μm a metal layer (ML) (or metal core) 107 which may have a thickness of approximately 400 μm and which may be provided with an opening (MO) 109 which may be a stepped recess extending through the metal layer. The metal layer may have a slit S (or a non-conductive stripe NCS) 110 extending from the opening to an outer edge thereof so that the metal layer may function as a coupling frame (for a contactless interface). The metal layer or core may consist of several metal layers with slits. The slit is not necessary for a contact only chip module. The recess may be stepped, having a larger portion extending 100 μm into the metal layer, for a module tape of the chip module, and a smaller portion extending the rest of the way (additional 300 μm) through the metal layer for a mold mass of the chip module. This may ensure (in the case of contactless functionality) that the coupling frame appropriately overlaps the module antenna of the transponder chip module. The metal layer (ML) may comprise two metal layers, each having a thickness of approximately 200 μm. See FIG. 1B).

The opening MO 109 in the metal layer ML 107 may be filled with a plastic slug 108.

- a layer of adhesive 111 which may have a thickness of approximately 20 μm
- a rear printed core 112 which may have a thickness of approximately 125 μm. An opening or recess for the chip module may not be required in this layer.
- a rear clear overlay 113 which may have a thickness of approximately 50 μm. An opening or recess for the chip module may not be required in this layer.
- a magnetic stripe may be disposed on the bottom (as viewed) surface of the rear clear overlay.
- the rear clear overlay film with adhesive backing and rear printed core (including magnetic stripe) may be attached together and may constitute a rear (plastic) subassembly (or plastic layer assembly, "PLA") 115.

Card-size front and rear face subassemblies (plastic layer assemblies) may be pre-pressed against the adhesive layers and the metal core or coupling frame to form a card blank.

Generally, the module openings (MO) of the various embodiments described herein can be formed (such as milled) in a final step, after lamination (pre-lam).

FIG. 1B is a diagrammatic view of an alternate construction of a DIF "Plastic-Metal-Plastic" Hybrid Card (RFID device) 100B, before lamination. Generally, this embodiment differs from that of FIG. 1A in that the single metal layer (ML) 107 having a thickness of approximately 400 μm is replaced by two metal layers (ML1, ML2) 107A, 107B each having a thickness of approximately 200 μm. There is a layer 111 of adhesive (a dielectric medium) between the two metal layers ML1 and ML2. More particularly, the card may comprise (from top-to-bottom, as viewed):

- a front clear overlay (plastic) layer 102 which may have a thickness of approximately 50 μm. A recess or opening (shown in dashed lines "module recess") for accepting the module may be milled in this layer, after final lamination.
- a front (plastic) printed core layer 103 (displaying the logo "AMATECH") which may have a thickness of approximately 125 μm. A recess or opening (shown in dashed lines) for accepting the module may be milled in this layer, after final lamination.
- the front clear overlay film with adhesive backing and front printed core may be adhesively attached together in sheet format and may constitute a front (plastic) subassembly (or plastic layer assembly) 104.
- a layer of adhesive 106 which may have a thickness of approximately 20 μm
- a first metal layer (ML1) 107A which may have a thickness of approximately 200 μm and which may be provided with an opening (MO) 109A extending through the metal layer. The metal layer may have a slit S (or a non-conductive stripe NCS) 110A extending from the opening to an outer edge thereof so that the metal layer may function as a coupling frame (for a contactless interface).
- a layer of adhesive 111 which may have a thickness of approximately 20 μm
- a second metal layer (ML1) 107B which may have a thickness of approximately 200 μm and which may be provided with an opening (MO) 109B extending through the metal layer. The metal layer may have a slit S (or a non-conductive stripe NCS) 110B extending from the opening to an outer edge thereof so that the metal layer may function as a coupling frame (for a contactless interface).

The openings MO 109A and 109b in the metal layers ML1 107A and ML2 107B may be aligned with one another, and may be filled with a plastic slug 108.

- a layer of adhesive 111 which may have a thickness of approximately 20 μm
- a rear printed core 112 which may have a thickness of approximately 125 μm. An opening or recess for the chip module may not be required in this layer.
- a rear clear overlay 113 which may have a thickness of approximately 50 μm. An opening or recess for the chip module may not be required in this layer.
- a magnetic stripe may be disposed on the bottom (as viewed) surface of the rear clear overlay.
- the rear clear overlay film with adhesive backing and rear printed core (including magnetic stripe) may be attached together and may constitute a rear (plastic) subassembly (or plastic layer assembly) 115.

A sub-assembly with two metal layers and a dielectric medium (or layer) therebetween may be referred to as a metal "inlay". If there is one metal layer, this may be referred to as a metal "core".

FIG. 1C shows an exemplary slug 108 for fitting in the stepped recess (MO, 109). Note that the plug resembles (but may be shorter/shallower than) a chip module, having an upper wider portion 116 (corresponding to the module tape of a chip module) and a lower narrower portion 117 (corresponding to the mold mass of a chip module).

FIG. 1D shows an exemplary chip module 101, which may be an antenna module (AM) or a transponder chip module (TCM), comprising a module tape and mold mass encapsulating a chip.

In the case of a dual-interface (contact and contactless) chip module, which may be referred to herein as a transponder chip module, a module antenna may be incorporated into the chip module.

Manufacturing a Plastic-Metal-Plastic Card

Smartcards bearing a metal core or metal face may be laminated to one or more layers of plastic. The layers of plastic in the card stack may comprise one or more materials including, but not limited to, Polyvinyl Chloride (PVC), Polycarbonate (PC), Polyethylene terephthalate (PET) or Polyethylene Terephthalate Glycol-modified (PET-G). The construction of such a card typically requires the use of thermally activated adhesives at the interfaces between the plastic layers and metal and, optionally, between one or more plastic layers.

A smartcard with a metal core, together with plastic or other layers, may be assembled in a stack-up including one or more metal layers, for lamination at a required temperature. A challenge with this process is that typical plastic layers used in a smartcard construction are prone to shrinkage, plastic egress and other dimensional changes when heated above their glass transition temperature ($T_g$) or Vicat softening temperature (e.g. Vicat B standard). For example, PET-G may have a Vicat B temperature of approximately 82° C. The dimensional changes that occur during typical lamination conditions (e.g. 120° C., 45 minutes) can result in significant distortion of the card stack-up at the edges of the finished card and at the locations of any cavities or voids.

In addition, in order to construct a smartcard one or more of the plastic layers of the card may bear printed graphics. Dimensional changes in a printed layer of the card can result in visible distortion of the printed graphics.

Under this aspect of the invention one or more of the plastic layers used for smartcard construction may be heated to a value T1a above their $T_g$ or Vicat temperatures, and then cooled. This process may be repeated at alternate temperatures T1b, T1c, etc., forming a cycle. The heating of the plastic layer(s) may be carried out under pressure in sheet form, roll-to-roll, or on coils of plastic material bearing optional spacer layers to prevent sticking of layers to each other.

The thermal cycling process results in dimensional changes in the plastic layer(s). Following thermal cycling the material may be trimmed back to required shape or size, the use of thermal cycling may ensure dimensional stability of the plastic layers during further processing steps. At this stage one or more layers of plastic may be printed with the graphics required for the given smartcard design.

The dimensionally stable plastic layers can be laminated to each other and to the metal core or face of the smartcard. The use of adhesives with low activation temperature ensures that the lamination process to produce a final smartcard can be carried out a temperature T2<T1.

In practical terms, the pre-shrinking of the thermoplastic layers before printing may ensure that the plastic does not further shrink or expand during final lamination of the card stack-up with the metal core in a conventional press.

Selecting a front and rear plastic layer with a higher glass transition temperature than the adhesive layers has a significant advantage in avoiding further shrinkage or expansion of the plastic layer assemblies during the final lamination process.

And, contrary to the teachings of U.S. Pat. No. 8,672,232, the plastic layers of the first and second assembly can be of the same material, for example, the printed plastic layer can be made of polycarbonate, while the overlay film can also be polycarbonate (laser engravable). As noted in U.S. Pat. No. 8,672,232 . . .

> A method of making a card comprising the steps of: forming a first assembly of a first predetermined thickness, said first assembly including at least two layers of plastic material; firstly laminating the at least two layers of different plastic material at a first predetermined temperature and pressure for forming said first assembly; wherein said first lamination step comprises preshrinking the at least two layers of plastic material and reducing subsequent dimensional changes of the layers forming the first assembly; secondly forming a second assembly including said first assembly and a metal layer with an adhesive layer between the first assembly and the metal layer; and laminating the second assembly at a temperature which is lower than the first predetermined temperature.

Pre-shrinking is conventionally done in a conventional lamination press, subjecting the plastic layers to hot and cold cycles under extreme pressure (>20 bar). As disclosed herein, the plastic layers may be pre-shrunk in a belt laminator under insignificant pressure and merely tempering the material. Instead of a belt laminator to pre-shrink the plastic layers before printing, a conventional lamination press can be used.

The following materials and manufacturing steps may be utilized.

Pre-shrinking of the Front and Rear Plastic Layer prior to Printing:

Materials
   Material Layer for Printing: Polycarbonate White
   Manufacturer: Bayer
   Product Code: ID 4-4
   Thickness: 150 microns
   Material Layer for Anti-scratch Overlay Film: Polycarbonate Clear
   Manufacturer: Bayer
   Product Code: ID 6-2
   Thickness: 50 microns
Production Step 1—Temperature Cycling
   Belt Laminator Parameters for Temperature Cycling the Plastic Layers:
   Temperature 125 degrees C.
   Pressure: 10 PSI/CM$^3$
   Speed 1.5 cm/sec
Production Step 2
   Print features onto the pre-shrunk white polycarbonate (PC) to produce the front and rear face graphic layers
Production Step 4-1
   Lightly tack or bond the printed 150 micron PC to the back of the Clear 50 micron overlay film with enough force from the back side of the printed layer that no imprint on the overlay film is visible.
Production Step 4-2
   Punch the pre-shrunk PC layers into card size plastic layer assemblies (ID1 size)
Production Step 5
   Tack the adhesive layers to the back side of the front and rear plastic layer assemblies (two layers: Printed layer and Overlay Film).
Production Step 6—Final Lamination
   Place the "card size" stack-up containing the front and rear plastic layers assemblies, the intermediate adhesive layers and the metal core (400 μm) into a laminator
   Lamination Parameters:
   Laminate using Standard PVC setting parameters
   Temperature & Pressure Settings: 140° C. and 160 Bar pressure for 30 minutes.

Use of Laminated Metal-Plastic Subassemblies (SAS)

In an alternative manufacturing process for plastic-metal-plastic smartcards a laminated subassembly (SAS) containing one or more sheet metal layers (MLs) may be considered. The general concept of the invention is the creation of a subassembly (SAS) constructed from laminated layers of one or more metal sheets and plastic, with appropriate adhesives where required. The subassembly (SAS) may be in the format of a single card or multiple cards separated from each other in a given array. One or more of the plastic layers of the subassembly (SAS) may be considered sacrificial layers that may be subjected to shrinkage and distortion during lamination to the metal layer(s). In subsequent lamination steps the printed core layer(s) and outer layer(s) of the cards may be applied to the subassembly (SAS) using optimum lamination conditions including temperature, time and pressure and, optionally, without the use of additional adhesive layers; i.e. the outermost plastic layer of the subassembly (SAS) may be the same material type as the next adjacent plastic layer or be compatible for direct adhesive-less lamination. In this manner the printed core layer(s) and outer layer(s) may be laminated under their optimum conditions and avoid suffering dimensional distortion during lamination to form a plastic-metal-plastic smartcard. It is noted that by forming the outer layers of the subassembly (SAS) in plastic the subassembly may be considered in a manner similar to a conventional inlay for a smartcard and may be used with similar lamination processes and conditions thereby improving manufacturing yield.

This technique may be applied to cards laminated in single card units as described previously or to appropriate sheet formats containing multiple cards which are subsequently milled, punched or otherwise cut and isolated from the sheet format (e.g. 2 card units by 4 card units). The sheet format may take into consideration the shrinkage characteristics of a given plastic and be may be designed to minimize distortion during lamination along a particular direction; e.g. along a grain direction of a given plastic material.

Below are some general descriptions of components and processes applicable to the inventions disclosed herein:

Front and rear clear plastic overlays (OLs) which may have a thickness of approximately 50 µm. This layer serves as a protection layer for the plastic-faced smartcard and is typically placed on top of and laminated to the layer(s) bearing printed graphics of the card. The overlay layers may bear card features such as magnetic stripes, holograms or signature panels on top or under them and these may be applied pre or post lamination.

Front and rear plastic printed core layers (PCLs) which may have thickness typically in the range 75 µm to 125 µm. These layers bear the visible graphics, logos and artwork of the card. The graphics of the printed core layers (PCLs) may be optionally oversized to account for any dimensional changes during lamination.

Inner plastic layers (IPLs) which may be a plastic layer with thickness typically in the range 20 µm to 100 µm. This layer may not necessarily feature graphics or other features that could be subject to visible distortion in the final card assembly. This layer may be optically transparent. This layer may bear a coating such as a RF transparent thin metal foil or metallic micro-particle coating for decorative effect. The inner plastic layers (IPLs) may be subjected to thermal stress during lamination to metal layers (MLs) by exposure to elevated temperatures exceeding their glass transition temperature ($T_g$) and/or Vicat softening temperatures. An inner plastic layer (IPL) may suffer dimensional shrinkage following lamination to a metal layer (ML) during the formation of a subassembly (SAS). For example, use of a thermoset adhesive requiring exposure to 150° C. temperature would significantly exceed the Vicat B temperature of a PET-G inner plastic layer (IPL) of 82° C. and thus may cause shrinkage or distortion during lamination. In this manner the distortion caused by exposure to elevated temperatures during lamination of the subassembly (SAS) may be tolerated and in this manner the inner plastic layer (IPL) may be considered a sacrificial layer. The inner plastic layer (IPL) may be composed of the same plastic material as a printed core layer (PCL) to permit adhesive-less lamination under optimum conditions and so avoid issues of shrinkage of the printed core layer (PCL) and in turn avoid issues of distortion of graphics or other artwork in the final card assembly. To aid lamination of an inner plastic layer (IPL) to a printed core layer (PCL) or metal layer (ML) the IPL may be treated in some manner to promote adhesion. Examples of suitable treatments include but are not limited to the following:

Lamination using textured, rough or matt lamination plates in order to provide a textured outer surface for subsequent lamination steps Immersion or spray treatment with a suitable solvent to alter the surface chemical properties of the plastic and promote adhesion Application of a primer Mechanical roughening by sandpaper, brushing or sandblasting Adhesive layers which may be any class of suitable adhesive including but not limited to epoxy, thermoset, UV-cured, hot-melt and pressure-sensitive types. The adhesive may be typically of thickness 10 µm to 75 µm prior to lamination and allowance may be made for shrinkage during curing and lamination. The adhesive may be supported by a plastic membrane or film which may be coated on two sides: e.g. 25 µm PET bearing 25 µm of adhesive on each side. Alternatively the adhesive may be directly deposited onto any of the layers of the card stack-up by spraying, silk screen printing or other means. The adhesive layers (AL) shown or described herein may be distinct from one another in terms of adhesive type, thickness and/or curing conditions for a given exemplary card construction.

Metal layer(s) (MLs) comprising typically free-standing metal foils or sheets with thickness typically in the range 50 µm to 400 µm. A metal layer (ML) may optionally feature a slit (S) and/or a module opening (MO) to enable it to function as a coupling frame (CF). A metal layer (ML) may be composed of any metal or metal alloy including but not limited to steel, aluminum, copper/zinc, titanium and tungsten. The metal layer (ML) itself may be a laminate of multiple metals or a laminate of metals with non-metals such as carbon fiber or wood. The metal layer may feature a dielectric coating or decorative coating or may be electroplated. The metal layer may be finished or treated to promote adhesion to adjacent layers in the card stack-up.

Features such as slits (S), module openings (MOs) and/or index marks may be formed in one or more of the metal layers prior to lamination to form a given subassembly (SAS). These features may be formed by a variety of techniques including laser cutting, wire electrical discharge machining, chemical etching, etc. The metal layers (MLs) may be any metal type or metal alloy and may have a variety of treatments or finishes including brushing, polishing, chemical priming, anodizing or other coating for any purpose including, for example, decorative effect, adhesion improvement, electrical isolation or corrosion resistance.

A metal layer (ML) may be laminated to adjacent layers including other metal layers and/or inner plastic layers (IPLs) using processing conditions that are optimum for the chosen adhesive and IPL material.

In the case of multiple card-sized areas being laminated together in a sheet format, the cards may be punched out from the format into individual units using a punching press and appropriate tooling. Individual cards may be also be formed by milling, laser cutting, water jet cutting or any other suitable means. The process used to isolate the final laminated cards may distort the edges of the cards or leave sharp edges between layers or at the outer edges of the card. In an aspect of the invention the card edges may be beveled, filed or chamfered in a subsequent step to provide appropriately shaped card edges.

The transponder chip module (TCM) may be in either 8-pin or 6-pin format and be matched to a suitably sized module opening (MO) as appropriate. In addition the position, shape and size of the slit (S) may be adjusted to accommodate either an 8-pin or 6-pin module size. In the case of a 6-pin transponder chip module (TCM) the corresponding module antenna (MA) may require the connection of a capacitor across the antenna ends and across the chip (IC) in order to adjust the resonance frequency of the (TCM) and to enable suitable operational performance of the smartcard when communicating with a reader. A capacitor may also be connected across one or more of the slits (S) of any of the coupling frames (CFs) within a given card.

The techniques disclosed herein may be applicable to either (i) single interface (i.e., contact interface) cards, or to (ii) dual interface (i.e., contact and contactless interfaces) cards. The metal layer (ML) may have an opening to accommodate the mold mass of a chip module. In the case of dual interface cards, the metal layer(s) may also be provided with a slit (S) extending from the opening to an outer edge of the metal layer(s) (MLs) so that the metal layer(s) (MLs) may function as a coupling frame (CF). The metal layer(s) or coupling frame(s) (CFs) may have a stepped opening (or recess) to accept a chip module. A larger portion of the opening may accommodate a module tape of a chip module, and the smaller opening may accommodate the mold mass of a chip module.

The opening in the metal layer may be filled with a plastic slug that may not appear in the final product and may be considered to be a "sacrificial" element.

Laminated Subassemblies (SAS) Comprising One Metal Layer (ML)

FIG. 2A is an exploded view of the card assembly with the following characteristics from top to bottom (as viewed):

A chip module (CM) 201 shown as 8-pin type which may also be of 6-pin format of single interface (contact-only) type.

A front clear plastic overlay (OL), or outer layer, 202 which may have a thickness of approximately 50 µm.

A front plastic printed core layer (PCL) 203 displaying the logo "AMATECH" which may have thickness typically in the range 75 µm to 125 µm.

The front outer layer 202 and core layer 203 are disposed on the front surface of the card.

An inner plastic layer (IPL) 204 which may be a plastic layer with thickness typically in the range 20 µm to 100 µm.

An adhesive layer (AL) 205 for bonding the inner plastic layer (IPL) 204 to the metal layer (ML) 206. The metal layer (ML) 206 may feature a module opening (MO) 207. A second adhesive layer (AL) 208 may be used to bond the metal layer (ML) 206 to a second inner plastic layer (IPL) 209. These layers may be laminated in one lamination step to form a subassembly (SAS) 212.

A recess or opening may be milled in any or all of the layers 202, 204, 205 and 206 to accommodate the chip module (CM) after lamination of the complete card stack. This recess or opening may also be formed in any of the layers before lamination.

A second printed core layer (PCL) 210 followed by a second outer layer (OL) 211 on the back surface of the card.

In various embodiments disclosed herein, subassemblies (e.g., 212) are described which are components which will be used in a card body and which comprise at least one metal layer and an insulating layer which are joined (such as laminated) together. Eventually, front and back plastic printed layers including protective clear overlay and adhesive layers may be laminated to the subassembly to form a card body stack-up.

FIG. 2B illustrates an exploded side-view of the card stack-up shown in FIG. 2A. The subassembly (SAS) 212 may be formed in a first lamination step by combining the layers IPL (204), AL (205), ML (206), AL (208) and IPL (209). The layers OL (202), PCL (203), PCL (210) and OL (211) may be laminated to the subassembly (SAS) in a second lamination process using different conditions to the first lamination process in order to avoid distortion of the card graphics. The printed core layers (PCL) 203 and 210 may be of the same material to the outermost layers of the subassembly (SAS); i.e. inner plastic layers (IPL) 204 and 209.

The card in FIGS. 2A and 2B is exemplary of a card that may be a contact-only card (not contactless), so the metal layer 206 does not need a slit (S) to function as a coupling frame (CF).

FIG. 3A illustrates an exploded view of a "Plastic-Metal-Plastic" smartcard with a single metal layer (ML) 306, a transponder chip module (TCM) 301 enabling dual interface (DIF) operation in contact and contactless modes. In this case the metal layer (ML) 306 features a slit (S) 307 and module opening (MO) 308 enabling the metal layer (ML) to function as a coupling frame (CF).

The coupling frame (CF) 306 features a recess on one side which accommodates an insert referred to, in this instance, as a support panel (SP) 310. The support panel (SP) 310 may be a metal and may be coated in a dielectric or other material to prevent electrical short-circuiting across the slit (S) 307 of the coupling frame (CF) 306. The support panel (SP) 310 may be a non-metal. The primary function of the support panel (SP) 310 is to provide mechanical stability to the coupling frame (CF) 306 across the slit (S) 307 under bending stresses during use of the card. The support panel (SP) 310 is attached to the coupling frame (CF) 306 using an adhesive layer (AL) 309. In this case the layers IPL (304), AL (305) CF (306), AL (309), SP (310), AL (311) and IPL (312) may comprise a subassembly (SAS) 315 which may be laminated together in one or more steps.

The layers OL (302), PCL (303), PCL (313) and OL (314) may be laminated to the subassembly (SAS) during a subsequent lamination step. Alternatively, the support panel SP (310) and associated adhesive layer (309) may be excluded from the subassembly (SAS) and inserted at a later stage before final lamination; in this case the support panel may have a surface finish permitting adhesive-less bonding to a printed core layer (PCL) or an appropriate adhesive layer (AL) may be used.

FIG. 3B illustrates an exploded view of the subassembly (SAS) related to FIG. 3A as seen from the rear side of the card. An exemplary shape and size of support panel (SP) 310 is shown along with corresponding support panel recess (SPR) 315 in the coupling frame (CF) 306. The support panel recess (SPR) 315 may be somewhat larger than the support panel (SP) 310 to allow for manufacturing variation in the support panel (SP) 310 and to allow for a given thickness of adhesive layer (AL) 309 or other bonding agent.

Laminated Subassemblies (SAS) Comprising Two Metal Layers (MLs)

FIG. 4A illustrates an exploded view of an alternate construction of a DIF "Plastic-Metal-Plastic" Hybrid Card (RFID device). In this case the design features two metal layers (ML) with corresponding slits (S1) 407 and (S2) 412 along with module openings (MO1) 408 and (MO2) 411 enabling the metal layers (ML) to perform as coupling frames (CH) 406 and (CF2) 410. Also shown is a transponder chip module (TCM) 401 which is of 8-pin type which may also be of 6-pin format of dual interface (contact and contactless) type.

The two metal layers (CF1 (406) and CF2 (410) may be laminated together using the adhesive layer (AL (409)) to form a "Metal-Prelam", before laminating the plastic layers thereto. In a final step, the overlay layers, adhesive layers, inner plastic layers and printed core layers are laminated to this metal pre-laminated inlay.

Alternatively, the first lamination step may comprise of the following plastic and metal layers: IPL (404), AL (405), CF1 (406), AL (409), CF2 (410), AL (413) and IPL (414) which are all laminated together to form a plastic metal plastic pre-laminated inlay ("Plastic-Metal-Plastic-Prelam"). In a final step, the overlay layers and printed core layers are laminated to this plastic metal plastic pre-laminated inlay.

FIG. 4B is a partially exploded side-on (cross-sectional) view of the construction shown in FIG. 4A showing the following features:

A front clear plastic overlay (OL) 402 which may have a thickness of approximately 50 μm.

A front plastic printed core layer (PCL) 403 which may have thickness typically in the range 75 μm to 125 μm.

An inner plastic layer (IPL) 404 which may be a plastic layer with thickness typically in the range 20 μm to 100 μm. An adhesive layer (AL) 405 for bonding the inner plastic layer (IPL) 404 to the coupling frame (CF) 406. A second adhesive layer (AL) 409 bonding the coupling frames (CH) 406 and (CF2) 410. A third adhesive layer (AL) 413 bonding the coupling frame (CF2) 410 to the second inner plastic layer (IPL) 414. These layers may be laminated in one lamination step to form a subassembly (SAS) 417.

A rear plastic printed core layer (PCL) 415 which may have thickness typically in the range 75 μm to 125 μm.

A rear clear plastic overlay (OL) 416 which may have a thickness of approximately 50 μm.

Depending on the printing method (digital, offset or screen printing), the material thickness of the printed core layer (PCL) may vary from 75 μm to 150 μm. The thickness of the front clear plastic overlay layer (OL) may vary from 50 μm to 75 μm, if the material requires lasing for personalization.

FIG. 5A illustrates an exploded view of an alternate construction of a DIF "Plastic-Metal-Plastic" Hybrid Card (RFID device). In this case the design features two metal layers (MLs) with corresponding slits (S1) 507 and (S2) 511. The coupling frame (CH) 506 features a module opening (MO1) 508. The second coupling frame (CF2) 510 features an extended slit (S2) 511 and does not feature a module opening (MO). Also shown is a transponder chip module (TCM) 501 which is of 8-pin type which may also be of 6-pin format of dual interface (contact and contactless) type. In particular the design features:

A transponder chip module (TCM) 501 shown as 8-pin type which may also be of 6-pin format of single interface (contact-only) or dual interface (contact or contactless) type.

A front clear plastic overlay (OL) 502 which may have a thickness of approximately 50 μm.

A front plastic printed core layer (PCL) 503 displaying the logo "AMATECH" which may have thickness typically in the range 75 μm to 125 μm.

An inner plastic layer (IPL) 504 which may be a plastic layer with thickness typically in the range 20 μm to 100 μm.

An adhesive layer (AL) 505 for bonding the inner plastic layer (IPL) 504 to the first coupling frame (CF1) 506. The coupling frame (CF2) 506 may have thickness of 200 μm and feature a slit (S1) 507 and a module opening (MO1) 508. A second adhesive layer (AL) 509 may be used to bond the first coupling frame (CF1) 506 to a second coupling frame (CF2) 510 whose thickness may also be approximately 200 μm. The second coupling frame (CF2) 510 features an extended slit (S2) 511 which is offset in position from the first slit (S1) 507 such that each coupling frame (CF1, CF2) mutually support one another after lamination, particularly in the regions of the card near the slits S1 (507) and S2 (511). A third adhesive layer (AL) 512 is used to bond the second coupling frame (CF2) 510 to a second inner plastic layer (IPL) 513. These layers may be laminated in one lamination step to form a subassembly (SAS) 518.

A recess or opening may be milled fully through or partially into in any or all of the layers 502, 503, 504, 505, 506, 509 and 510 to accommodate the transponder chip module (TCM) 3501 after lamination of the complete card stack. This recess or opening may also be formed in any of the layers before lamination.

A second printed core layer (PCL) 514 followed by a second outer layer (OL) 515.

FIG. 5B is a close-up partially exploded diagram of the construction shown in FIG. 5A. It is noted that the opening for the transponder chip module (TCM) 501 typically requires two recesses. The depth of the recess P1 (516) may be typically set to the total substrate thickness of the transponder chip module (TCM) 501 plus an allowance for an adhesive layer (not shown). Consequently the depth of the recess P1 (516) may be in the range 100 μm to 200 μm. In this case the recess P1 (516) may penetrate some or all of the layers OL (502), PCL (503), IPL (504), AL (505) and CF2 (510). A second recess P2 (517) is provided to accommodate the chip (IC), wire bonds and mold mass of the transponder chip module (TCM) 501. This second recess P2 (517) may partially or completely penetrate the second coupling frame (CF2) 510 as shown and may be formed at any stage including prior to lamination of the subassembly (SAS), after lamination of the subassembly (SAS) or after lamination of the printed core layers (PCLs) and outer layers (OLs) to the SAS.

The slit (S2) 511 is shown as an extended slit, whose width in this case varies along its length. In the region around the windings of module antenna (MA) of the transponder chip module (TCM) 501 the slit (S2) 511 may overlap or run adjacent to or in close proximity. This permits optimum overlap of the extended slit (S2) 511 and the windings of the module antenna (MA). A feature of the invention is that the slit (S2) 511 describes a nearly complete loop that permits passage of alternating electromagnetic fields though the coupling frames (CF1 506 and CF2 510) and transponder chip module (TCM) 501. In particular the shape of the extended slit (S2) 511 is such as to direct eddy currents induced in the second coupling frame (CF2) 506 into close proximity with the module antenna (MA) and into the same direction or sense, locally around the transponder chip module (TCM) 501 area, as the induced eddy current paths in the first coupling frame (CF1) 506. The design as shown permits a region of solid metal to reside over the void usually formed by the creation of a module opening (MO) in a coupling frame (CF); cross reference FIG. 4A, module opening (MO2) 411. This inventive step has a distinct advantage in that the inner plastic layer (IPL) 513 is largely supported during lamination to form a subassembly (SAS). This support also extends to the second lamination stage and allows the rear printed core layer (PCL) 514 and rear outer layer (OL) 515 to be supported during lamination. This support helps prevents local ingress or distortion of the plastic layers around the location of the transponder chip module (TCM) 501 during lamination and prevents the formation of a visible defect or depression on the rear of the card.

Preparation of a Pre-Laminated Plastic-Metal-Plastic Inlay for Dual Interface Smartcards A first sheet of non-magnetic metal having a thickness for example of 150 to 200 μm and an overall dimension corresponding to an array of cards in a suitable format such 1×7, 2×7 or 3×7 is prepared with slits and openings at the position of each smartcard site (53.96 mm×85.60 mm). Said metal layer prepared with an opening at each site with a typical dimension of 11.90 mm×13.1 mm to accommodate the contour of a chip module tape such as an 8 contact module, conversely the opening for a six contact module would be 8.5 mm×11.1 mm. The slit beginning at a position in the module opening at each site, such as at the lower left hand corner and extending just beyond the periphery of the card body. This preparation can be performed mechanically, by laser, water jet cutting or wire electrical discharge machining (WEDM). The slits and/or openings may also be prepared by chemical etching. The slits extending through the metal can have a width between 50 and 300 μm.

A second sheet of non-magnetic metal having a similar thickness to the first sheet of metal and with identical geometrical dimensions corresponding to same sheet format is prepared with slits which are positioned offset to those slits in the first sheet of metal, and with openings concentric with the openings in the first sheet of metal. The openings are prepared to accept the contour of the mold mass of each chip module in the array with a typical dimension of 8.5 mm×9.5 mm or to give an optimum overlap or metal with the module antenna (MA) of a transponder chip module (TCM). The slit at each site begins at an offset position to the slit at each site in the first metal layer such as beginning from a module opening at an upper corner or center position and extending beyond the periphery edge of the card body.

A double-sided adhesive layer with an electrically isolating synthetic core is used to adhesively attach the first sheet of non-magnetic metal to the second sheet of non-magnetic metal.

A sheet of plastic card material may also be laminated at the same time to each (or one side) of the overlapping metal layers with the double-sided adhesive layer in middle. Alternatively, the sheets of plastic card material may be pre-coated on one side with a suitable adhesive to enable bonding to the overlapping metal layers or an adhesive may be directly deposited onto the outer surfaces of the overlapping metal layers.

Before the lamination process to create a plastic-metal-plastic pre-laminated, each opening on the top and bottom metal layer is provided with a plastic insert made of the same material as the outer plastic card layers. The plastic inserts having a thickness equal to the respective metal layer can be attached to the inner double-sided adhesive layer. Alternatively the openings in one or more of the non-magnetic metal layers is replaced by an extended slit shaped to pass in proximity with the windings of the module antenna (MA) on the transponder chip module (TCM).

The sandwich, an upper layer of plastic card material with an adhesive backing, an upper metal layer with slits and openings with a plastic inserts, a double sided adhesive layer with a synthetic core, a lower metal layer with offset slits and concentric openings with plastic inserts and a lower layer of plastic card material with an adhesive backing, are laminated in one step. The hot and cold lamination process under pressure causes shrinkage of the plastic card layers.

FIG. 6A illustrates an exploded view of a construction of a DIF "Plastic-Metal-Plastic" Hybrid Card (RFID device). In this case the design features two metal layers (ML) with corresponding slits (S1) 606 and (S2) 611 along with module openings (MO1) 607 and (MO2) 610 enabling the metal layers (ML) to perform as coupling frames (CH) 605 and (CF2) 609. Also shown is a transponder chip module (TCM) 601 which is of 8-pin type which may also be of 6-pin format of dual interface (contact and contactless) type.

In this embodiment, distinct adhesive layers (AL) are omitted as part of design. However, the metal layers (CF1, CF2) 605 and 609 may be coated to accept plastic directly: e.g. spray coat adhesive onto metal surface which is heat activated during lamination of the PCL layers 603 and 613, respectively. Adhesive which is sprayed on will result in a layer, whether explicitly shown, or not. An adhesive layer may be colorless, or transparent.

FIG. 6B is a partially exploded side-on (cross-sectional) view of the construction shown in FIG. 6A showing the following features:

A front clear plastic overlay (OL) 602 which may have a thickness of approximately 50 μm.

A front plastic printed core layer (PCL) 603 which may have thickness typically in the range 75 μm to 125 μm.

An inner plastic layer (IPL) 604 which may be a plastic layer with thickness typically in the range 20 μm to 100 μm. The inner plastic layer (IPL) 604 may be pre-coated with adhesive (not shown) on one side to facilitate bonding to the first coupling frame (CF) 605. An adhesive layer (AL) 608 bonding the coupling frames (CF1) 605 and (CF2) 609. The second inner plastic layer (IPL) 612 may be pre-coated with adhesive on one side for bonding the coupling frame (CF2) 609. These layers may be laminated in one lamination step to form a subassembly (SAS) 615. In an alternative implementation of the assembly adhesive may be pre-applied to the any of surfaces of the coupling frames (CF1, CF2) to enable a facile preparation of the subassembly (SAS) 615. In particular the use of adhesive-coated coupling frames (CF1, CF2) enables the replacement of the adhesive layer (AL) 608 with a single sheet of plastic in order to serve as a dielectric separator. The IPL layers 604 and 612 may be omitted, in which case the subassembly would comprise only the coupling frames 605 and 609 and the adhesive layer 608.

A rear plastic printed core layer (PCL) 613 which may have thickness typically in the range 75 μm to 125 μm.

A rear clear plastic overlay (OL) 614 which may have a thickness of approximately 50 μm.

To complete the card body construction with the upper and lower printed graphics, it is merely necessary to laminate the printed stock and overlay directly to the pre-laminated plastic-metal-plastic inlay. Because the plastic layers of the pre-laminate had undergone shrinkage, the lamination of the print stock to this pre-shrunk material results in little or no distortion of the printed graphic layer(s). And it is also not necessary to pre-laminate the printed stock and overlay as set-out in the teachings of U.S. Pat. No. 8,672,232.

Filling a Slit in a Laminated Metal Hybrid Smartcard

FIG. 7 illustrates a metal layer (ML) 702 within a metal hybrid smartcard. The metal features a slit (S) 704 that enables it to function as a coupling frame (CF). An exemplary width of the slit (S) may be of the order of 100 to 200 micron in a metal layer (ML) of thickness 200 micron. To facilitate lamination of the metal to adjacent layers of plastic or other materials within the smartcard stack, an adhesive layer (AL) 701 may be deposited on the metal layer or placed in film form between the metal layer and adjacent plastic layers. A second similar adhesive layer (AL) 703 may be used if the metal is laminated on both sides to other layers. Alternatively the adhesive layers (AL) may be replaced by plastic or other materials that may bond to the metal or chemically treated metal surface during lamination. The lamination process may heat the adhesive layer (AL) above its melting temperature or glass transition temperature, in doing so enabling a flow or creep of adhesive 705 into the slit defined in the metal layer (ML). In this manner the slit may be partially or fully filled by the region of adhesive creep 705. This adhesive creep 705 may serve to stabilize the slit mechanically and prevent ingress of foreign particles and water into the slit.

Metal Veneer Dual Interface Smartcards

FIG. 8A illustrates a metal veneer smartcard with metal layer (ML) 802 acting as a coupling frame with slit (S) 803. The transponder chip module (TCM) 801 is seated in a module opening (MO) 804 and overlaps a module recess (MR) 805. An adhesive layer (AL1) 806 fixes a plastic insert (PI) 807 into a recess on the reverse side of the metal layer (ML) 802 in order to mechanically stabilize the region around the slit (S) 803. An adhesive layer (AL2) 808 may be used to laminate the metal layer (ML) 802 to an inner plastic or PVC layer 809 along with the plastic insert (PI) 807 in a first lamination step. The adhesive 808 may be transparent. It is noted that this first lamination stack may be an array of many units which may be cut or otherwise isolated from each other upon complete assembly of the smartcard stack. The first lamination produces a subassembly that may be laminated in a subsequent step or steps to a printed core layer (PCL) 810 and other layers such as the outer clear overlay (OL) 811 shown in FIG. 8A, the subsequent lamination step(s) may be carried out at conditions of pressure, temperature and time suitable to prevent or minimize distortion, including shrinkage, in the printed core layer (PCL) 810.

FIG. 8B illustrates an aspect of the invention whereby the module opening (MO) 804 and module recess (MR) 805 may be milled, cut or etched into the metal layer (ML) 802 in such a manner as to reduce mechanical strain and distortions on the metal layer (ML) 802 in the region around the resultant module opening (MO) 804. For example milling a stainless steel metal layer (ML) 802 of thickness 500 micron with a suitable module recess (MR) 805 will remove approximately 200 micron depth of metal leaving approximately 300 micron thickness behind. Subsequent milling of the reverse side of the metal layer (ML) 802 to produce a recess for a plastic insert (PI) 807 or other feature may result in warping of the remaining metal. To avoid this a raised profile 812 of metal may be left in the area immediately around the module opening (MO) 804, or other region, in order to prevent such distortions.

FIG. 9 illustrates an exploded view of a metal veneer smartcard with dual interface transponder chip module (DIF TCM) 901 operating in conjunction with two metal layers (ML1, ML2) 902, 906 each of which features slits (S1, S2) 904, 907 respectively. The first metal layer (ML1) 902 may be laminated to the second metal layer (ML2) 906 with an adhesive layer (AL) 905. The module opening (MO) 903 in the first metal layer (ML) 902 may be cut or sized to the dimensions of the DIF TCM 901 before lamination, thus preventing the need to mill or work the finished card in order to place the DIF TCM. The overlap between the second metal layer (ML2) and second coupling frame (CF2) with the antenna of the DIF TCM 901 may be defined by the cut or opening formed in this layer before lamination. The second metal layer (ML2) may be used in this manner to act as a stiffener to prevent bending of the finished card, to provide additional weight to the card and/or ease assembly of the card by obviating the need to mill a module opening (MO) into metal during final assembly of the card. The weight of a finished ID-1 format card produced in this manner using stainless steel metal layers may be in the region of 17 grams.

The second metal layer (ML2) 906 may be surrounded by a PVC edge frame as illustrated in order to remove the visibility of the slit (S2) 907 from the edge of the card or to provide a colored or otherwise decorative visible edge to the finished smartcard. In this manner the second metal layer (ML2) 906 may be considered a metal slug within the smartcard. The two metal layers, edge frame and associated adhesives (features 902, 905, 906, 908, 909) along with an inner plastic layer (IPL) 910 may be laminated together in one step to produce a subassembly 913. This may be laminated in subsequent step(s) to a printed core layer(s) (PCL) 911 and clear overlay (OL) 912 thereby facilitating a facile manufacturing process. The final card(s) may be cut or otherwise isolated from an array of laminated layers. It is noted that the one or more of the metal layers (ML) may be connected to each other or feature devices such as devices such as capacitors connected across any two points on their surfaces. In addition, the edges of a metal slug layer (ML2) may not necessarily overlap the DIF TCM 901 on all sides and may not overlap the DIF TCM 901 at all in order to effect an efficient electromagnetic coupling to the DIF TCM 901.

FIG. 10 illustrates an alternative implementation of the invention for the design of a dual interface metal veneer card with no slit (S) on the front face or metal layer 1 (ML1) 1002. The antenna of the DIF TCM 1001 overlaps or is in close proximity to a second metal layer (ML2) 1006 within the smartcard. The second metal layer (ML2) 1006 may feature (be formed with) a slit (S) 1009 to perform as a coupling frame (CF) and/or a recess around its periphery or other area. The recess shape may match the shape of a suitable electromagnetic shielding material 1009 chosen to prevent or reduce attenuation of oscillating electromagnetic fields by the front metal layer 1 (ML) 1002 within and around the smartcard device. The recess may extend around the perimeter of the second metal layer (ML2) in order to permit placement of the electromagnetic shielding material 1005 in a manner as to cover the periphery of the second metal layer (ML2) within a given distance from its edge. The recess may extend over and around the area defined by the slit (S) 1009. For example the recess, and by extension the shielding material 1005, may cover an area extending 4 mm inwards around the edge of the second metal layer (ML2) 1006. In this manner the recess, and by extension shielding material 1005, may be shaped so as to effectively shield the induced largely peripheral circulating eddy currents in the second metal later (ML2) from the first metal layer (ML1) 1002.

The second metal layer (ML2) may or may not feature a slit (S), in the case that it does not feature a slit (S) the perimeter edge of the second metal layer (ML2) at one or more regions may overlap, or run in close proximity to, the antenna of the DIF TCM 1001 in order to effect electromagnetic coupling. The shielding material 1005 may be sized larger than the second metal layer (ML2) 1006 in order to improve shielding effectiveness. The shielding material 1005 may feature voids or openings or leave selected parts of the second metal layer (ML2) 1006 exposed so as to permit effective electromagnetic coupling between the DIF TCM 1001 and the second metal layer (ML2) 1006. For example, an annulus around the module opening 1003 of the second metal layer (ML2) 1006 may be left uncovered by shielding material to define an overlap with the antenna of the DIF TCM 1001 and prevent disruption of the electromagnetic coupling between the two components.

The second metal layer 1006 is shown as a single loop coupling frame antenna (horseshoe-shaped), such as disclosed in U.S. Ser. No. 15/939,282 filed 29 Mar. 2018 (PCT/EP2018/058251 filed 29 Mar. 2018). Alternatively, the coupling frame antenna may be replaced by a booster antenna, such as disclosed in US 20130126622.

The second metal layer (ML2) may be electrically connected at one or more points to other layers within the smartcard, may operate in conjunction with other antennas placed within the smartcard and may be connected to electronic components included by not limited to capacitors, resistors, LEDs and switches. For example, as illustrated in FIG. 10 a surface mounted capacitor (CAP) 1007 may be placed on the second metal layer (ML2) 1006 across the slit (S). A suitable void in the shielding material may be provided to accommodate such a component. In addition, a recess may be provided in the first metal layer (ML1) 1002 to accommodate the height of such a component. It is also conceived that to aid facile manufacture of the smartcard device a suitable solder and solder flux system may be chosen to permit placement of the capacitor or other device with curing of the electrical connection between the device and the metal layer (ML) during one of the lamination cycles used to produce the smartcard stack.

The second metal layer (ML2) 1006 may be smaller than the overall card size and may be framed by a PVC edge frame 1010 or other material. This material may have thickness matching the metal layer (ML2) 1006 or may be thinner or profiles to allow a protrusion of shielding material 1005 around the edge of the second metal layer (ML2) 1006. A function of the PVC edge frame 1010 may be to conceal the presence of shielding material in the smartcard as the shielding material have relatively poor structural properties and appearance when visible or exposed at the smartcard edges.

A subassembly (SAS) 1015 may be formed from a first lamination step from some or all of layers 1002, 1004, 1005, 1006, 1010 along with adhesive layer (AL) 1011 and inner plastic layer (IPL) 1012. This subassembly may exclude metal layer 1 (ML1) and adhesive layer (AL) 1004 which may be added in a separate lamination step depending on the manufacture process chosen. The subassembly (SAS) 1015 may be laminated in a subsequent step(s) to a printed core layer (PCL) 1013 and optionally a clear overlay (OL) 1014.

Metal Prelams

In order to maximize manufacturing efficiency the smartcard constructions considered hitherto may be produced through use of multi-card arrays or formats, laminated in one or more steps, before cutting or milling of each individual card from the assembly. In this manner any format may be chosen to suit a given production environment and set of applicable machines. In the descriptions below a format of 2×8 cards is shown for illustration purposes but any alternative format may be equally considered. The manufacturing steps detailed below may result in the formation of an assembly of one or metal layers with plastic layers or other metal layers, or with inserts, in order to form a metal "prelam" (laminated article, or construction) that may be used in conjunction with other material layers in subsequent lamination steps to build the final smartcard construction. It is envisaged that all lamination steps may be consolidated into a single lamination process for some of the constructions detailed below, given the use of appropriate adhesives and materials. It is noted that the use of the term "metal prelam" along with the descriptions below of manufacturing sequences are not restricted to the use of multiple lamination steps.

FIG. 11 is an exploded view of a metal prelam (2×8 format) comprising a first metal layer (ML1) 1101 bonded with an adhesive layer (AL) 1105 to a second metal layer (ML2) 1107. Each metal layer (ML1) 1101 and (ML2) 1107 features an array of slits denoted (SA1) 1103 and (SA2) 1106, respectively. The metal layers (ML1, 1101; ML2, 1107) may be composed of non-magnetic stainless steel or any other metal or conductive composite material. The metal layers (ML1, 1101; ML2, 1107) may have thickness typically in the range 50 μm to 500 μm and may of dissimilar thickness or dissimilar metal type. The thickness of each metal later (ML) will be determined by the additional plastic or other layers required to complete the smartcard construction to arrive at the ISO 7810 standard card thickness (approx. 0.76 mm±0.08 mm).

The adhesive layer (AL) 1105 may be a freestanding film or laminate of adhesive with plastic or may be directly applied to one or more of the metal layers (ML1, 1101; ML2, 1107). The slits (S) at each card location are offset with on another such that when the final smartcard bodies are isolated from the overall assembly, along the card outlines (CO) 1102, the metal layers mutually support one another in the locality of the slits, thus restricting bending of the card at the location of the slits (S).

The metal prelam as shown may be formed during a first lamination step to bind the two metal layers (ML1) 1101 and (ML2) 1107 together. One or more subsequent lamination steps may be used to apply plastic layers or other materials to the metal prelam before isolation of the smartcards and milling of the pockets for the transponder chip modules (TCM). These subsequent lamination steps may also be omitted and a single lamination step used to create the full smartcard construction along. In this case the metal prelam would be become part of the full smartcard assembly and not exist as a free-standing part.

Not shown in the drawing is the location of the transponder chip module (TCM) which is defined during or after isolation of the individual smartcards by cutting, milling, etching or other means. A suitable pocket or opening to accommodate the transponder chip module (TCM) may be defined. The slits (S) intersect the pocket defined for the TCM and in doing so create two coupling frames (CF) from the two metal layers within each isolated smartcard.

A first fiducial array (FA1) 1104 on the first metal layer (ML1) 1101 may be used to align the second metal layer (ML2) 1107, bearing a second fiducial array (FA2) 1108, during lamination.

The fiducial arrays (FA) may be holes, crosses or other shapes that be cut through the respective sheet or surface marks. The fiducial arrays (FA) may be used to align artwork from printed graphics layers (PGL). The fiducial arrays (FA) may also be visible following completion of the card stack-up to assist with registration for isolation of the cards by, for example, CNC milling.

FIG. 12 shows an alternative implantation of the metal prelam (2×8 format) discussed above in relation to FIG. 11. In this case each slit (S) within the first slit array (SA1) 1204 of the first metal layer (ML1) 1201 has a corresponding module opening (MO) which it intersects. The module opening (MO) per smartcard site is shown as a first array of module openings (MOA1) 1205. The second metal layer (ML2) 1207 has a similar array of slits (SA2) 1210 with a second array of module openings (MOA2). The openings MOA1 1205 and MOA2 1209 can be concentric and of the same size but this not a necessity. A module insert (MI) 1202 may be placed within the module openings (MO) in order to support plastic layers applied in subsequent lamination and/or to support the transponder chip module (TCM) in the final smartcard. The use of a plastic material for the module insert (MI) may also facilitate ease of milling of the required recess for the TCM.

FIG. 13 is an exploded view of a complete laminated smartcard assembly bearing a metal prelam in 2×8 format. In this example a metal prelam may be constructed from the following stack: first inner plastic layer (IPL1) 1303, first adhesive layer (AL1) 1304, first metal layer (ML1) 1305, second adhesive layer (AL2) 1308, second metal layer (ML2) 1309, third adhesive layer (AL3) 1311, second inner plastic later (IPL2) 1312.

As before, the metal layers (ML) feature arrays of slits (SA1, 1306; SA2, 1311) and fiducials (FA1, 1307; FA2, 1310) and may optionally feature module openings (MO) and module inserts (MI).

The second adhesive layer (AL2) 1308 may be a laminate structure with plastic core to facilitate ease of handling and to provide an additional dielectric barrier (or layer) between the metal layers ML1 1201 and ML2 1207. The first adhesive layer (AL1) 1304 and third adhesive layer (AL3) 1311 may be thinner and may be directly applied to the metal layers (ML) or inner plastic layers (IPL) prior to lamination.

The application of the inner plastic layers (IPL1, 1303; IPL2 1312) in the formation of the metal prelam may facilitate the lamination of pre-printed graphics layers (PGL1) 1302 and (PGL2) 1313 in a second lamination step using the optimum conditions to prevent distortion of the printed artwork and allow adhesion to adjacent layer(s). Protective overlays (OL1) 1301 and (OL2) 1314 may be subsequently applied to complete the smartcard construction. In an aspect of this invention the overlays may be replaced by a suitable anti-scratch lacquer which may be applied by, for example, screen printing or film transfer.

In an exemplary implementation of a metal prelam as discussed herein the following material thickness may be used:

| | |
|---|---|
| First overlay (OL1) 1301 | 75 μm |
| First printed graphics layer (PGL1) 1302 | 100 μm |
| First inner plastic layer (IPL1) 1303, metal prelam | 40 μm |
| First adhesive layer (AL1) 1304, metal prelam | 12.5 μm |
| First metal layer (ML1) 1305, metal prelam | 150 μm |
| Second adhesive layer (AL2) 1308, metal prelam | 60 μm |
| Second metal layer (ML2) 1309, metal prelam | 150 μm |
| Third adhesive layer (AL3) 1311, metal prelam | 12.5 μm |
| Second inner plastic layer (IPL2) 1312, metal prelam | 40 μm |
| Second printed graphics layer (PGL2) 1313 | 100 μm |
| Second overlay (OL2) 1314 | 50 μm |

In this illustrative arrangement the metal prelam will have a thickness of approximately 465 μm, with some small reduction in this due to shrinkage of the adhesive layers (AL1, 1304; AL2, 1308, AL3, 1311) and inner plastic layers (IPL1, 1303; IPL2, 1312) during lamination. Completing the smartcard stack-up with overlays (OL1, 1301; OL2 1314) will give a total thickness of 790 μm (excluding effects of shrinkage).

Following final lamination, the openings for the transponder chip module (TCM) may be milled into each smartcard site. The cavity created for the TCM may penetrate both metal layers (ML1, ML2) but not necessarily all lower plastic and adhesive layers of a finished smartcard stack-up (AL3, 1311; IPL2, 1312; PGL2, 1313; OLD, 1314) thereby leaving a region of plastic covering the TCM location at the rear side of the smartcard. In this fashion the need for module inserts (MI) and corresponding module openings (MO), as depicted in FIG. 12 may be removed.

FIG. 14 is an exploded a complete laminated smartcard assembly bearing a metal prelam in 2×8 format. The construction shown is similar to that depicted in FIG. 13 but with the replacement of the printed graphics layers (PGL) with two print primer layers (PP1, 1402; PP2, 1414). In this case, the application of a primer to the surface of the inner plastic layers (IPL1, 1403; IPL2, 1413) may facilitate direct inkjet or offset printing, for example, of the surface of the metal prelam. The print primer (PP) may be applied post-lamination of the metal prelam by screen printing or film transfer or the print primer may be in place on the surface of the IPL prior to lamination. This method facilitates the direct printing of graphics onto the metal prelam. It is noted that the print primer may also be applied directly to the metal surfaces with the omission of the IPL layers.

In this example a typical stack-up may be as follows:

| | |
|---|---|
| First overlay (OL1) 1401 | 75 μm |
| First print primer layer (PPI) 1402 | 5 μm |
| First inner plastic layer (IPL1) 1403, metal prelam | 40 μm |
| First adhesive layer (AL1) 1404, metal prelam | 12.5 μm |
| First metal layer (ML1) 1405, metal prelam | 250 μm |
| Second adhesive layer (AL2) 1408, metal prelam | 60 μm |
| Second metal layer (ML2) 1409, metal prelam | 250 μm |
| Third adhesive layer (AL3) 1412, metal prelam | 12.5 μm |
| Second inner plastic layer (IPL2) 1413, metal prelam | 40 μm |
| Second print primer layer (PP2) 1414 | 5 μm |
| Second overlay (OL2) 1314 | 50 μm |

In this example the overall smartcard thickness may be approximately 800 μm. It is noted that in this design the thicknesses of the first metal layer (ML1) 1405 and second metal layer (ML2) 1409 may be significantly increased from 150 μm to 250 μm (compared to FIG. 13). This increased metal thickness per layer gives a significant increase in the overall stiffness and weight of the final smartcard.

FIG. 15 is an exploded view of an alternative metal prelam construction that uses three metal layers to create a predominantly metal smartcard.

In this instance the three metal layers (ML1, 1501; ML2, 1505; ML3, 1509) may have, for example, thickness in the range 200-300 µm each, thus allowing a laminated structure for the smartcard which is composed mostly of metal. The use three arrays of slits (SA1, 1502; SA2, 1507; SA3, 1511) in offset positions enables each metal layer (ML) in each smartcard isolated from the panel to function as a coupling frame (CF). The slits (S) on the third metal layer (ML3) 1509 are shown in this case as analogous to those discussed previously in relation to FIG. 5B, having an extended shape and permitting operation of the transponder chip module (TCM) whilst having a largely metal surface filling the required module opening (MO).

The outermost metal layers (ML1, 1501; ML3, 1509) may directly form the finished smartcard surface and may be etched or laser patterned. These metal layers may also be coated by pulsed vapor deposition (PVD) prior to lamination. These metal layers may also be coated with a suitable primer to facilitate direct printing of graphics onto the metal surface or may be screen printed and lacquered to bear the required artwork.

Some Additional Considerations

Pre-Laminated Plastic-Metal-Plastic Inlay Stack-Up

A sandwich construction of a first plastic substrate with an adhesive backing, a core metal layer or layers and a second plastic substrate with an adhesive backing. Said plastic substrate made of a material commonly used in plastic smartcards, such as PVC. The inlay stack-up laminated in a conventional press to cause shrinkage of the plastic layer.

Alternatively, a double-sided adhesive layer with a PET core is used to adhesively attach the metal layer to a plastic substrate.

In a second lamination step, the printed stock with a protective overlay layer is laminated to the pre-laminated plastic-metal-plastic inlay.

The pre-laminated inlay may have a format of 1×8, 2×8 or any suitable array.

Electrical Isolation Between Metal Layers Acting as Coupling Frames

A double-sided adhesive layer with a PET core is used to adhesively attach two metal layers with slits and openings for application in a dual interface plastic metal hybrid card. The PET core acts as a dielectric medium, electrically isolating the metal layers from each other. Typically, the dielectric medium will be a layer of plastic material and/or a layer of adhesive.

Metal Layers Acting as Coupling Frames and Coated in Adhesive

The metal layers described herein with slits and openings for application in a dual interface plastic metal hybrid card may be coated in a suitable adhesive on both sides. A stackup containing the metal layers sandwiching a plastic or other dielectric layer may be formed, with one or more plastic layers against the other two faces of the metal layers completing the subassembly. The lamination may be carried out under the optimum conditions of pressure, temperature and duration for curing of the adhesive system. The subassembly may be laminated in one step prior to lamination to additional plastic layers at the optimum conditions of pressure, temperature and duration to avoid distortion of these plastic layers. In the case where an adhesive system curing at low temperature is used the lamination of all layers of the card, included metal layers and printed core layers, may be carried out in one step as the use of optimum lamination conditions for the printed core layers will avoid distortion of printed graphics and other shrinkage issues.

Digital Printing on a Plastic-Metal-Plastic Inlay

Background

Digital offset printing presses use an offset cylinder to transfer a color image to a paper, film or metal substrate. These presses are based on an electro-photographic process where an electrostatic image is formed on a surface of a charged photo-conductor by exposing the surface to a light and shadow image to dissipate the charge on areas of the photo-conductor surface exposed to the light. A charged electrostatic latent image is then developed using ink (liquid toner) containing an opposite charge to that on the electrostatic latent image. The resulting electrostatic toner image is then transferred to a hot blanket, where the toner is coalesced and maintained in a tacky state until it is transferred to the substrate, which cools the ink and produces a tack-free print.

Conventional digital offset receiving sheets are typically highly cationic in nature, are not thermally stable at temperatures above 200 degree C.°, and commonly employ a substrate prepared using a polyamine or quaternary ammonium polymer.

Xerography is an electro-photographic technique that uses electrostatic charges, dry ink (toner) and a fusing process to produce and fix an image on a substrate. A negative of an image is beamed using a laser or light-emitting diodes (LEDs) onto a positively charged selenium-coated, photoconductive drum, thereby canceling the charge and leaving a positively charged copy of the original image. A negatively charged toner is attracted to the positive image on the drum. The toner is then attracted to the substrate (e.g., paper), which is also positively charged. Heat and/or pressure or light is then used to fuse the toner thereby causing it to permanently adhere to the substrate. Receiver sheets used in xerographic printers and presses utilizing heat and pressure fusing may be exposed to temperatures ranging from about 140° C. to about 250° C.

Conventional receiver sheets used in xerographic (dry toner) printers and presses typically employ uncharged substrates prepared from epoxy or acrylic resins, which are coated with charged polymeric coatings.

WO 2011036480 A1 describes a digital printing process for wood or metal. The printing process comprises the steps of: a) Applying a powder coating to at least one surface of the substrate to form a first layer of the substrate; b) Applying an ink composition to the substrate to form a second layer of the substrate; and c) Curing the substrate comprising the first and second layers.

It relates to a printing process for printing on a substrate. In particular, it relates to a printing process for digitally printing on a metal or wood-based substrate.

Optimizing Ink Receptiveness on PVC

Substrates require the right coating to anchor inks and digital print receptive coatings are available from various companies. Refer to http://www.tekra.com/resources/tek-tip-white-paper/tek-tip-evolving-digital-card-market http://www.michelman.com/Printing-%26-Packaging/Specialty-Printing/HP-Indigo-Solutions/ http://www.dkgroup.com/product-category/laminating-films/

Direct printing on plastic inlay sheets using a HP Indigo press is standard in the smartcard industry, avoiding the problem of shrinkage of the plastic layers.

The same technique can be applied to plastic metal hybrid smartcards, by digitally printing direct on a plastic-metal-plastic inlay having a suitable format such as 3×7.

Some Additional Disclosures

U.S. Ser. No. 14/492,113 filed 22 Sep. 2014 (U.S. Pat. No. 9,798,968, 24 Oct. 2017) discloses a smartcard (SC) which may comprise: a metal layer (ML); and an opening (MO) in the metal layer for receiving a transponder chip module (TCM); characterized by: a discontinuity comprising a slit (S) or a non-conductive stripe (NCS), in the metal layer (ML), extending from the opening to a periphery of the metal layer, whereby the metal layer (ML) comprises an open-loop coupling frame (CF) having two ends. The slit may be at least partially filled with an electrically non-conducting material selected from the group consisting of polymer and epoxy resin, reinforced epoxy resin. A reinforcing structure (RS) disposed at a location of the slit (S) to reinforce the metal layer (ML).

U.S. Ser. No. 15/662,305 filed 28 Jul. 2017 (claiming priority of U.S. 62/371,768 filed 7 Aug. 2016) discloses a method to stabilize a metal layer with slit in a smartcard body construction. The metal layer (ML) may be approximately the same overalls size as the smartcard (SC). The slit (S) enables the metal layer (ML) to function as a coupling frame (CF). The slit (S) represents a mechanical weakness, and may lead to problems when the card is repeatedly flexed. To reinforce the card body (CB) (or metal layer (ML)) having a slit (S), a reinforcing insert (or structure or plate), of a non-conductive material such as plastic or reinforced plastic, may be disposed at (including around and covering) the location (area) of the slit (S) in a recess (R, not shown) on the underside of the card body (CB), and may extend beyond the slit.

A reinforcing insert made of a non-conductive material may be replaced by a metal backing insert (MBI). The metal backing insert (MBI) disposed in the card body recess, spanning the slit, reinforces the card body at the slit area. Metal backing inserts (MBI) reinforcing the slit(s) may also have a slit (S2) overlapping the module antenna.

The metal backing insert (MBI) may comprise tungsten or steel, and may be DLC black coated. A layer of adhesive 1932 which may have a thickness of approximately 20 μm may secure the metal backing insert (MBI) into the milled recess in the slit area. The MBI spans the slit (S1) and reinforces the card at the slit area.

U.S. Ser. No. 15/662,305 filed 28 Jul. 2017 (claiming priority of U.S. 62/371,768 filed 7 Aug. 2016) also discloses a method for preventing electrical shorts across a slit in a coupling frame and how to conceal a slit in a coupling frame. In order to prevent electrical shorting of the slit, the coupling frame may be coated in a non-conductive material. This coating may also cover the exposed surfaces of the slit and thereby prevent electrical shorting by materials or fluids that may ingress into the slit. For example a diamond-like-carbon (DLC) coating that is electrically insulating may be applied to a thickness in the range 1-10 micron as a decorative surface finish. The applied coating may also be selected/designed to reduce the overall width of the slit. For example a slit of 25 micron width with overall 4 micron DLC coating may be reduced in width to approximately 17 micron after coating.

A visible slit may detract from the appearance of the card, and may also compromise the mechanical stability of the card. A typical card has a thickness of approximately 0.78 mm (780 μm).

The slit (S) may be filled with a dielectric oxide. The slit may be hidden (or disguised) with a DLC (diamond-like carbon) coating. For example, a slit of 30 microns or less (i.e. width of the laser beam) may be coated with DLC having a thickness of 6 microns. The width of the slit may then be reduced in size by at least 12 microns. So, in essence, the slit resulting may be only 18 microns wide or less. However, DLC provides a gloss finish. To further conceal the slit, the metal layer or card body (such as titanium) may be sand blasted (or glass bead blasted), such as before DLC or PVD (plasma vapor deposition) coating, and the finish will may turn out to be matte (not glossy) so that the slit is nearly impossible to see.

A plastic layer may be laminated to a non-magnetic metal layer or plastic layers laminated to both sides of a non-magnetic metal layer in which the metal layer represents an array of card body sites, with each site provided with a slit to act as a coupling frame, whereby the plastic layer (or layers) extending over the entire surface of the metal layer is used to reinforce the card body construction around the area of the slit. This technique may eliminate the need for an insert to fit a recess in a card body, as a reinforcing member.

Selecting a plastic layer of a given thickness with a certain glass transition temperature, and laminating said substrate with an adhesive backing or a separate adhesive layer having a certain activation temperature to a front or rear face, or to both faces of a single non-magnetic metal layer with a slit and module opening, deliberately filling or partially filling the slit with a combination of the substrate material and adhesive during the lamination process (temperature, cycling profile (hot and cold), process time, and pressure) to stabilize and strengthen the card stack-up construction, before final lamination with the printed core and overlay layers. A synthetic slug may be used to fill or cover the module opening, and may be of the same or different material to that of the plastic layer. The non-magnetic metal layer may have two layers of metal isolated from one another using an adhesive layer as a dielectric, forming a composite metal layer. The non-magnetic metal layers with slits positioned in an offset manner are filled with the substrate material and adhesive during lamination. The combined plastic and non-magnetic metal layer(s) may be a single card body or an inlay having a format representing a multiple of card body positions. The finished card construction may be a metal hybrid having a plastic assembly on the front and rear faces with a metal core sandwiched between both assemblies. A metal veneer card has a front face made of solid metal while the rear comprises of a plastic layer.

Slit in a Non-Magnetic Metal Layer without a Support Panel

The slit at each site in a metal inlay may be filled or partially filled. The slit in the non-magnetic metal layer may be prepared with an additive for better adhesion, or with a luminous material or may have a continuous cut accompanied by additional slits or cuts in the non-magnetic metal layer to create a distinguishing feature such as a logo or name, or as a security measure.

A holographic metal layer (holofoil) may also be laminated to the core metal layer or to the plastic assembly. This holofoil may be electromagnetic transparent or may be conductive. The latter may require a micro slit and may support inductive coupling with the module antenna of the transponder chip module.

Slit Shape

The shape of the slit in permitting better mechanical strength of the metal layer after pre-lamination to a plastic supporting layer(s) may have the form of a saw tooth or staircase.

Card Finishing

Some comments will now be made to distinguish some manufacturing techniques disclosed herein from the technique disclosed in U.S. Pat. No. 8,672,232, which is directed to a card includes a first assembly comprised of multiple plastic layers attached via an adhesive to a metal layer. The multiple plastic layers forming the first assembly are laminated under a first selected temperature and pressure conditions to preshrink the multiple plastic layers, stress relieve the first assembly and render the first assembly dimensionally stable. The laminated first assembly is then attached to a metal layer via an adhesive layer to form a second assembly which is then laminated at a temperature below the first selected temperature to form a card which is not subjected to warpage and delamination.

To produce a card body from the matrix of an inlay array laminated with the printed core and overlay layer, it may be prudent to punch oversized card positions from the complete assembly and then redressed to remove sharp edges, burrs, or to beveled or chamfer.

In the teachings of U.S. Pat. No. 8,672,232, there is no mention made that the first plastic assembly could be a single layer (i.e. Printed Layer). Wherein the single plastic layer is laminated at a temperature and pressure to preshrink the layer and reduce its subsequent dimensional change. This preshrinking procedure of the single plastic layer could be performed prior to printing of the artwork.

Alternatively, laminate one plastic layer to a metal layer to create a pre-laminated clad then laminate a second plastic layer or layers to the first preshrunk plastic layer.

To complete the card body construction with the upper and lower printed graphics, it is merely necessary to laminate the printed stock and overlay directly to the pre-laminated plastic-metal-plastic inlay. Because the plastic layers of the pre-laminate had undergone shrinkage, the lamination of the print stock to this pre-shrunk material results in little or no distortion of the printed graphic layer(s). And it is also not necessary to pre-laminate the printed stock and overlay as set-out in the teachings of U.S. Pat. No. 8,672,232.

Additional Points regarding the teachings of U.S. Pat. No. 8,672,232 with respect to: "a first Predetermined Temperature and Pressure for Forming a First Assembly and Laminating the Second Assembly at a Temperature which is Lower than the First Predetermined Temperature"

U.S. Pat. No. 8,672,232 does not disclose (and in contrast thereto, it is disclosed herein) to have:

two laminating steps, whereby the second has the same, or higher temperature as the first.

two laminating steps, whereby the second has a lower, same, or higher pressure than the first.

two laminating steps, whereby the second has a lower, same, or higher processing time than the first.

In an embodiment of the (present) invention, the plastic layers to be laminated to the front and rear side of a metal layer may be sized to be dimensionally less than the size of the metal layer. After lamination, the plastic layers may expand almost to the edges of the metal layer, without the need to further trim the edges (removal of protruding plastic). The metal layer may have a 2×8 format (metal sheet size 20.32 cm×50.8 cm×0.3 mm) or any equivalent inlay format (1×8, 4×7, 4×8, etc.).

In an embodiment of the (present) invention, a metal veneer card (metal front face with a plastic backing layer laminated thereto) may comprise a card size metal layer having an edge thickness of 300 µm, 350 µm or 400 µm, with an inner area (e.g. 7.3 cm×3.4 cm) of greater thickness (e.g. 600 µm) to mechanically stabilize the card body construction and add weight to the card body. This inner metal area may be surrounded by a plastic layer(s).

In an embodiment of the (present) invention, a metal veneer card may compose of a card size metal layer having an edge thickness of 300 µm, 350 µm or 400 µm, with an inner area (e.g. 7.3 cm×3.4 cm) comprising of metal slug having a thickness (e.g. 300 µm) to mechanically stabilize the card body construction and add weight. This inner metal slug may be surrounded by a plastic layer(s).

Some Additional Disclosures

Construction of a Metallized Card
(Based on the Teachings of US 20130126622, 23 May 2013)

Some smart cards, including dual interface (DI) smart cards, have a metal (or metallized) top layer, or "face plate", substantially the size of the card body. Having a metal layer is technically disingenuous in that it may significantly reduce coupling between the card and an external contactless reader. Nevertheless, the feature may be important for vanity purposes.

As Disclosed in US 20130126622:

FIG. 2 is a very generalized, simplified, diagrammatic cross-sectional view illustrating some exemplary layers of an exemplary "metal" (or metallized) smart card. The layers are numbered for reference purposes only, not to indicate a particular sequence. The layers may be rearranged. Some layers may be omitted. Some layers may be applicable to either non-metal smart cards or metallized smart cards. Some of the layers may comprise more than one layer. Some layers may be combined with other layers.

| Layer 1 | printed sheet, overlay anti-scratch, etc |
| Layer 2 | separate metal layer or metallized foil |
| Layer 3 | booster antenna BA with coupler coil CC |
| Layer 4 | card body CB |
| Layer 5 | compensation frame (back side of card body) on metallized or non-metallized |
| Layer 6 | printed sheet, underlay anti-scratch, magnetic stripe, etc |

A chip module (CM) is shown disposed in a window "W" (opening) extending into the smart card, from the front (top, as viewed) surface thereof through the metallized foil (Layer 2) and into the card body (Layer 4). The chip module (CM) has contact pads (CP) on its front surface for interfacing with an external contact reader. The chip module may be a dual interface (DI) antenna module (AM) having a module antenna (MA) for interfacing, via the booster antenna (BA) with coupler coil (CC), with an external contactless reader. The antenna module (AM) may fit within the inner area of the coupler coil (CC).

FIG. 2A shows an exemplary stack-up (sequence of layers) for a metallized smart card 200, having the following layers, structures and components. Exemplary dimensions may be presented. All dimensions are approximate. Thickness refers to vertical dimension in the figure.

A top layer 202 may be a metal (or metallized) layer 202, such as 250 µm thick stainless steel, and may be referred to as a "face plate". Compare "Layer 1". This top layer 202 may be as large as the overall smart card, such as approximately 50 mm×80 mm.

A layer 203 of adhesive, such as 40 µm thick of polyurethane

A layer 204 of ferrite material, such as 60 µm thick sheet of soft (flexible) ferrite A layer 205 of adhesive, such as 40 μm thick of polyurethane A layer 208 of plastic material, such as 50-100 μm thick PVC, which may function as a spacer (separating layers and components below from those above)

A layer 210 of plastic material, such as 150-200 μm thick PVC, which may function as the card body (CB). Compare "Layer 4".

Wire 212, such as 112 μm diameter wire, forming the booster antenna (BA) with coupler coil (CC). Only one wire cross-section is shown, for illustrative clarity.

A layer 214 of plastic material, such as 150 μm thick PVC, which may include printing, magnetic stripe, etc.

A layer 216 of plastic material, such as 50 μm thick PVC, which may serve as an overlay The overall thickness of the smart card 200 (layers 202, 203, 204, 208, 210, 214, 216) may be approximately 810 μm (0.81 mm).

A window opening 220 ("W") may extend into the smart card from the face plate 202, through intervening layers, into the card body layer 210. A dual interface (DI) antenna module (AM), with module antenna (MA) may be disposed in the window opening 220. The window opening 220 may extend completely through the layer 210, in which case the antenna module (AM) would be supported by the underlying layer 214.

The coupler coil (CC) of the booster antenna (BA) may surround the window opening 220 so as to be closely coupled with the module antenna (MA) of the antenna module (AM). Alternatively, the coupler coil (CC) may be disposed in the card body (CB) so as to be underneath the module antenna (MA) of the antenna module (AM).

The antenna module (AM) may measure approximately 12×13 mm (and approximately 0.6 mm thick). The window opening 220 ("W") in the face plate 202 may be approximately the same size as the antenna module (AM)—i.e., approximately 12×13 mm. In this "baseline" configuration, the chip activation distance may be approximately 15 mm. (Chip activation distance is similar to read distance, and represents the maximum distance at which the chip module may be activated (for reading) by an external reader. As a general proposition, more is better, 15 mm is not very good, 20 mm or 25 mm would be better. The chip activation distance in a metallized smart card is handicapped by attenuation of the electromagnetic field associated with the booster antenna attributable to the metallic face plate 202 (Layer 1).

The ferrite layer 204 may also improve coupling by reducing attenuation of coupling by the face plate 202, helping to concentrate the electromagnetic field between the booster antenna BA and the module antenna MA of the antenna module AM. It may be desirable that the ferrite layer 204 be as close as possible to the underside of the face plate 202. Rather than having a separate ferrite layer 204 (and adhesive layer 203), ferrite particles or powder may be mixed with an adhesive and sprayed or coated onto the underside of the face plate 202, thereby eliminating the intervening adhesive layer 203. Alternatively, rather than being in the form of a separate layer 204, the ferrite material may be particles (including nanoparticles) of ferrite embedded in an underlying layer, such as the spacer layer 208 or the card body layer 210 (in some configurations, the spacer layer 208 may be omitted).

The spacer layer 208 may also improve coupling by reducing attenuation of coupling by the face plate 202, simply by keeping the face plate 202 as far away as practical (within the confines of the form factor for smart cards) from the booster antenna 212.

Various additional features for improving coupling for metallic cards, may be incorporated into the layers of the smart card and/or the antenna module, such as, but not limited to:

Providing a compensation frame under the booster antenna (BA).

Disposing ferrite at strategic locations in the card body (CB), such as disclosed in FIGS. 1B, 4I,J of US 20120074233 (U.S. Pat. No. 8,366,009, 5 Feb. 2013)

Configuring the booster antenna (BA), or card antenna (CA) as a quasi-dipole without a coupler coil (CC), and positioning the antenna module AM so that the module antenna MA overlaps only an inner winding IW of the booster antenna, such as disclosed in FIG. 2C of US 20120038445 (U.S. Pat. No. 8,474,726, 3 Jul. 2013) and in FIGS. 3A, 4A of U.S. Pat. No. 8,366,009, and in FIG. 2A of Ser. No. 13/600,140 (U.S. Pat. No. 8,991,712, 31 Mar. 2015)

Using various combinations of these features, a baseline activation distance of 15 mm may be increased to approximately 28 mm, or more, an improvement of approximately 100%, and corresponding improvements to the reliability of communication between the chip module (CM) and an external contactless reader. It is within the scope of the invention that these features, listed above, may be incorporated into a non-metallized (no metallic face plate) smart card to significantly improve activation and read distances.

Manufacturing

An interim product may comprise the ferrite 204, adhered with adhesive 205 to the underlying spacer layer 208, and the card body layer 210 with the booster antenna 212 inlaid therein. This interim product may be referred to as a pre-laminated stack, or "prelaminate", and may have a thickness of approximately 450 μm.

The pre-laminate may be delivered to a second manufacturer who will apply the faceplate 202, the bottom PVC sheet 214 and the bottom overlay 216. The faceplate 202 may be pre-punched (or otherwise machined) with the opening 220. The resulting stack-up may have a pre-laminated thickness pf approximately 940 μm (0.94 mm), and after lamination (heat and pressure) have a final thickness of approximately 890 μm (0.89 mm).

In the lamination process, a plug of material may first be inserted into the window opening 220 to prevent the underlying material (ferrite 204, spacer PVC 208, card body PVC 210, etc.) from expanding upwards into the window opening 220 (and causing a resulting indent on the bottom surface of the smart card). The material for the plug may be PVC, or the metal "slug" which was removed from the faceplate to make the opening, or the like.

Typically, after lamination, the plug (if metal) is removed. If the plug was PVC, it may be left in place. The recess for the antenna module may then be machined into the layers (ferrite 204, spacer PVC 208, card body PVC 210) of the smart card, being careful (of course) not to damage the coupler coil (CC).

Smart Cards with Metal Layer (Based on U.S. Ser. No. 15/939,282 Filed 29 Mar. 2018 and PCT/EP2018/058251 Filed 29 Mar. 2018, Priority of U.S. 62/478,589 Filed 29 Mar. 2017)

This application describes a smartcard with coupling frame antenna, may correspond with the metal layer ML2 of FIG. 10, herein.

According to some embodiments (examples) of the invention, generally a conductive coupling frame antenna (CFA), being a closed loop antenna circuit with a continuous metal track or path, having a rectangular geometry with a slit (S) and module opening (MO), disposed surrounding and overlapping the module antenna (MA) in a transponder chip module (TCM) or antenna module (AM). A transaction card with a continuous metal track or path having a slit (S) extending from a module opening (MO) to a periphery of the card body to function as a coupling frame antenna (CFA). The coupling frame antenna (CFA) may have a track or path width at the module opening equal in dimension to the width of the tracks forming the module antenna in the transponder chip module (TCM) or antenna module (AM). The metal track or path can be chemically etched aluminum, copper, a metallized surface or the like. At the periphery of the card body, the width of the metal track or path is no less than the skin depth of the metal at the frequency of interest. The metal can be replaced by a conductive medium such as silver paste, conductive ink, or the like requiring a greater track or path width to meet the conditions for proper current conduction. The coupling frame antenna (CFA) may resemble a one turn antenna as a closed loop circuit. The coupling frame antenna (CFA) may have multiple turns in a closed circuit design to capture the electromagnetic field, and concentrate a greater surface eddy current density around the area of the slit (S) and module opening (MO), to improve the inductive coupling and ultimately the power delivery to the chip. The coupling frame antenna (CFA) may commence in the center of the card body, extending to the right, forming a conductive path along the perimeter of the card body, forming a loop or module opening at an inner position on the left side of the card body, to surround and overlap a module antenna (MA) of a transponder chip module (TCM) or antenna module (AM), creating a slit by extending the track or path back to the periphery of the card body, and completing the coupling frame antenna structure by returning to the start position within the center of the card body.

A switch may be provided to disenable the antenna circuit by connecting its terminals across the slit (S) of the coupling frame antenna (CFA). A capacitor may be connected across the slit to boost performance. The transponder chip module (TCM) may comprise a laser-etched antenna structure (LES), a chemical-etched antenna structure (CES) and a non-perforated contact pad (CP) arrangement. A coupling frame antenna (CFA) may be incorporated onto the module tape (MT) for a transponder chip module (TCM).

U.S. Ser. No. 15/939,282 filed 29 Mar. 2018 shows a diagram of an exemplary coupling frame antenna (CFA) with a track width of 3 mm. The design shown illustrates a continuous closed loop single track coupling frame antenna (CFA) 202 placed within the perimeter defined by the card body (CB) 201. It is noted that the figure is illustrative of the shape and overall form of the coupling frame antenna (CFA) 202 and that the antenna may reside upon or between any of the layers that may make up a typical smartcard. The outer edges of the coupling frame antenna (CFA) 402 may extend to the periphery of the card body (CB) 201 or be offset from the edge of the smartcard by some distance to aid lamination or other assembly of the smartcard's additional layers. The path defined by the coupling frame antenna (CFA) 201 extends inwards towards and around the module opening (MO) 204. The length, width and track thickness of the coupling frame antenna (CFA) 202 in the vicinity of the module opening (MO) 204 may be set as to provide an optimum overlap with the module antenna (MA) of the transponder chip module (TCM). In this manner an electrical discontinuity in the form of a slit (S) 203 is defined by the coupling frame antenna (CFA) 202. The slit (S) 203 as shown extends from the outer perimeter of the coupling frame antenna (CFA) 202 and intersects the module opening (MO) 204.

While the invention(s) has/have been described with respect to a limited number of embodiments, these should not be construed as limitations on the scope of the invention(s), but rather as examples of some of the embodiments. Those skilled in the art may envision other possible variations, modifications, and implementations that are also within the scope of the invention(s), based on the disclosure(s) set forth herein.

What is claimed is:

1. A smartcard comprising:
   a first coupling frame having a module opening and a first slit;
   a second coupling frame having a second slit, wherein the second coupling frame is under the first coupling frame and a portion of the second slit is underneath the module opening; and
   a transponder chip module disposed in the module opening and overlapping the second.

2. The smartcard of claim 1, wherein the second coupling frame does not have a module opening.

3. The smartcard of claim 1, wherein the transponder chip module is configured to communicate with an external device through both directly contacting the external device and without contacting the external device.

4. The smartcard of claim 1, wherein the transponder chip module is not configured to communicate with an external device without contacting the external device.

5. The smartcard of claim 1, further comprising:
   a first inner plastic layer disposed above the first coupling frame; and
   a second inner plastic layer disposed below the second coupling frame.

6. The smartcard of claim 1, further comprising:
   a first inner plastic layer disposed above the first coupling frame;
   a first plastic printed core layer disposed above the first inner plastic layer; and
   a first clear plastic overlay disposed above the first plastic printed core layer.

7. The smartcard of claim 6, wherein each of the first clear plastic overlay, first plastic printed core layer, and the first inner plastic layer include openings, each sized to accommodate the transponder chip module.

8. The smartcard of claim 6, further comprising:
   a second inner plastic layer disposed below the second coupling frame;
   a second plastic printed core layer disposed below the second inner plastic layer; and
   a second clear plastic overlay disposed below the second plastic printed core layer.

9. The smartcard of claim 1, wherein the second slit has a varying width.

10. The smartcard of claim 1, wherein the transponder chip module includes a module antenna, wherein a portion of the module antenna is above a portion of the second slit.

11. The smartcard of claim 10, wherein the module antenna includes windings, and wherein a portion of the windings are above a portion of the second slit.

12. The smartcard of claim 10, wherein the second slit describes a nearly complete loop that permits passage of alternating electromagnetic fields through the first coupling frame the second coupling frame and the transponder chip module.

13. The smartcard of claim 10, wherein the extended second slit is configured to direct eddy currents induced in the second coupling frame towards the module antenna.

14. The smartcard of claim 1, wherein the entire second slit is under the module opening.

15. The smartcard of claim 1, wherein the second slit does not extend to an outer periphery of the second coupling frame.

16. The smartcard of claim 1, wherein the second slit has an open-ended loop shape.

17. The smartcard of claim 16, wherein the second slit comprises a plurality of straight segments.

\* \* \* \* \*